US007611824B2

(12) United States Patent
Goto

(10) Patent No.: US 7,611,824 B2
(45) Date of Patent: Nov. 3, 2009

(54) DUMMY PLATE PRECURSOR FOR PLANOGRAPHIC PRINTING AND METHOD FOR PRODUCING PRINTED PLATE AND DUMMY PLATE

(75) Inventor: Takahiro Goto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/030,111

(22) Filed: Jan. 7, 2005

(65) Prior Publication Data

US 2005/0153221 A1 Jul. 14, 2005

(30) Foreign Application Priority Data

Jan. 9, 2004 (JP) ............................. 2004-004134
Mar. 23, 2004 (JP) ............................. 2004-085656
Mar. 23, 2004 (JP) ............................. 2004-085657

(51) Int. Cl.
*G03F 7/00* (2006.01)

(52) U.S. Cl. .................................... 430/302; 101/463.1

(58) Field of Classification Search ................. 430/302, 430/309, 494, 467, 484, 457; 101/463.1, 101/453, 454, 477; 428/221, 913
See application file for complete search history.

(56) References Cited

U.S. PATENT DOCUMENTS 2,710,800 A * 6/1955 Mengel et al. .............. 162/138
5,908,706 A * 6/1999 Lehmann et al. ............ 428/469
6,207,287 B1 3/2001 Alba et al.
6,369,844 B1 * 4/2002 Neumann et al. ........... 347/224
2001/0036593 A1 * 11/2001 Takeda et al. ............ 430/270.1
2002/0001776 A1 * 1/2002 Mori et al. .................. 430/302
2002/0175315 A1 * 11/2002 Wang et al. ................. 252/500
2003/0022004 A1 * 1/2003 Dorr et al. .................. 428/458
2003/0188985 A1 * 10/2003 DaSilva et al. .............. 206/456
2003/0224281 A1 * 12/2003 Ishizuka et al. ............. 430/157

FOREIGN PATENT DOCUMENTS

| | | | | |
|---|---|---|---|---|
| EP | 0 579 237 | A2 | | 1/1994 |
| EP | 1 356 927 | A2 | | 10/2003 |
| JP | 2003-84450 | A | | 3/2003 |
| JP | 2003-94848 | A | | 4/2003 |
| JP | 2003-241365 | A | | 8/2003 |
| JP | 2004-017482 | | * | 1/2004 |
| WO | WO 02/32690 | A2 | * | 4/2002 |

* cited by examiner

*Primary Examiner*—Cynthia H Kelly
*Assistant Examiner*—Anca Eoff
(74) *Attorney, Agent, or Firm*—Sughrue Mion, PLLC

(57) ABSTRACT

The present invention provides a method for producing a planographic printing plate and a dummy plate for planographic printing in a CTP plate-making system, the method including: taking one product out of a pile of multiple planographic printing plate precursors piled up on a base substrate and a pile of multiple dummy plate precursors for planographic printing piled up on another base substrate, distinguishing the kind of the one product, exposing the one product to an infrared ray when the one product is a planographic printing plate precursor, and developing the one product when the one product is other than the base substrate, wherein the base substrate surface, the planographic printing plate precursor, and the dummy plate precursor for planographic printing each have a different absorption maximum in a range of 350 to 700 nm and an absorbance at the absorption maximum of 0.2 or more.

8 Claims, 3 Drawing Sheets

DUMMY PLATE PRECURSOR FOR PLANOGRAPHIC PRINTING AND METHOD FOR PRODUCING PRINTED PLATE AND DUMMY PLATE

CROSS-REFERENCE TO RELATED APPLICATIONS

This application claims priority under 35 USC 119 from Japanese Patent Application Nos. 2004-004134, 2004-085656, and 2004-085657, the disclosures of which are incorporated by reference herein.

BACKGROUND OF THE INVENTION

1. Field of the Invention

The present invention relates to a dummy plate precursor for planographic printing used in multi-color printers, and in particular to a dummy plate precursor for use in computer-to-plate devices for producing printed plates directly. The invention also relates to a method for producing a planographic printing plate and a dummy plate for planographic printing in a common CTP plate-making system (CTP developed plate-making system).

2. Description of the Related Art

In the polychromic printing field, a dummy plate, which has no image portion, is attached to the non-image portion of the printing drum of a printer. A product obtained by completely removing a photosensitive layer from a PS plate has long been used as the dummy plate. However, in obtaining such a dummy plate, it is difficult to completely remove the photosensitive layer from the PS plate, and undesirably remaining portions of the photosensitive layer cause printing stains. In order to overcome this problem, use of a dummy plate having, on a support having no photosensitive layer thereon, a protective film for preventing ink adhesion was proposed (e.g., Japanese Patent Application Laid-Open (JP-A) No. 3-175090]. However, the dummy plate having a protective film requires an increased number of printed sheets of paper before complete removal of undesired ink adhered on the dummy plate (generally called waste of paper caused by black faults) during the initial period of printing. Thus, improvement with respect to this point has been desired.

Reasons for such waste are that the amount of protective film is much higher than that of the gum protection of common PS plates so as to prevent the printing stains even after long-term storage and that the solubility of the protective layer in the dampening water during printing decreases due to the long-term storage. Therefore, supports having no protective film have been supplied to the market by PS plate makers and is used after being hydrophilized and gummed immediately before printing in a similar manner to the PS plates. A shortcoming of such an uncoated support for a dummy plate is that it often causes printing stains due to various contaminations during long-term storage. The support is also vulnerable to damage during handling before they are completely gummed.

Dummy plate precursors having a non-photosensitive layer including a binder on a support have been used to overcome the aforementioned problem. For example, a dummy plate precursor having a non-photosensitive water-soluble layer containing a polymer having a water solubility of 2 g/L or more and an inorganic acid on a support that has been subjected to anodic oxidation or a hydrophilizing treatment (e.g., Japanese Patent No. 2,951,907), and a dummy plate precursor having a metal support having a hydrophilic surface, an undercoat layer of a water-soluble compound, and a water-insoluble and alkaline developing solution-soluble non-photosensitive resin layer (e.g., JP-A No. 11-240266) have been disclosed. Such dummy plate precursors have an advantage in that even when supplied to a CTP plate-making system common to ordinary planographic printing plate precursors, they can be developed in an automatic developing machine and converted to dummy plates, and thus are rational and economical.

On the other hand, digital technology of processing, accumulating and outputting image information electronically by computer has become widespread in recent years, and computer-to-plate (CTP) technology of producing printed plates directly, without use of a lith film, by scanning a printing plate precursor with high-directivity light such as a laser beam according to the digitalized image information has been established. For example, planographic printing plate precursors having, on a hydrophilic support, an oleophilic photosensitive resin layer containing a photosensitive compound that can generate an active species such as radical or Bronsted acid by laser exposure have been marketed as a planographic printing plate precursor allowing scanning exposure.

Accordingly, there exists a need for a dummy plate precursor that can be fed, conveyed and processed in such a CTP device without problems. In addition, an image plate and an entirely non-image plate are sometimes used in combination in the newspaper market, and a photosensitive planographic printing plate is usually used as the image plate, while a dummy plate is used as the entirely non-image plate. Namely, a system for multicolor printing of newspaper has multiple drums, and if printing does not require use of all the drums, a dummy plate is attached to at least one drum that is unnecessary for the printing.

A certain number of planographic printing plate precursors are supplied to the CTP plate-making system as a pile in which they are piled up on a base substrate called a stack board. Also, a certain number of dummy plate precursors are supplied to the CTP plate-making system as a pile in which they are piled up on another base substrate. When the making of printed plates is initiated in the CTP plate-making system, each component, i.e., a planographic printing plate precursor, a dummy plate precursor, interleaving paper, or a base substrate, should be identified by a sensor, and processing which corresponds to the identified plate is selected on the basis of the identification results. However, the above components are not securely identifiable, leaving the planographic printing plate precursor, the dummy plate precursor, and the base substrate undifferentiated. Thus, deteriorated plate-making efficiency is obtained and complicated operation is required.

Accordingly, there exists a need for a dummy plate precursor that does not cause printing stains after long-term storage, allows automatic differentiation of the dummy plate precursor, the photosensitive planographic printing plate precursor, the interleaving paper, and the stack board by a color sensor, and can be supplied into and conveyed in a CTP device without problems.

There also exists a need for a method for producing a planographic printing plate and a dummy plate for planographic printing in a common CTP plate-making system which method, even when planographic printing plate precursors and dummy plate precursor for planographic printings coexist in the system, enables easy distinguishing of the kind of a plate precursor selected from these precursors and determination of the processing suitable for the function of the plate precursor, also enables distinguishing of the base substrate and recognition of the fact that there is no planographic printing plate precursor or dummy plate precursor for planographic printing left, and can prevent deterioration in plate-making efficiency and elimination of tedious labor.

SUMMARY OF THE INVENTION

After intensive studies to solve the above descirbed problems, the inventor of the invention has found that the needs can be satisfied by the following invention.

A first aspect of the invention provides a dummy plate precursor for planographic printing, comprising a support and, on the support, a non-photosensitive layer containing an alkali-soluble binder polymer, wherein the non-photosensitive layer has an absorption maximum in a wavelength region of 350 to 450 nm and an absorbance at the absorption maximum of 0.2 or more.

A second aspect of the invention provides a method for producing a planographic printing plate and a dummy plate for planographic printing in a CTP plate-making system, the method including: taking one product out of a pile of multiple planographic printing plate precursors piled up on a base substrate and a pile of multiple dummy plate precursors for planographic printing piled up on another base substrate, distinguishing the kind of the one product, exposing the one product to an infrared ray when the one product is a planographic printing plate precursor, and developing the one product when the one product is other than the base substrate, wherein the base substrate surface, the planographic printing plate precursor, and the dummy plate precursor for planographic printing each have a different absorption maximum in a range of 350 to 700 nm and an absorbance at the absorption maximum of 0.2 or more.

The planographic printing plate precursors on which an image will be formed by infrared ray exposure generally have an absorption maximum in a wavelength region of 500 to 650 nm, from the viewpoint of distinction of plates. In the invention, the color of the dummy plate precursor for planographic printing is different from that of the planographic printing plate precursor, and the color of the surface of the base substrate on which the planographic printing plate precursors and/or the dummy plate precursors for planographic printing are piled up is different from that of each of the planographic printing plate precursor and the dummy plate precursor for planographic printing. Thereby, a color sensor can differentiate these three components. A coloring agent having an absorption maximum in a wavelength region of 350 to 450 nm is most useful for the coloring agent for the dummy plate precursor.

Therefore, the invention can provide a dummy plate precursor that does not cause printing stains even after long-term storage. Further, the invention can also provide a dummy plate precursor that can be automatically distinguished from the photosensitive planographic printing plate precursor, the interleaving paper, and the stack board with a color sensor in a CTP device without problems.

The invention can also provide a method for producing a planographic printing plate and a dummy plate for planographic printing in a common CTP plate-making system which method, even when planographic printing plate precursors and dummy plate precursor for planographic printings coexist in the system, enables easy distinguishing of the kind of a plate precursor selected from these precursors and determination of the processing suitable for the function of the plate precursor, also enables distinguishing of the base substrate and recognition of the fact that there is no planographic printing plate precursor or dummy plate precursor for planographic printing left, and can prevent deterioration in plate-making efficiency and elimination of tedious labor.

DETAILED DESCRIPTION OF THE INVENTION

Hereinafter, the method for producing a planographic printing plate and a dummy plate for planographic printing in a CTP plate-making system of the invention will be described in detail.

The method includes taking one product out of a pile of multiple planographic printing plate precursors piled up on a base substrate and a pile of multiple dummy plate precursors for planographic printing piled up on another base substrate, distinguishing the kind of the one product, exposing the one product to an infrared ray when the one product is a planographic printing plate precursor, and developing the one product when the one product is other than the base substrate, wherein the base substrate surface, the planographic printing plate precursor, and the dummy plate precursor for planographic printing each have a different absorption maximum in a range of 350 to 700 nm and an absorbance at the absorption maximum of 0.2 or more.

The CTP plate-making system has, in the following order, a unit on which a pile of multiple planographic printing plate precursors piled up on a base substrate and a pile of multiple dummy plate precursors for planographic printing piled up on another base substrate are placed, a unit for exposing a planographic printing plate precursor to an infrared ray, and a unit for developing an exposed planographic printing plate or a dummy plate precursor.

In the method of the invention, it is preferable that the absorption maximum of the planographic printing plate precursor be in a wavelength range of 500 to 600 nm, and that the absorption maximum of the dummy plate precursor for planographic printing be in a wavelength range of 350 to 450 nm, and that the absorption maximum of the base substrate surface be in a wavelength range of 400 to 550 n m. In addition, the base substrate is preferably a colored cardboard.

First, the CTP plate-making system used in the invention will be described.

CTP Plate-making System

As described above, the CTP plate-making system used in the invention has, in the following order, a unit on which a pile of multiple planographic printing plate precursors piled up on a base substrate and a pile of multiple dummy plate precursors for planographic printing piled up on another base substrate are placed, a unit for exposing a planographic printing plate precursor to an infrared ray, and a unit for developing an exposed planographic printing plate or a dummy plate precursor. The planographic printing plate precursor will be occasionally referred to as a "printing plate precursor" and the dummy plate precursor for planographic printing will be occasionally referred to as "dummy plate precursor".

Figure 1:
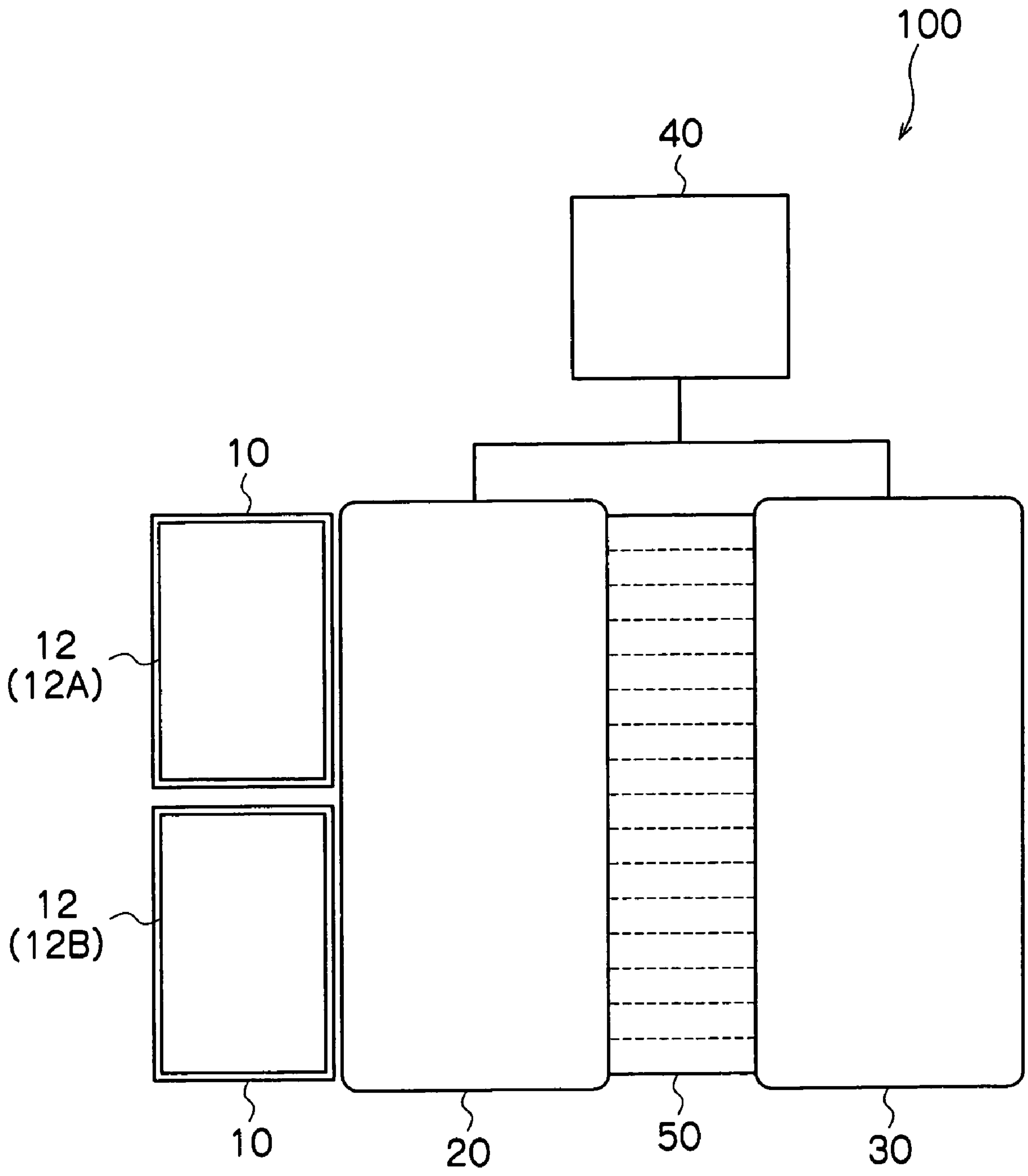
FIG. 1 is a schematic diagram illustrating an embodiment of a CTP plate-making system used in the invention.

Hereinafter, an embodiment of the CTP plate-making system used in the invention will be described with reference to a drawing. FIG. 1 is a schematic diagram illustrating an embodiment of the CTP plate-making system used in the invention.

The CTP plate-making system 100 shown in FIG. 1 has units 10 on each of which a pile of multiple printing plate precursors piled up on a base substrate 12A or a pile of multiple dummy plate precursors piled up on another base substrate 12B are placed, a plate setter 20 serving as an exposure unit, an automatic developing machine 30 serving as a development unit, a control unit (computer) 40, and a conveyor unit 50 for conveying the printing plate precursors and the dummy plate precursors from the unit 10 through the plate setter 20 and the automatic developing machine 30 to a plate-discharging port of the system. Each of the units 10 is directly connected to a plate-supplying port of the plate setter 20. The plate setter 20 and the automatic developing machine 30 are electrically connected to the control unit 40, and the control unit 40 has a computer system linked to an upper system (not shown).

The CTP plate-making system 100 having two units 10 is shown, but the CTP plate-making system 100 may have one or more units 10. If the system has only one unit 10, the pile(s) of printing plate precursors 12A and the pile(s) of dummy plate precursors 12B may be placed on the unit 10 in a predetermined order.

On the unit 10, a pile of multiple printing plate precursors piled up on a base substrate 12A or a pile of multiple dummy plate precursors piled up on another base support 12B is placed. Each plate is supplied one by one from the top of these piles of plates 12A and 12B to the plate setter 20. The position of the unit 10 for the pile of printing plate precursors 12A and that of the unit 10 for the pile of dummy plate precursors 12B may be exchanged. Alternatively, only one of the pile of printing plate precursors 12A and the pile of dummy plate precursors 12B may be placed on either one of unit 10. In the invention, the printing plate precursor, the dummy plate precursor, and the base substrate surface are colored so that they have light absorption at different wavelengths within a range of 350 to 700 nm as described above. Accordingly, no matter how the printing plate precursors and the dummy plate precursors are placed on the units 10, these plates are differentiated, for example, by a color sensor before they are fed to the plate setter 20. Therefore, the system can select a processing method which is the most suitable for the plate supplied on the basis of the identification result.

For example, when a plate disposed on the top of one of the piles 12A is identified as a printing plate precursor by the color sensor, the control unit 40, based on the identification result, selects normal plate-making process, i.e., exposure by the plate setter 20 and then development by the automatic developing machine 30, and makes the system conduct such process. Alternatively, when a plate disposed on the top of the pile 12A is identified as a dummy plate precursor by the color sensor, the control unit 40, based on the identification result, selects development by the automatic developing machine 30 without exposure by the plate setter 20, and makes the system conduct such process. Alternatively, when a product disposed on the top of the pile 12A is identified as a base substrate by the color sensor, the control unit 40, based on the identification result, judges that the system should inform the user that there are no printing plate precursor or dummy plate precursor remaining or that new precursors should be supplied.

Accordingly, the invention eliminates complicated work which is caused by impossibility of automatic identification of the printing plate precursor and the dummy plate precursor and necessity of manual confirmation of these precursors, and prevents decrease in working efficiency caused by that it may take time for the user to notice that there is no printing plate precursor or dummy plate precursor left.

An interleaving paper may be placed between the plates of the pile(s) 12A and/or 12B in order to prevent scratch on the surface of the printing plate precursors and/or the dummy plate precursors and adhesion between the plates under a high humidity condition. In such a case, the interleaving paper should be removed to prevent the paper from being irradiated in the plate setter 20. In the invention, the printing plate precursor, the dummy plate precursor, and the base substrate surface are colored so that they have light absorption at different wavelengths within a range of 350 to 700 nm. On the other hand, the interleaving paper generally has white color. Therefore, even when the interleaving paper is placed between the plates, the interleaving paper is easily differentiated from other three plates, for example, by a color sensor before feeding it to the plate setter 20. Accordingly, when a product disposed on the top of the pile 12A is identified as an interleaving paper by the color sensor, the control unit 40, based on the identification result, judges that the interleaving paper should be removed by a unit for removing the interleaving paper, and makes the system conduct such process.

Here, any one of various known mechanisms may be used as the unit for removing the interleaving paper in contact with the plates, and examples thereof include one using adsorption, one which blows the interleaving paper off with wind pressure, and one using electrification of the interleaving paper. The interleaving paper removed is put into a wastebasket for interleaving paper, and disposed of.

The plate setter 20 has at least one unit 10 described above, an exposure subunit that irradiates the surface of a printing plate precursor with laser light ; and a mechanism for conveying a printing plate precursor to the exposure subunit and conveying the exposed printing plate from the exposure subunit to a next unit (plate-conveying mechanism).

The exposure subunit may be outer drum type one in which a printing plate precursor conveyed by the plate conveying mechanism and wound around the outer circumferential surface of an exposure drum, which is being rotated, is exposed to an infrared laser beam emitted from a laser source; an inner drum type one in which a printing plate precursor adhered to the inner circumferential surface of a drum is exposed to light emitted from a light source placed at the center of the drum which light source is being rotated; or a flat bed type one in which a printing plate precursor fixed on a flat bed is exposed to light emitted from a laser source, which is driven vertically and horizontally.

The laser source used for exposure is movable in the axial direction of the drum along a guide rail and emits light according to image information processed by the computer of the control unit 40. In scanning with a laser beam, the direction of rotation of the drum is, for example, the main scanning direction, whereas the axial direction of the drum is the subscanning direction.

The laser source used in the invention is not particularly limited, as long as it can emit an infrared ray, and typical examples thereof include high-power semiconductor lasers emitting light having a wavelength in the infrared region of 700 to 1200 nm, and YAG laser emitting light having a wavelength of 1064 nm. In particular, the laser source is preferably a semiconductor laser emitting light having a wavelength of 830 nm because of its high power.

The power of the laser is preferably 100 mW or more. A multi-beam laser device is preferably used to shorten the exposure time. The exposure time per image pixel is preferably 20 μseconds or less. In addition, the irradiation energy applied to the planographic printing plate precursor is preferably 10 to 300 mJ/$cm^2$.

The exposure is executed such that light beams from a light source overlap. The phrase "light beams from a light source overlap" means that the pitch of sub-scanning is smaller than the diameter of each light beam. When the beam diameter is expressed by the half breadth of the beam intensity (FWHM), the degree of overlap can be quantitatively expressed by FWHM/sub-scanning pitch (overlap coefficient). In the invention, the overlap coefficient is preferably 0.1 or higher.

The plate-conveying mechanism conveys the printing plate precursors and the dummy plate precursors piled up on the unit 10 to the exposure position (e.g., exposure drum). In a case of a dummy plate precursor, the system makes the dummy plate precursor merely pass through the exposure unit withouth exposure, since it is unnecessary to expose the dummy plate precursor to light.

Examples of commercially available plate setters 20 include TRENDSETTER NEWS 200 of Creo Scitex Company, NEWSSETTER TH180 of Kodak Polychrome Graphic Company, LUXEL T-9000 CTP of Fuji Photo Film Co., Ltd., LASER STAR 170T of Krause Company, HS of Dainippon Screen Mfg., Thermal Setter of Matsushita Graphic Communication Systems, Inc., and Thermal Setter of NEC & Creo Company. It is possible to use modified one obtained by providing any one of these plate setters with a color sensor for identifying the printing plate precursor, the dummy plate precursor, the base substrate, and the interleaving paper, which color sensor is electrically connected to the control unit 40, and which color sensor is disposed close to the unit 10. Thereby, the control unit 40 can determine subsequent processing on the basis of the identification information from the color sensor.

The exposed printing plate or the dummy plate precursor is then conveyed by the conveyor unit 50 to the automatic developing machine 30.

The automatic developing machine 30 has, for example, a development subunit for developing the exposed printing plate or the dummy plate precursor, a water washing subunit for washing off a developing solution remaining on the developed plate, a finisher subunit for applying a gum solution to the washed plate, and a drying subunit for drying the gum solution-applied plate in that order. However, the invention is not limited to such a configuration, and the automatic developing machine 30 may have additionally a preheating subunit or a water pre-washing subunit before the development subunit, if necessary.

A sensor for detecting supply of a plate is placed at the entry port of the development subunit. When entry of a plate is detected by the sensor, the plate is conveyed by the conveyor unit from the development subunit through the water washing subunit and finisher subunit to drying subunit and discharged from the outlet port of the automatic developing machine 30.

If the automatic developing machine 30 has a preheating subunit, the plate is preferably heated at a temperature within a range of 60 to 150° C. for a period of time of 5 seconds to 5 minutes.

The heating method conducted in the preheating unit may be selected suitably from various methods known in the art. Specific examples thereof include a method in which an exposed planographic printing plate is heated by bringing it into contact with a panel heater or a ceramic heater, and a method in which an exposed planographic printing plate is heated with a lamp or hot air in a non-contact manner. Heating a plate in this manner can reduce the energy of laser light emitted during exposure and needed for image recording.

Alternatively, if the exposed planographic printing plate has a protective layer, the automatic developing machine 30 may have a water-pre-washing subunit for removing the protective layer. In the water-pre-washing subunit, the protective layer is removed, for example, by spraying water from a spray pipe on the surface of the exposed planographic printing plate to swell the protective layer and then scraping the swelled protective layer off with a brush roller. For example, tap water is used in the water pre-washing.

Developing Solution

In the development subunit of the automatic developing machine 30, a developing solution containing an aromatic anionic surfactant is preferably used from the viewpoint of efficient developing of both the planographic printing plate and the dummy plate precursor.

Aromatic Anionic Surfactant

The aromatic anionic surfactant contained in the developing solution used in the invention is effective in accelerating development and stabilizing dispersion of the photosensitive layer components of the exposed planographic printing plate and the layer components of the dummy plate precursor for planographic printing plate in the developing solution. The aromatic anionic surfactant for use in the invention is preferably a compound represented by the following Formula (A) or (B).

Formula (A)

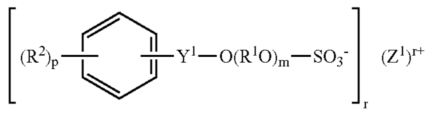

Formula (B)

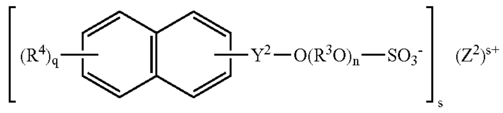

In Formula (A) or (B), $R^1$ and $R^3$ each represent a linear or branched alkylene group having 1 to 5 carbon atoms, and specific examples thereof include an ethylene group, a propylene group, a butylene group, and a pentylene group. Each of $R^1$ and $R^3$ is particularly preferably an ethylene group or a propylene group.

m and n each are an integer of 1 to 100, and are preferably an integer of 1 to 30, and more preferably an integer of 2 to 20. When m is 2 or more, multiple $R^1$ groups may be the same as or different from each other. Similarly, when n is 2 or more, multiple $R^3$ groups may be the same as or different from each other.

$R^2$ and $R^4$ each represent a linear or branched alkyl group having 1 to 20 carbon atoms, and typical examples thereof include a methyl group, an ethyl group, a propyl group, a butyl group, a hexyl group, and a dodecyl group. Each of $R^2$ and $R^4$ is particularly preferably a methyl group, an ethyl group, an iso-propyl group, a n-propyl group, a n-butyl group, an iso-butyl group, or a tert-butyl group.

p and q each represent an integer of 0 to 2. $Y^1$ and $Y^2$ each represent a single bond or an alkylene group having 1 to 10 carbon atoms. Each of $Y^1$ and $Y^2$ is preferably a single bond, a methylene group, or an ethylene group, and more preferably a single bond.

$(Z^1)^{r+}$ and $(Z^2)^{s+}$ each represent an alkali metal ion, an alkaline earth metal ion, or a unsubstituted or alkyl-substituted ammonium ion, and typical examples thereof include a lithium ion, a sodium ion, a potassium ion, a magnesium ion, a calcium ion, an ammonium ion, secondary to quaternary ammonium ions substituted with an alkyl group having 1 to 20 carbon atoms, an aryl group, and/or an aralkyl group. Each of $(Z^1)^{r+}$ and $(z^2)^{s+}$ is particularly preferably a sodium ion. r and s each represent 1 or 2.

Typical examples of the compound represented by Formula (A) or (B) are shown below, but the invention is not limited by these compounds.

K-1

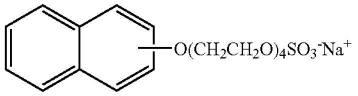

K-2

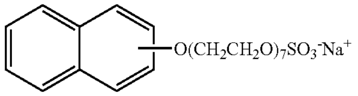

K-3

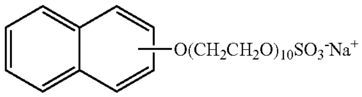

K-4

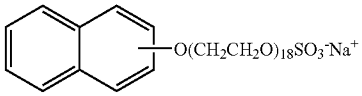

K-5

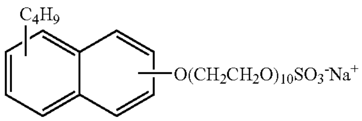

K-6

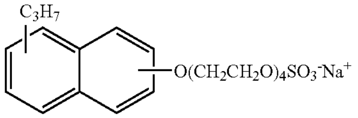

K-7

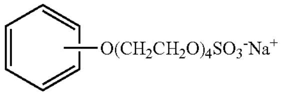

K-8

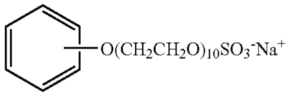

K-9

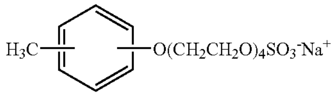

K-10

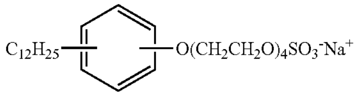

K-11

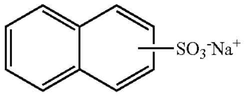

-continued

K-12

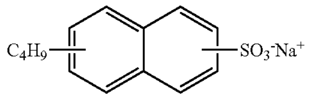

One of these aromatic anionic surfactants may be used or two or more of them can be used together. The concentration of the aromatic anionic surfactant in the developing solution is preferably in a range of 1.0 to 10% by mass and more preferably in a range of 2 to 10% by mass. When the concentration is less than 1.0% by mass, the developing property and the solubility of the photosensitive layer components deteriorate. When the concentration is more than 10% by mass, the printing durability of a printing plat deteriorates.

The developing solution used in the invention may also contain any other surfactant in addition to the aromatic anionic surfactant. Examples of other surfactant include nonionic surfactants including polyoxyethylene alkyl ethers such as polyoxyethylene naphthyl ether, polyoxyethylene alkyl phenyl ethers, polyoxyethylene lauryl ether, polyoxyethylene cetyl ether, and polyoxyethylene stearyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; and monoglyceride alkyl esters such as glycerol monostearate and glycerol monooleate.

The content of other surfactant(s) in the developing solution is preferably 0.1 to 10% by mass when calculated on the basis of active components. The content of other surfactant(s) is preferably 5 to 90% by mass, more preferably 10 to 80% by mass, and still more preferably 20 to 50% by mass, with respect to the total amount of surfactants.

Chelating Agent for Bivalent Metal

The developing solution used in the invention preferably contains a chelating agent for bivalent metal(s), for example, to suppress the adverse effects of the bivalent metals such as an calcium ion contained in hard water. Examples of the chelating agent for bivalent metal(s) include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate); aminopolycarboxylic acids such as ethylenediamine tetraacetic acid and potassium, sodium, and amine salts thereof, diethylenetriamine pentaacetic acid and potassium and sodium salts thereof, triethylenetetramine hexaacetic acid and potassium and sodium salts thereof, hydroxyethylethylenediamine triacetic acid and potassium and sodium salts thereof, nitrilotriacetic acid and potassium and sodium salts thereof, 1,2-diaminocyclohexane tetraacetic acid and potassium and sodium salts thereof, and 1,3-diamino-2-propanol tetraacetic acid and potassium and sodium salts thereof; and organic phosphonic acids such as 2-phosphonobutane tricarboxylic acid-1,2,4 and potassium and sodium salts thereof; 2-phosphonobutanone tricarboxylic acid-2,3,4 and potassium and sodium salts thereof; 1-phosphonoethane tricarboxylic acid-1,2,2 and potassium and sodium salts thereof; 1-hydroxyethane-1,1-diphosphonic acid and potassium and sodium salts thereof, and aminotri(methylenephosphonic acid) and potassium and sodium salts thereof. The chelating agent for bivalent metal(s) is preferably ethylenediamine tetraacetic acid or a potassium, sodium, or amine salt thereof, ethylenediamine tetra(methylenephosphonic acid) or a ammonium or potassium salt thereof, or hexamethylenediamine tetra(methylenephosphonic acid) or a ammonium or potassium salt thereof.

The optimum content of the chelating agent used depends on the hardness and the amount of hard water used. However, the content in the developing solution is generally in a range of 0.01 to 5% by mass and preferably 0.01 to 0.5% by mass.

Acetylene Alcohol and Acetylene Glycol

The developing solution for use in the invention preferably contains at least one compound selected from acetylene alcohols and acetylene glycols as an antifoamer for the developing solution. One of these compounds may be used or, for example, acetylene alcohol and acetylene glycol can be used together.

Acetylene alcohols are unsaturated alcohols containing an acetylene bond (triple bond) in the molecule thereof. Acetylene glycols, which are also called alkynediols, are unsaturated glycols containing an acetylene bond (triple bond) in the molecule.

Specific examples of these compounds include those represented by the following Formulae (C) and (D).

Formula (C)

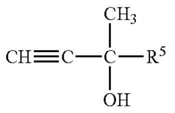

Formula (D)

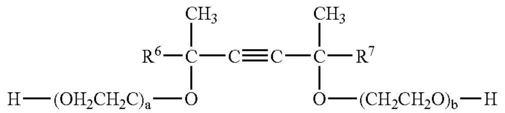

In Formulae (C) and (D), $R^5$ to $R^7$ each represent a linear or branched alkyl group having 1 to 5 carbon atoms; a and b each are an integer; and the total of a and b is 0 to 30. The linear or branched alkyl group having 1 to 5 carbon atoms include a methyl group, an ethyl group, an iso-propyl group, an iso-butyl group, and an iso-pentyl group.

Typical examples of the compounds represented by Formula (C) or (D) are shown below, but the invention is not limited by these compounds.

(1)

$CH\equiv C—CH_2OH$

Propargyl alcohol (2)

$CH\equiv C—CH_2—CH_2OH$

Propargyl carbinol (3)

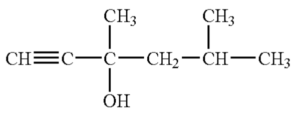

3,5-Dimethyl-1-hexyn-3-ol (4)

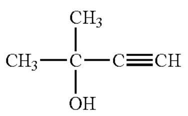

3-Methyl-1-butyn-3-ol

-continued (5)

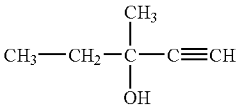

3-Methyl-1-pentyn-3-ol (6)

$HO—CH_2—C\equiv C—CH_2—OH$ 1,4-Butynediol (7)

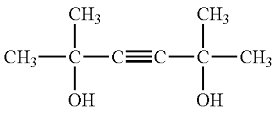

2,5-Dimethyl-3-hexyn-2,5-diol (8)

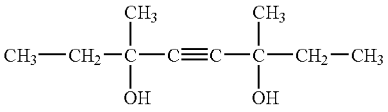

3,6-Dimethyl-4-octyn-3,6-diol (9)

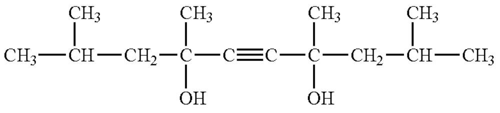

2,4,7,9-Tetramethyl-5-decyn-4,7-diol (10)

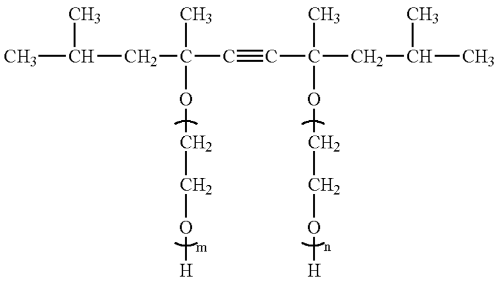

Adduct of 2,4,7,9-tetramethyl-5-decyn-4,7-diol and ethylene oxide (m + n = 1~30)

(11)

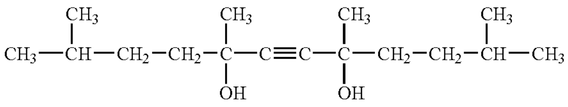

2,5,8,11-Tetramethyl-6-dodecyn-5,8-diol

These acetylene alcohols and acetylene glycols are commercially available, and examples thereof include SURFYNOL™ (Air Products and Chemicals Inc.).

Typical examples of the commercially available products include SURFYNOL 61 (an example of compound (3) described above], OLFINE B (an example of compound (4) described above], OLFINE P (an example of compound (5) described above], OLFINE Y (an example of compound (7) described above], SURFYNOL 82 (an example of compound (8) described above], SURFYNOL 104 and OLFINE AK-02 (examples of compound (9) described above], SURFYNOL 400 series (an example of compound (10) described above], and SURFYNOL DF-110 (an example of compound (11) described above].

The content of the antifoamer in the developing solution is preferably 0.0001% by mass or more and more preferably 0.0005 to 0.1% by mass from the viewpoints of the antifoaming effect and printing durability.

The developing solution used in the invention may contain an alkali metal salt of an organic acid and/or an alkali metal salt of an inorganic acid as a development adjusting agent. For example, one salt or two or more of salts selected from sodium carbonate, potassium carbonate, ammonium carbonate, sodium citrate, potassium citrate, and ammonium citrate may be contained in the developing solution.

Alkali Agent

Examples of the alkali agent contained in the developing solution used in the invention include inorganic alkali agents such as trisodium phosphate, tripotassium phosphate, triammonium phosphate, sodium borate, potassium borate, ammonium borate, sodium hydroxide, potassium hydroxide, ammonium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. In the invention, one of these alkali agents may be used or two or more of them can be used together.

In addition to the above compounds, the alkali agent can be alkali silicate. The alkali silicate may be used in combination with a base. The alkali silicate salt used is a salt that becomes alkaline when dissolved in water, and examples thereof include sodium silicate, potassium silicate, lithium silicate, and ammonium silicate. One of these alkali silicates may be used or two or more of them can be used together.

The developing solution for use in the invention can be optimally adjusted by controlling the mixing ratio and the concentrations of silicon oxide $SiO_2$, a component of the silicate salt used as a hydrophilizing component for a substrate and an aluminum support, and an alkali oxide $M_2O$ (M represents an alkali metal or an ammonium group) used as an alkali component. The mixing ratio (molar ratio) of silicon oxide $SiO_2$ to alkali oxide $M_2O$ ($SiO_2/M_2O$) is preferably in a range of 0.75 to 4.0, and more preferably in a range of 0.75 to 3.5 for the purpose of suppressing stains caused by leaving an aluminum support for too long period of time in the developing solution and by excessively dissolving (etching) the anodic oxide film on the aluminum support in the solution, or suppressing the generation of insoluble deposits caused by the dissolved aluminum and silicate forming a complex.

If the mixing ratio of $SiO_2/M_2O$ is less than 0.75, the developing solution becomes strong alkaline, excessively dissolves (etches) the anodic oxide layer on the aluminum substrate serving as the support for a planographic printing plate and then causes the above described stains due to leaving, and insoluble deposits caused by the dissolved aluminum and silicic acid forming a comples occurs. Meanwhile, if the mixing ratio is more than 4.0, a developing property may deteriorate and insoluble deposits obtained by condensing silicates occur.

From the viewpoints of suppression of the dissolution (etching) of the anodic oxide film disposed on the aluminum support, a developing property, suppression of precipitation and crystal growth, and suppression of the gelling of the alkaline silicate caused by neutralization of wastewater, the concentration of the alkali silicate in the developing solution is such that the content of silicon dioxide in the developing solution is preferably in a range of 0.01 to 1 mol/L and more preferably in a range of 0.05 to 0.8 mol/L. When the concentration is less than 0.01 mol/L, an effect of suppressing dissolution (etching) of the anodic oxide layer disposed on the aluminum substrate cannot be obtained and the developing property and developing processing capacity may deteriorate. Meanwhile, the concentration is more than 1 mol/L, the precipitation and the crystals, and the gelling caused by neutralization of wastewater easily occur, causing troubles in wastewater processing.

The developing solution used in the invention may further contain the following components in addition to the components described above, if necessary. Examples thereof include organic carboxylic acids such as benzoic acid, phthalic acid, p-ethylbenzoic acid, p-n-propylbenzoic acid, p-iso-propylbenzoic acid, p-n-butylbenzoic acid, p-t-butylbenzoic acid, p-2-hydroxyethylbenzoic acid, decanoic acid, salicyclic acid, and 3-hydroxy-2-naphthoic acid; organic solvents such as iso-propyl alcohol, benzyl alcohol, ethyl cellosolve, butyl cellosolve, phenyl cellosolve, propylene glycol, and diacetone alcohol; and reducing agents, dyes, pigments, water softeners, and antiseptics.

The pH of the developing solution for use in the invention is preferably in a range of 10 to 12.5 and more preferably in a range of 11 to 12.5 at 25° C. Even when the developing solution used in the invention has such a low pH, the developing solution contains the surfactant described above, and therefore exhibits an excellent developing property with respect to the non-image portion of a plate. Adjusting the pH of the developing solution to a relatively low value can lessen damage on image portions during development and facilitate handling of the developing solution.

The electric conductivity x of the developing solution is preferably 2 to 30 mS/cm and more preferably 5 to 25 mS/cm.

Here, it is preferable to add an alkali metal salt of an organic or inorganic acid to the developing solution as an agent for adjusting the electric conductivity of the developing solution.

The developing solution described above may be used as a developing solution and a developing replenisher, and is preferably used in automatic developing machines.

In an automatic developing machine 30, as throughput in development increases, the developing solution deteriorates. However, developing capacity may be recovered by supplying a replenisher to the developing solution or using a new developing solution. In such a case, the reprenisher is preferably supplied by a method described in U.S. Pat. No. 4,882,246. In addition, it is preferable to use any of developing solutions described in JP-A Nos. 50-26601 and 58-54341 and Japanese Patent Application Publication (JP-B) Nos. 56-39464, 56-42860, and 57-7427. The replenishing method is preferably applied to the automatic developing machine 30.

In the automatic developing machine 30, the developed plate is washed with water sprayed from a nozzle in the water washing subunit to remove the alkaline developing solution remaining on the plate surface and reduce the amount of the alkaline solution undesirably fed to the finisher subunit, which is next to the water washing subunit.

In the finisher subunit of the automatic developing machine 30, a gum solution having a predetermined concentration is applied onto the surface of the plate to acidify the photosensitive resin of the plate which photosensitive resin has become alkaline due to development, to thereby suppress damage of the image portion caused by development and to prevent stains and scratching of the non-image portion.

A rinsing solution containing washing Water and a surfactant, or a desensitizing solution containing gum arabic and/or a starch derivative is used as the gum solution, as described in JP-A Nos. 54-8002, 55-115045, and 59-58431.

The drying subunit of the automatic developing machine 30 has a drying device including a hot air supplying device such as a blower, and a heater, and the gum solution applied onto the plate is dried, for example, by blowing hot air onto the printing plate or the dummy plate. After dried in the drying unit, the printing plate or the dummy plate is discharged out of the discharging port of the system.

The dried planographic printing plate on which an image has been formed may be further subjected to entire-surface post-heating or post-exposure in a dedicated apparatus additionally placed after the automatic developing machine 30, for the purpose of improving image strength and printing durability thereof. Necessity of such treatment depends on the kind of the planographic printing plate. In addition, the apparatus for the entire-surface post-heating or exposure may be connected to the development apparatus on-line or off-line.

Heating after development may be conducted under very severe conditions. Normally, the planographic printing plates are heated at a heating temperature in a range of 200 to 500° C. When the heating temperature after development is low, sufficient strengthening of the image cannot be obtained. Meanwhile, the heating temperature is too high, the support of the plate may deteriorate and the image portion of the plate may thermally decompose.

The CTP plate-making system 100 described above operates as follows. When a plate disposed on the top of a pile 12A on the unit 10 is identified as a planographic printing plate precursor, the precursor is sent to an exposure drum and subjected to image exposure by laser light from a laser source. The exposed printing plate on the exposure drum is removed therefrom and then conveyed to the automatic developing machine 30. In the automatic developing machine 30, the printing plate is developed and subjected to predetermined processing, for example, application of a gum solution to form a printing plate which has been finished. Then, the plate making is completed.

On the other hand, when a plate disposed on the top of a pile 12B on the unit 10 is identified as a dummy plate precursor, the precursor automatically passes through the plate setter 20 without laser exposure and is conveyed to the automatic developing machine 30. In the automatic developing machine 30, the dummy plate precursor is developed and subjected to predetermined processing, for example, application of a gum solution to form a dummy plate. Then, the dummy plate making is completed. Accordingly, the processing time for the dummy plate precursor is shortened by eliminating the exposure.

Subsequently, the planographic printing plate(s) and the dummy plate(s) for planographic printing are set in an offset printing machine and used in multi-face printing using planographic printing plates to print images on a number of sheets of paper.

A plate cleaner is used to remove stains on the plate during printing, and is a conventionally known plate cleaner for PS plates. Examples thereof include CL-1, CL-2, CP, CN-4, CN, CG-1, PC-1, SR, and IC (manufactured by Fuji Photo Film Co. Ltd.).

Dummy Plate Precursor for Planographic Printing

The dummy plate precursor for planographic printing according to the first aspect of the invention has a support and a non-photosensitive layer containing an alkali-soluble binder polymer having an absorption maximum at a wavelength range of 350 to 450 nm and an absorbance at the absorption maximum of 0.2 or more. The dummy plate precursor for planographic printing according to the second aspect of the invention may be any dummy plate precursor, as long as it has an absorption maximum in a wavelength range of 350 to 700 nm, an absorbance at the absorption maximum of 0.2 or more, and color tone different from that of each of the planographic printing plate precursor and the base substrate surface. It is preferable that the dummy plate precursor has a support and a non-photosensitive layer formed on the support and containing an alkali-soluble binder polymer and has an absorption maximum in the wavelength region of 350 to 450 nm and an absorbance at the absorption maximum of 0.2 or more. This is because it can be developed in a CTP plate-making system common to the planographic printing plate precursor. More preferably, the dummy plate has an undercoat layer between the support and the non-photosensitive layer.

Hereinafter, each layer of the dummy plate precursor according to the invention will be described one by one.

Undercoat Layer

The dummy plate precursor according to the invention may have an undercoat layer between the support and the non-photosensitive layer, if necessary. The undercoat layer is not essential but is effective in improving the developing property of the non-photosensitive layer described later and suppressing undesirable remaining of the non-photosensitive layer.

Hereinafter, the undercoat layer will be explained. It is preferably to make an undercoat on a support having a hydrophilic surface by using a composition containing a water-soluble compound. Addition of such a compound to the dummy plate precursor accelerates penetration of the alkaline developing solution into the dummy plate precursor, i.e., development. Therefore, even after the dummy plate precursor has been stored for a long period of time, the precursor can be sufficiently developed, preventing printing stains.

The water-soluble compound used in the undercoat layer is preferably carboxymethyl cellulose; dextrin; gum arabic; amino group-containing phosphonic acid such as 2-aminoethylphosphonic acid; an organic phosphonic acid such as phenylphosphonic acid, naphthylphosphonic acid, alkylphosphonic acid, glycerophosphonic acid, methylenediphosphonic acid, or ethylenediphosphonic acid, which may have at least one substituent; an organic phosphoric acid such as phenylphosphoric acid, naphthyl phosphoric acid, alkylphosphoric acid, or glycero phosphoric acid, which may have at least one substituent; an organic phosphinic acid such as phenylphosphinic acid, naphthylphosphinic acid, alkylphosphinic acid, or glycerophosphinic acid, which may have at least one substituent; an amino acid such as glycine or β-alanine; the hydrochloride salt of a hydroxyl group-containing amine such as triethanolamine hydrochloride; or a sulfonate group-containing water-soluble polymer. The water-soluble compound is more preferably a sulfonate group-containing water-soluble polymer.

The sulfonate group-containing water-soluble polymer is a water-soluble polymer compound containing at least one sulfonate group-containing monomer unit as a repeating unit in the molecule thereof. Examples thereof include those described in JP-B No. 4-9296 (column 3, line 22 to column 4, line 41).

The sulfonate group-containing monomer unit is preferably p-styrenesulfonic acid, 2-acrylamido-2-methylpropanesulfonic acid, and/or ethylenesulfonic acid, and the sulfonate group-containing water-soluble polymer is prepared by polymerizing at least one of these monomers or copolymerizing at least one of these monomers with at least one of other monomers.

When at least one of the above-described monomers is copolymerized with at least one of other monomers, other monomers are required to be copolymerizable with the sulfonate group-containing monomer. As long as other monomers satisfy this requirement, the kinds thereof are not particularly limited. Typical examples thereof include methyl methacrylate, ethyl acrylate, sodium 2-acrylamido-2-methylpropanesulfonate, methyl acrylate, sodium p-styrenesulfonate, and sodium polystyrenesulfonate.

In the invention, the molecular weight of the water-soluble compound used in the undercoat layer is not particularly limited, as long as the compound is soluble in water. However, the weight-average molecular weight is generally in a range of about 1,000 to 1,000,000, preferably in a range 2,000 to 100,000, and most preferably in a range of 10,000 to 100,000.

The undercoat layer is formed by dissolving the water-soluble compound in water, methanol, ethanol, iso-propyl alcohol, or methyl ethyl ketone, or a mixed solvent thereof, applying the resultant solution onto a support, and drying the coated support.

The dry amount of the undercoat layer is suitably 10 to 500 $mg/m^2$ and preferably 50 to 200 $mg/m^2$, for prevention of printing stains, improvement in the strength of the non-photosensitive resin layer to be coated later, and prevention of scratches.

Non-photosensitive Layer

On the support or on the undercoat layer, a non-photosensitive layer including an alkali-soluble binder polymer as the primary component thereof is formed. In the invention, the alkali-soluble binder polymer used in the non-photosensitive layer is preferably an organic polymer compound which has an acid content of 0.1 to 3.0 meq/g, preferably 0.2 to 2.0 meq/g, which is substantially insoluble in water (i.e., insoluble in a neutral or acidic aqueous solution), which has a film-forming property and which dissolves in or swells with an aqueous alkaline solution. If the acid content is less than 0.1 meq/g, it becomes hard for the polymer to dissolve in an aqueous alkaline solution. Meanwhile, if it is more than 3.0 meq/g, the strength of the resulting film tends to deteriorate when stored at high temperature and high humidity.

The molecular weight of the binder polymer is not particularly limited, as long as the binder polymer is soluble in the coating solvent and dissolves in or swells with an aqueous alkaline solution. However, the weight-average molecular weight thereof is preferably 1,000 to 1,000,000 and more preferably 10,000 to 500,000 from the viewpoint of well balance between layer strength and solubility of the polymer in alkaline water.

The binder polymer is particularly preferably a copolymer obtained by copolymerizing acrylic acid, methacrylic acid, crotonic acid and/or maleic acid serving as at least one essential monomer; a copolymer of 2-hydroxyethyl acrylate or 2-hydroxyethyl methacrylate, and/or acrylonitrile or methacrylonitrile, and/or acrylic acid or methacrylic acid, and, if necessary, at least one of other copolymerizable monomers such as those described in JP-A No. 50-118802; a copolymer made from an acrylic or methacrylic acid derivative having, at one or more terminals thereof, a hydroxy group that is esterified with a group containing a dicarboxylic acid ester residue, acrylic acid and/or methacrylic acid and, if necessary, at least one of other copolymerizable monomers such as those described in JP-A 53-120903; a copolymer of a monomer having, at one or more terminals thereof, an aromatic hydroxyl group (e.g., N-(4-hydroxyphenyl)-methacrylamide, etc.), acrylic acid or methacrylic acid, and, if necessary, at least one of other copolymerizable monomers such as those described in JP-A No. 54-98614; or a copolymer of an alkyl acrylate, acrylonitrile or methacrylonitrile, and an unsaturated carboxylic acid such as those described in JP-A No. 56-4144. In addition, an acidic polyvinyl alcohol derivative or an acidic cellulose derivative is also useful as such. Further, a binder described in JP-B No. 54-19773, and JP-A Nos. 57-94747, 60-182437, 62-58242, and 62-123453, which binder is obtained by making polyvinylacetal or polyurethane soluble in an alkaline solution, is also useful. The binder in the invention is particularly preferably an alkali-soluble polyurethane resin, since it can form a strong film.

The non-photosensitive layer used in the invention preferably has an absorption maximum in a wavelength region of 350 to 450 nm. In order to satisfy this, a coloring agent having an absorption maximum in the wavelength region of 350 to 450 nm is added to the composition for forming a non-photosensitive layer. The content thereof is preferably 0.5 to 10% by mass with respect to the solid matters of the non-photosensitive layer.

The absorbance of the non-photosensitive layer should be 0.2 or more, preferably 0.3 to 1.5, and more preferably 0.4 to 1.0. When the absorbance is less than 0.2, exact identification by a color sensor becomes difficult. Meanwhile, when the absorbance is more than 1.5, and when the dummy plate precursor is stored for a long period of time, color undesirably remains in the resultant dummy plate. The coloring agent is preferably a dye soluble in the developing solution.

The absorbance depends on the amount of the coloring agent added and the thickness of the non-photosensitive layer. In the invention, the absorbance is a value obtained by measuring the absorbance of a sample having a non-photosensitive layer on a support with U-3010 spectrophotometric reflection spectrum-measuring device manufactured by Shimadzu Corporation and calibrating the measured value on the basis of the absorbance of the support without a non-photosensitive layer serving as a reference.

The kind of the dye used as the coloring agent for the non-photosensitive layer is not particularly limited, and the dye can be an oxonol dye, a hemioxonol dye, a merocyanine dye, a cyanine dye, or an azo dye. Specific examples thereof include pyrazolone dyes described in JP-B No. 58-12576; pyrazolone oxonol dyes described in U.S. Pat. No. 2,274,782; diaryl azo dyes described in U.S. Pat. No. 2,956,879; styryl dyes and butadienyl dyes described in U.S. Pat. Nos. 3,423,207 and 3,384,487; merocyanine dyes described in U.S. Pat. No. 2,527,583; merocyanine dyes and oxonol dyes described in U.S. Pat. Nos. 3,486,897, 3,652,284, and 3,718,472; enamino hemioxonol dyes described in U.S. Pat. No. 3,976,661; and dyes described in U.K. Patent Nos. 584,609 and 1,177,429, JP-A Nos. 48-85130, 49-99620, and 49-114420, U.S. Pat. Nos. 2,533,472, 3,148,187, 3,177,078, 3,247,127, 3,540,887, 3,575,704, and 3,653,905.

Hereinafter, typical examples of the dye preferable as the coloring agent are shown below, but the invention is not limited by these compounds.

S-1

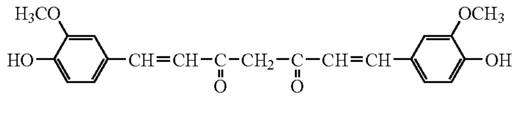

-continued

S-2

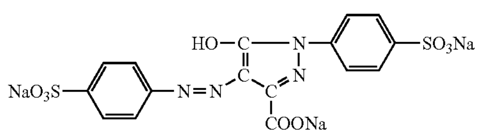

S-3

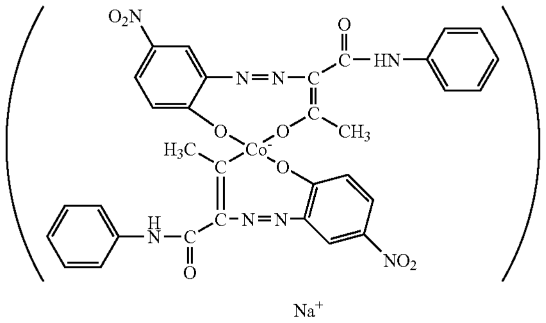

S-4

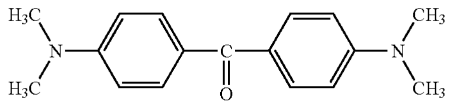

S-5

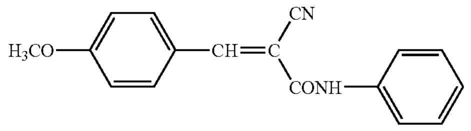

S-6

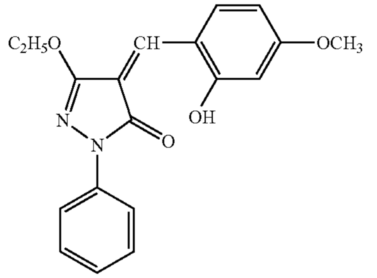

In the invention, it is preferable for the non-photosensitive layer to contain a low molecular weight acid compound. The acid compound having a low molecular weight means a compound different from the alkali-soluble binder polymer, which is a polymeric acid compound. The low molecular weight compound means a compound having a molecular weight of 1,000 or less. Inclusion of such a compound in the non-photosensitive layer accelerates penetration of the alkaline developing solution into the non-photosensitive layer, i.e., development. Thereby, the dummy plate precursor can be developed even after long-term storage thereof, preventing printing stains.

Specifically, the low molecular weight acid compound is preferably a phosphate group, a sulfate group, a dipicolinate group, or a compound having a carboxylate or sulfonate group in the molecule thereof, such as malic acid, sulfosalicyclic acid, sulfophthalic acid, tricarbarylic acid, glycine, benzoic acid, or phthalic acid and a molecular weight of 1,000 or less. The low molecular weight acid compound is more preferably phosphoric acid or tricarbarylic acid, since it accelerates dissolution of the non-photosensitive layer and prevents printing stains after long-term storage. The content thereof is preferably 1 to 20% by mass with respect to the solid matters in the non-photosensitive layer.

The non-photosensitive layer may further contain various additives in addition to the components described above. For example, the non-photosensitive layer can include a plasticizer for accelerating dissolution of the non-photosensitive layer, and/or a coating surface modifying agent such as a fluorinated surfactant.

In cases of conventional dummy plate precursors, it is preferable to form, on the non-photosensitive layer, a matting layer having, on the surface thereof, protrusions mutually, independently provided, in order to improve scratch resistance of the dummy plate precursors and prevent adhesion between the dummy plate precursors during storage thereof. However, in order to prevent staining of a plate setter due to dropout of the protorusions of the matting layer and deterioration of image quality due to the staining, it is preferable that the dummy plate precursor used in the CTP device has no matting layer.

The non-photosensitive layer of the dummy plate precursor for planographic printing can be produced by dissolving components of the non-photosensitive layer in a known coating solvent, applying the resultant solution (composition) onto a support, more preferably, an aluminum support having a hydrophilic surface and an undercoat layer, and drying the coated support. The concentration of solid matters contained in the composition used in coating is generally 1.0 to 50% by mass and preferably 2.0 to 30% by mass.

Any of known methods, for example, roll coating, bar coating, spray coating, curtain coating, and spin coating, may be used as a method of coating the support with the composition. The resultant composition solution layer is preferably dried at 50 to 150° C. The layer may be first pre-dried at a low temperature and then dried at a high temperature, or dried only at a high temperature. The dry amount of the non-photosensitive layer is preferably 0.2 to 1.5 g/m$^2$ and more preferably 0.3 to 1.0 g/m$^2$ from the viewpoints of prevention of scratching of the layer and improvement in dissolution and removal of the layer during development.

Support

The support of the dummy plate precursor according to the invention is preferably a metal support having a hydrophilic surface. Specifically, the support is preferably an aluminum support or a composite support coated with aluminum, and more preferably a 1S aluminum plate containing iron in an amount of 0.1 to 0.5% by weight, silicon in an amount of 0.03 to 0.3%, copper in an amount of 0.001 to 0.03%, and titanium in an amount of 0.002 to 0.1%.

The surface of aluminum material is preferably treated in order to improve the water-holding property thereof. The treatment of improving the water holding property is preferably an alkali treatment, and more preferably etching of the aluminum material by immersing the aluminum material in a 1 to 30 wt % aqueous solution of an alkali agent selected from sodium hydroxide, potassium hydroxide, sodium carbonate, and sodium silicate at a temperature within a range of 20 to 80° C. for 5 to 250 seconds.

Aluminum ions may be added to the etching solution in an amount of one fifth of that of alkali. The support after alkaline etching is then neutralized and desmutted by immersing the support in a 10 to 30 wt % aqueous nitric or sulfuric acid solution at a temperature of 20 to 70° C. for 5 seconds to 25 seconds.

Another method of improving the water-holding property is, for example, a surface roughening treatment. Examples of the surface roughening method include generally known brushing, ball polishing, electrolytic etching, chemical etching, liquid honing, and sand blasting, and combinations thereof The surface roughening method is preferably brushing, electrolytic etching, chemical etching, or liquid honing, and more preferably a surface roughening treatment containing an electrolytic etching treatment. In addition, the surface roughening method is also preferably a method in which electrolytic etching is conducted after brushing described in JP-A No. 54-63902.

An aqueous solution containing an acid, an alkali, or a salt thereof, or an aqueous solution containing an organic solvent is used as an electrolytic solution for use in electrolytic etching. The electrolytic solution is preferably an electrolyte containing hydrochloric acid, nitric acid, or a salt thereof. Brushing is preferably carried out by using a Pamistone-water suspension and a nylon brush. Brushing is preferably carried out such that the average surface roughness becomes 0.25 to 0.9 μm.

The electrolyte for use in electrolytic etching treatment is an aqueous solution of hydrochloric or nitric acid. The concentration of the acid is preferably in a range of 0.01 to 3% by weight, and more preferably in a range of 0.05 to 2.5% by weight. In addition, the electrolyte solution may contain a corrosion inhibitor (or stabilizer) such as nitrate, chloride, monoamine, diamine, aldehyde, phosphoric acid, chromic acid, boric acid, or ammonium oxalate, and/or an agent for uniformizing grain, if necessary. Further, the electrolyte may also contain a suitable amount (1 to 10 g/L) of aluminum ions.

The electrolytic etching treatment is generally carried out such that the temperature of the electrolyte is 10 to 60° C. The alternate current used in etching may have a rectangular wave, trapezoidal wave, or sine wave, as long as the polarity is mutually exchangeable between positive and negative. Single-phase or three-phase alternate current which is ordinary commercial alternate current may be used. The etching is preferably carried out at an electric current density of 5 to 100 $A/dm^2$ for 10 to 300 seconds.

In the invention, the surface roughness of an aluminum alloy support is adjusted by controlling quantity of electricity, and may be in a range of 0.2 to 0.8 μm. In addition, the aluminum plate after surface roughening treatment is desmutted in an aqueous acid or alkaline solution, if necessary.

The surface-roughened aluminum alloy is preferably treated in a 10 to 50% by weight of hot sulfuric acid (40 to 60° C.) or dilute alkaline (e.g., sodium hydroxide) for removal of smuts on the surface and etching (preferably, in a range of 0.01 to 2.0 $g/m^2$). When the smuts have been removed or the support has been etched with an alkaline solution, the aluminum alloy support is then immersed in acid (specifically, nitric acid, or sulfuric) for washing and neutralization.

After surface desmutting, an anodic oxide layer is formed on the support. Any of known methods may be used as an anodic oxidation method, and sulfuric acid is used as the most useful electrolyte. Phosphoric acid is the next most useful electrolyte. In addition, a mixture of sulfuric and phosphoric acids described in JP-A No. 55-28400 is also useful.

Anodic oxidation using sulfuric acid is generally carried out by using direct current, but may be carried out by using alternate current. An oxide film having a coating amount of 1 to 10 $g/m^2$ is formed on the surface of the support by electrolysis at a sulfuric acid concentration of 5 to 30% by weight at a temperature within a range of 20 to 60° C. for 5 to 250 seconds. The electrolyte preferably contains aluminum ions. The electric current density at that time is preferably 1 to 20 $A/dm^2$. In a case of anodic oxidation using phosphoric acid, an anodic film is formed at a phosphoric acid concentration of 5 to 50% by weight, a temperature of 30 to 60° C and an electric current density of 1 to 15 $A/dm^2$ for 10 to 300 seconds.

If necessary, a hydrophilizing treatment of the support may be carried out and the hydrophilizing treatment can use silicate (e.g., sodium silicate, or potassium silicate) described in U.S. Pat. Nos. 2,714,066 and 3,181,461; potassium fluorozirconate described in U.S. Pat. No. 2,946,638; phosphomolybdate described in U.S. Pat. No. 3,201,247; an alkyl titanate described in U.K. Patent No. 1,108,559; polyacrylic acid described in Germany Patent No. 1,091,433; polyvinylphosphonic acid described in Germany Patent No. 1,134,093 and U.K. Patent No. 1,230,447; phosphonic acid described in JP-B No. 44-6409; phytic acid described in U.S. Pat. No. 3,307,951; and/or a salt of a hydrophilic organic polymer compound and a bivalent metal described in JP-A Nos. 58-16893 and 58-18291. Silicate is particularly preferably used, since it has a high hydrophilizing property and treatment using silicate is easy to carry out.

One example of other hydrophilizing methods is silicate electrodeposition described in U.S. Pat. No. 3,658,662. In addition, a sealing treatment may be performed after the surface roughening and anodic oxidation treatments. The sealing may be carried out by immersing the support in hot water or a hot aqueous solution containing an inorganic or organic salt, or placing the support in a steam bath.

Planographic Printing Plate Precursor

Hereinafter, the planographic printing plate precursor used in the second aspect of the invention will be described.

The planographic printing plate precursor used in the second aspect of the invention may be any planographic printing plate precursor, as long as it has an absorption maximum in a wavelength range of 350 to 700 nm, an absorbance at the absorption maximum of 0.2 or more, and color tone different from that of each of the dummy plate precursor for planographic printing and the base substrate surface and can form a latent image by infrared ray exposure. A planographic printing plate precursor preferably has a support and a photosensitive layer containing an infrared ray absorbent.

Photosensitive layers containing an infrared ray absorbent are classified into negative-type photosensitive layers whose developability by alkaline lowers due to exposure of infrared ray, and positive-type photosensitive layers whose developability improves due to exposure of infrared ray.

Hereinafter, each photosensitive layer will be described in detail.

Examples of the negative-type photosensitive layers include known negative-type photosensitive layers including a polarity-changing material (from a hydrophilic property to a hydrophobic property), a radically polymerizable compound, or a compound cross-linkable in the presence of an acid catalyst (including cationicaly polymerizable compound).

The negative-type photosensitive layer preferably contains a radically polymerizable compound or a compound cross-linkable in the presence of an acid catalyst from the viewpoint of printing durability. In such photosensitive layers, a radical or acid generated by light and/or heat caused by infrared ray exposure functions as an initiator or a catalyst, causing the component(s) of the irradiated layer to polymerize or crosslink so as to harden the photosensitive layer and thus form an image portion.

Examples of the positive-type photosensitive layers include known positive-type photosensitive layers including a polarity-changing material (from a hydrophobic property to a hydrophilic property), or a compound decomposable in the presence of an acid catalyst, and known interaction-releasing (thermosensitive and positive) photosensitive layers.

The positive-type photosensitive layer is particularly preferably an interaction-releasing one or one including a compound decomposable in the presence of an acid catalyst from the viewpoint of image quality. In these photosensitive layers, the bonds of the polymer compound (molecules) of the photosensitive layer are released by acid generated by light and/or heat caused by infrared ray exposure, and/or energy of heat caused by infrared ray exposure, making the photosensitive layer soluble in water or alkaline water. Thereby, the photosensitive layer can be removed by development and consequently a non-image portion is formed.

Coloring Agent

In the invention, both the negative-type photosensitive layer and the positive-type photosensitive layer have an absorption maximum in a wavelength range of 350 to 700 nm and an absorbance at the absorption maximum of 0.2 or more. The photosensitive layer used in the invention preferably has an absorption maximum in a wavelength range of 500 to 600 nm. Therefore, it is preferable for the photosensitive layer to contain a coloring agent having an absorption maximum in a wavelength range of 500 to 600 nm.

In addition, the absorbance of the photosensitive layer should be 0.2 or more, but is preferably 0.3 to 1.5, and more preferably 0.4 to 1.0. When the absorbance is less than 0.2, exact identification by a color sensor becomes difficult. Meanwhile, when the absorbance is more than 1.5, and the planographic printing plate precursor is stored for a long period of time, color undesirably remains in the non-image portion of the resultant printing plate. The coloring agent is preferably a dye soluble in the developing solution.

Examples of the coloring agent for use in the photosensitive layer include Oil Yellow #101, Oil Yellow #103, Oil Pink #312, Oil Green BG, Oil Blue BOS, Oil Blue #603, Oil Black BY, Oil Black BS, and Oil Black T-505 (manufactured by Orient Chemical Industries); Victoria Pure Blue, crystal violet (CI42555), methyl violet (CI42535), ethyl violet, rhodamine B (CI145170B), malachite green (CI42000), methylene blue (CI52015), and dyes described in JP-A No. 62-293247.

The content of the dye(s) and/or pigment(s) added as the coloring agent is preferably about 0.5 to about 5% by mass with respect to the nonvolatile components in the photosensitive layer.

Infrared Ray Absorbent

An infrared ray absorbent contained in the negative-type and positive-type photosensitive layers will be explained. The infrared ray absorbent used in the invention has a function of absorbing infrared rays and converting them to heat, and a function of generating excited electrons.

Such an infrared ray absorbent can be an infrared ray absorbing dye or pigment having an absorption maximum in a wavelength range of 760 to 120 nm.

Such a dye can be a commercially available dye, or a known dye disclosed in "Dye Handbook" edited by The Society of Synthetic Organic Chemistry, Japan and published in 1970. Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalelium dyes, pyrylium salts, and metal thiolate complexes.

The dye is preferably a cyanine dye disclosed in JP-A No. 58-125246, 59-84356, or 60-78787, a methine dye disclosed in JP-A No. 58-173696, 58-181690, or 58-194595, a naphthoquinone dye disclosed in No. 58-112793, 58-224793, 59-48187, 59-73996, 60-52940, or 60-63744, a squalelium dye disclosed in JP-A No. 58-112792, or a cyanine dye disclosed in U. K. Patent No. 434,875.

A near infrared ray absorption sensitizer disclosed in U.S. Pat. No. 5,156,938, a substituted arylbenzo(thio)pyrylium salt disclosed in U.S. Pat. No. 3,881,924, a trimethine thiapyrylium salt disclosed in JP-A No. 57-142645 (U.S. Pat. No. 4,327,169), a pyrylium compound disclosed in JP-A No. 58-181051, 58-220143, 59-41363, 59-84248, 59-84249, 59-146063, or 59-146061, a cyanine dye disclosed in JP-A No. 59-216146, a pentamethine thiopyrylium salt disclosed in U.S. Pat. No. 4,283,475, or a pyrylium salt disclosed in JP-B No. 5-13514, or 5-19702 is preferably used as the dye. The dye is also preferably a near infrared ray absorption dye represented by Formula (I) or (II) of U.S. Pat. No. 4,756,993.

Moreover, the infrared ray absorbing dye in the invention is also preferably a specific indolenine cyanine dye disclosed in Japanese Patent Application No. 2001-6326, or 2001-237840 and shown below.

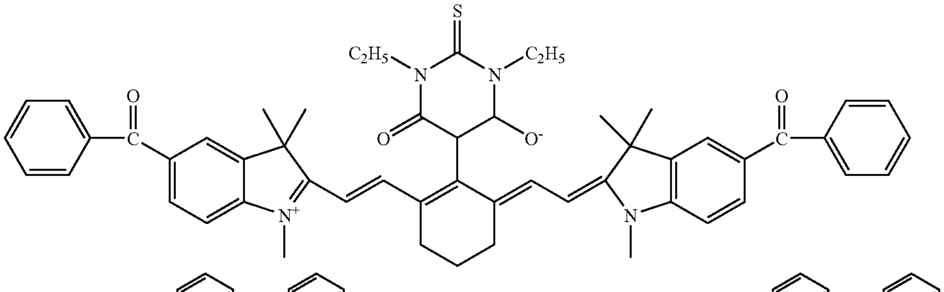

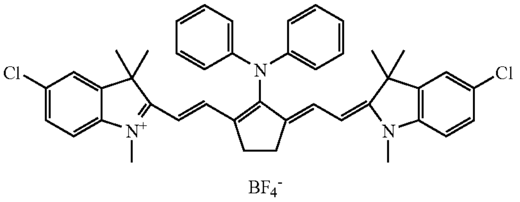

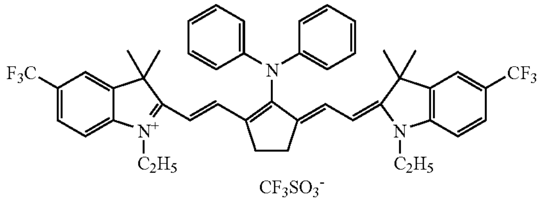

The infrared ray absorbent in the invention is more preferably a cyanine dye, a squalelium dye, a pyrylium salt, a nickel thiolate complexe, or an indolenine cyanine dye, still more preferably a cyanine dye or an indolenine cyanine dye, and still more preferably a cyanine dye represented by the following Formula (1).

Formula (1)

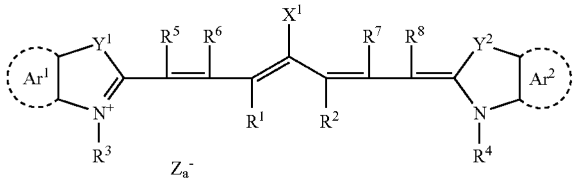

In Formula (1), $X^1$ represents a hydrogen atom, a halogen atom, —$NPh_2$, $X^2$-$L^1$, or a group shown below. Here, $X^2$ represents an oxygen atom, a nitrogen atom, or a sulfur atom, and $L^1$ represents a hydrocarbon group having 1 to 12 carbon atoms, an aromatic ring having at least one hetero atom, or a hydrocarbon group containing at least one hetero atom and having 1 to 12 carbon atoms. The hetero atom is N, S, O, a halogen atom, or Se. Definition of $X_a^-$ is the same as that of $Z^{1-}$ described later, and $R^a$ represents a hydrogen atom or a substituent selected from alkyl groups, aryl groups, substituted or unsubstituted amino groups, and halogen atoms.

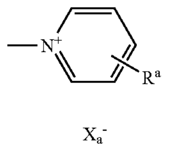

$R^1$ and $R^2$ each independently represent a hydrocarbon group having 1 to 12 carbon atoms. $R^1$ and $R^2$ is preferably a hydrocarbon group having two or more carbon atoms from the viewpoint of storage stability of a photosensitive layer coating liquid. $R^1$ and $R^2$ particularly preferably bind to each other to form a five- or six-membered ring.

$Ar^1$ and $Ar^2$ may be the same or different, and represent an aromatic hydrocarbon group which may have a substituent. Typical examples of the aromatic hydrocarbon group include a benzene ring and a naphthalene ring. Also, typical examples of the substituent include hydrocarbon groups having 12 or less carbon atoms, halogen atoms and alkoxy groups having 12 or less carbon atoms. $Y^1$ and $Y^2$ may be the same or different, and represent a sulfur atom or a dialkylmethylene group having 12 or less carbon atoms. $R^3$ and $R^4$ may be the same or different, and represent a hydrocarbon group which may have a substituent and which has 20 or less carbon atoms. Typical examples of the substituent include alkoxy groups having 12 or less carbon atoms, a carboxyl group and a sulfo group. $R^5$, $R^6$, $R^7$ and $R^8$ may be the same or different, and represent a hydrogen atom or a hydrocarbon group having 12 or less carbon atoms. In light of availability of raw materials, they are preferably hydrogen atoms. $Z^{1-}$ represents a counter anion. However, $Z^{1-}$ is not necessary, if the cyanine pigment represented by Formula (1) has an anionic substituent in its structure, and therefore does not need for neutralization of charges due to a counter anion. $Z^{1-}$ is preferably a halogen ion, a perchlorate ion, a tetrafluoro borate ion, a hexafluorophosphate ion or a sulfonate ion in view of storability of the coating liquid for the photosensitive layer. $Za^-$ is more preferably a perchlorate ion, a hexafluorophosphateate ion or an arylsulfonate ion.

Typical examples of the cyanine dye represented by Formula (1) preferably used in the invention include those described in paragraph No. [0017] to [0019] in JP-A No. 2001-133969.

The cyanine dye is particularly preferably a specific indolenine cyanine dye described in Japanese Patent Application Nos. 2001-6326 and 2001-237840.

The pigment used in the invention may be a commercially available pigment or a pigment described in Color Index (C.I.) Handbook, "Latest Pigment Handbook" (edited by Japan Pigment Technique Association, and published in 1977), "Latest Pigment. Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black can be used. The pigment is preferably carbon black.

These pigments may or may not be surface-treated. Examples of the surface treatment include a method of coating the surface of the pigment with a resin or wax; a method of adhering a surfactant onto the surface; and a method of bonding a reactive material (such as a silane coupling agent, an epoxy compound, or a polyisocyanate) to the surface. The surface treatment methods are described in "Nature and Application of Metal Soap" (Saiwai Shobo), "Printing Ink technique" (by CMC Publishing Co., Ltd. in 1984), and "Latest Pigment Applied Technique" (by CMC Publishing Co., Ltd. in 1986).

The diameter of the pigment particle is preferably in a range of 0.01 to 10 μm, more preferably in a range of 0.05 to 1 μm, and still more preferably in a range of 0.1 to 1 μm. Pigment particles having a diameter within this preferable range are stably dispersed in the photosensitive layer coating liquid and thus enable formation of a uniform photosensitive layer.

The method for dispersing the pigment in a solvent or the photosensitive layer coating liquid may be a known dispersing technique used to produce an ink or a toner. Examples of a dispersing machine used in the method include an ultrasonic disperser, a sand mill, an attritor, a pearl mill, a super mill, a ball mill, an impeller, a disperser, a KD mill, a colloid mill, a dynatron, a three-roll mill, and a pressing kneader. Details thereof are described in "Latest Pigment Applied Technique" (by CMC Publishing Co., Ltd. in 1986).

From the viewpoints of uniformity of the infrared ray absorbing dye in the photosensitive layer and durability of the photosensitive layer, the content of the infrared ray absorbing dye in the photosensitive layer is generally 0.01 to 50% by mass, preferably 0.1 to 10% by mass, and more preferably 0.5 to 10% by mass (in a case of the dye) or 0.1 to 10% by mass (in a case of pigment), relative to the total solid content of the photosensitive layer.

Hereinafter, radically polymerizable layers and layers cross-linkable in the presence of an acid catalyst which are preferably as the negative-type photosensitive layers will be described in that order.

<Radically Polymerizable Layer>

A radically polymerizable layer contains, as the essential components thereof, an infrared ray absorbent, a polymerization initiator, a polymerizable compound (also called addition-polymerizable compound), and a binder polymer, and, if necessary, any other components.

The mechanism of image formation in the radically polymerizable layer is as follows. The infrared ray absorbent is highly sensitive to infrared laser light and is electronically excited by infrared laser irradiation (exposure). Electron transfer, energy transfer, and/or heat generation (light-heat conversion) associated with the electronically excited state interacts with the polymerization initiator to cause the polymerization initiator to chemically change and generate free radicals. Then, the generated radicals trigger polymerization reaction of the polymerizable compounds, hardening an exposed area to form an image portion.

Examples of the mechanism of radical generation are shown below. Heat generated by the infrared ray absorbent having a light-heat converting function causes the polymerization initiator (e.g., sulfonium salt) described later to thermally decompose and to generate radicals (case 1). Alternatively, the excited electrons generated by the infrared ray absorbent move to the polymerization initiator (e.g., activated halogen compound) (case 2). Alternatively, electrons move from the polymerization initiator (e.g., borate compound) to the excited infrared ray absorbent (case 3).

Hereinafter, each component of the radically polymerizable layer will be described.

Polymerization Initiator

The polymerization initiator used in the radically polymerizable layer may be any compound, as long as it has a function of initiating and advancing the curing reaction of a polymerizable compound described later and can generate radicals due to application of energy. Such a compound can be a thermal decomposition-type radical generator that, when heated, decomposes to generate radicals, an electron transfer-type radical generator that receives an excited electron from the infrared ray absorbent to generate radicals, or an electron transfer-type radical generator that generate electrons, which move to the excited infrared ray absorbent so as to generate radicals. Specific examples thereof include onium salts, activated halogen compounds, oxime ester compounds, and borate compounds. Two or more of these initiators may be used together. In the invention, the polymerization initiator is preferably an onium salt, and more preferably a sulfonium salt.

The sulfonium salt polymerization initiator preferably used in the invention can be an onium salt represented by the following Formula (2).

Formula (2)

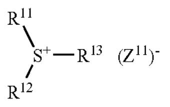

In Formula (2), $R^{11}$, $R^{12}$ and $R^{13}$ may be the same or different, and each represents a hydrocarbon group having 20 or less carbon atoms which may have at least one substituent. Examples of the substituent selected include halogen atoms, a nitro group, alkyl groups having 12 or less carbon atoms, alkoxy groups having 12 or less carbon atoms, and aryloxy groups having 12 or less carbon atoms. $Z^{11-}$ represents a counter ion selected from the group consisting of a halogen ion, a perchlorate ion, a tetrafluoroborate ion, a hexafluorophosphate ion, a carboxylate ion, and a sulfonate ion. $Z^{11-}$ is preferably a perchlorate ion, a hexafluorophosphate ion, a carboxylate ion, or an arylsulfonate ion.

Hereinafter, typical examples of the onium salt represented by Formula (2) ([OS-1] to [OS-12]) are shown below, but the invention is not limited by these compounds.

[OS-1]

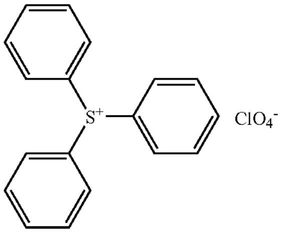

[OS-2]

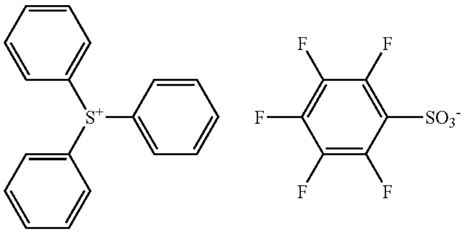

[OS-3]

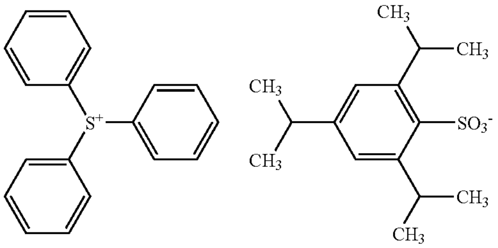

[OS-4]

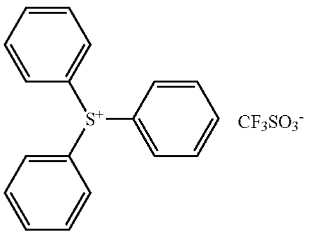

[OS-5]

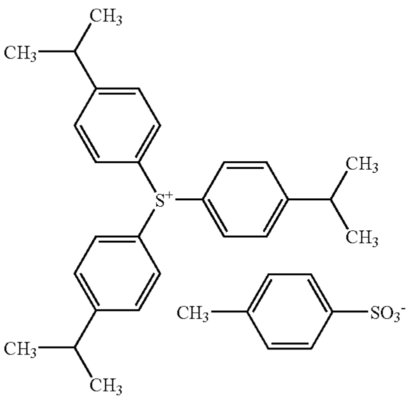

-continued

[OS-6]

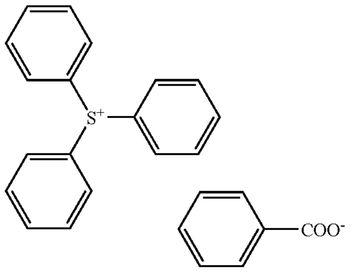

[OS-7]

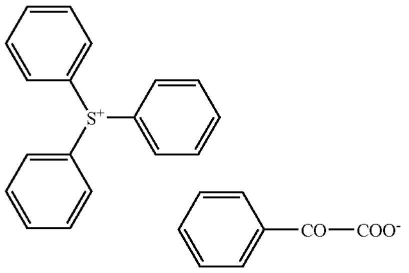

[OS-8]

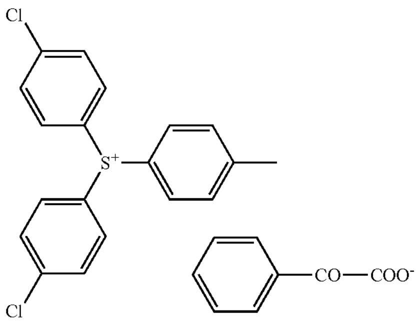

[OS-9]

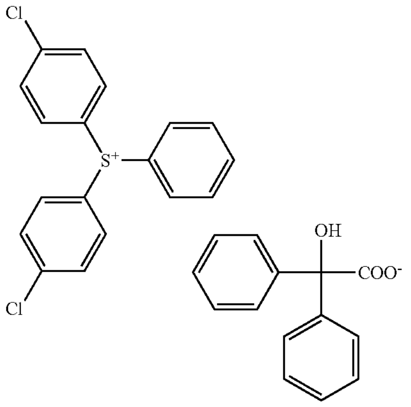

[OS-10]

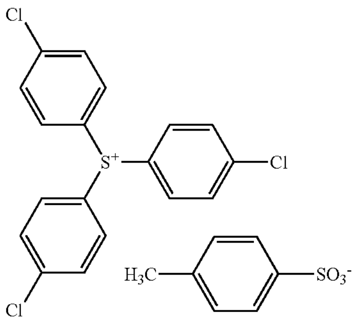

-continued

[OS-11]

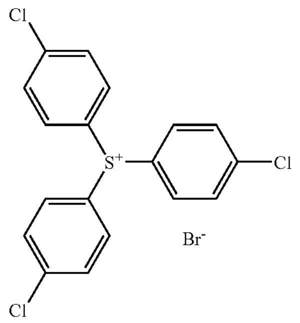

[OS-12]

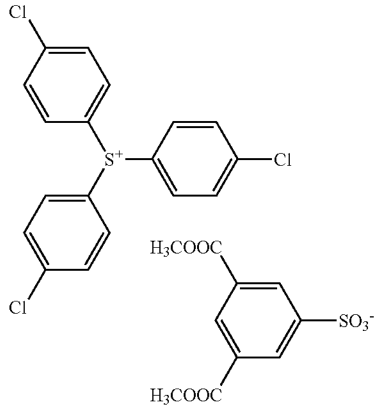

In addition to the compounds described above, specific aromatic sulfonium salts described in JP-A Nos. 2002-148790, 2002-350207, and 2002-6482 are also preferably used as the polymerization initiator.

In the invention, not only the sulfonium salt polymerization initiator, but also other polymerization initiators (other radical generators) may also be used. Examples of other radical generators include onium salts other than sulfonium salts, triazine compounds having a trihalomethyl group, peroxides, azo polymerization initiators, azide compounds, quinone diazide, activated halogen compounds, oxime ester compounds, triaryl monoalkyl borate compounds. Among them, onium salts are preferably used, since they are highly sensitive. In addition, any of these polymerization initiators (radical generator) may be used together with the above-described sulfonium salt polymerization initiator, which is used as the essential component.

Examples of the onium salts which can be used preferably in the invention include iodonium salts and diazonium salts. In the invention, these onium salts function not as acid generating agents but as radical polymerization initiators.

The other onium salts can be those represented by the following Formulae (3) and (4).

$Ar^{21}—I^{+}—Ar^{22}(Z^{21})^{-}$ Formula (3)

$Ar^{31}—N^{+}\equiv N\,(Z^{31})^{-}$ Formula (4)

In Formula (3), $Ar^{21}$ and $Ar^{22}$ each independently represent an aryl group having 20 or less carbon atoms which may have one or more substituents. When the aryl group has at least one substituent, typical examples of the substituent include halogen atoms, a nitro group, alkyl groups having 12 or less carbon atoms, alkoxy groups having 12 or less carbon atoms, and aryloxy groups having 12 or less carbon atoms. $Z^{21-}$ is a counter ion having the same definition as that of $Z^{11-}$.

In Formula (4), $Ar^{31}$ represents an aryl group having 20 or less carbon atoms which may have one or more substituents. Typical examples of the substituents include halogen atoms, a nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms, and diarylamino groups having 12 or less carbon atoms. $Z^{31-}$ is a counter ion having the same definition as that of $Z^{11-}$.

Typical examples of the onium salt represented by Formula (3) ([OI-1] to [OI-12]) and the onium salt represented by Formula (4) ([ON-1] to [ON-5]) preferably used in the invention are shown below, but the invention is not limited by these compounds.

[OI-1]

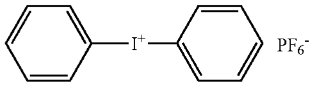

[OI-2]

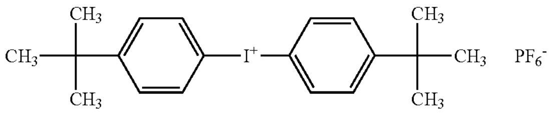

[OI-3]

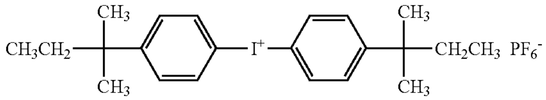

[OI-4]

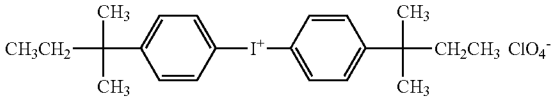

[OI-5]

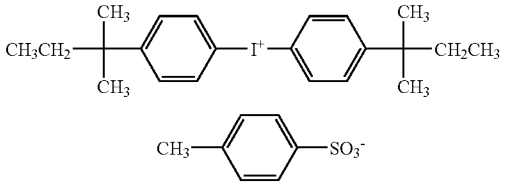

[OI-6]

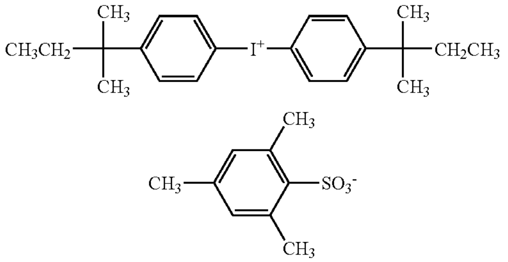

[OI-7]

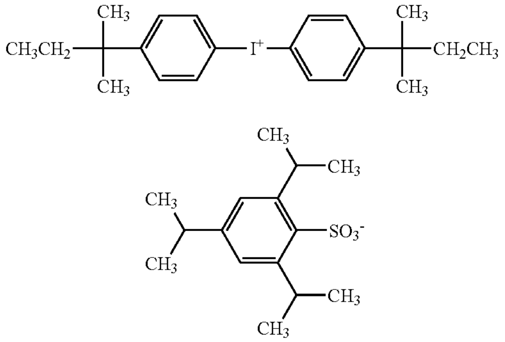

[OI-8]

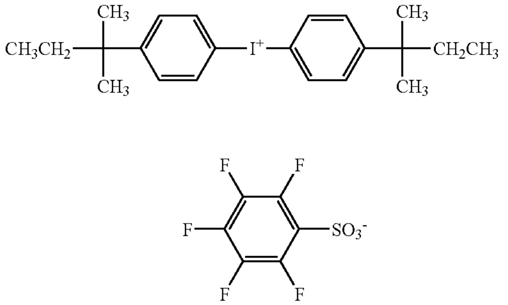

[OI-9]

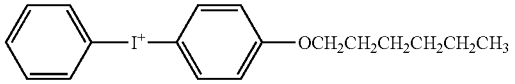

[OI-10]

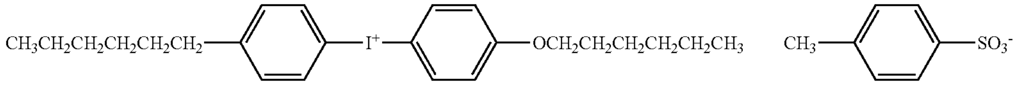

[ON-1]

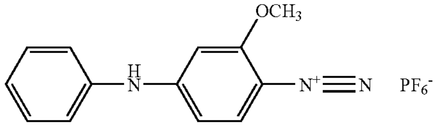

[ON-2]

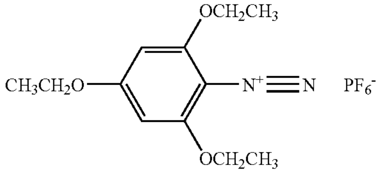

-continued

[ON-3]

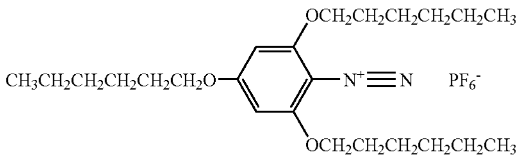

[ON-4]

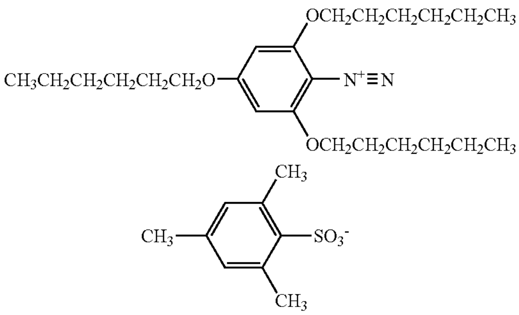

[ON-5]

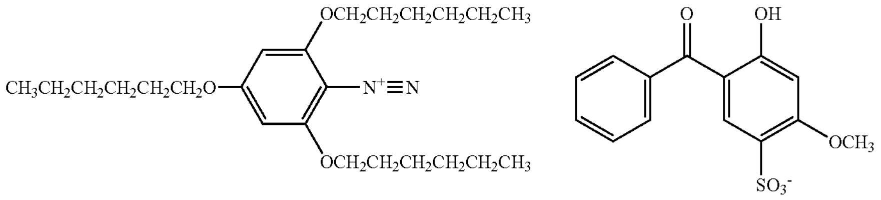

Examples of the onium salts preferably used as the polymerization initiator (radical generating agent) in the invention include those described in JP-A No. 2001-133696.

The polymerization initiator (radical generating agent) used in the invention preferably has a maximum absorption wavelength of 400 nm or less, and more preferably has a maximum absorption wavelength of 360 nm or less. When the radical generating agent has its absorption wavelength in the UV range, the planographic printing plate precursor can be handled under a white lamp.

The total content of the polymerization initiator(s) in the invention is 0.1 to 50% by mass, preferably 0.5 to 30% by mass, and more preferably 1 to 20% by mass with respect to the total solid matters in the radically polymerizable layer from the viewpoints of sensitivity and prevention of stains on the non-image portion during printing.

In the invention, one polymerization initiator may be used or two or more polymerization initiators can be used together. When two or more polymerization initiators are used together, two or more sulfonium salt polymerization initiators may be used, or alternatively, a combination of a sulfonium salt polymerization initiator and any other polymerization initiator may be used.

When a sulfonium salt polymerization initiator and another polymerization initiator are used in combination, the weight ratio of these initiators is preferably 100/1 to 100/50 and more preferably 100/5 to 100/25.

In addition, the polymerization initiator and the other component may be contained in the same layer or in different layers.

When a highly sensitive sulfonium salt serving as a typical polymerization initiator is used in the radically polymerizable layer, the radical polymerization reaction effectively proceeds and the formed image portion is very strong. Accordingly, when such a radically polymerizable layer is combined with a protective layer described later, which has a high oxygen-blocking function, a planographic printing plate having a very strong image portion can be produced, and consequently the printing durability of the plate is further improved. Further, the sulfonium salt polymerization initiator is superior in storability over time, and, when a planographic printing plate precursor including the sulfonium salt polymerization initiator is stored, an undesirable polymerization reaction is effectively suppressed.

The polymerizable compound used in the radically polymerizable layer has at least one ethylenically unsaturated double bond, and is selected from compounds having at least one, and preferably 2 or more, ethylenically unsaturated double bonds. Such compounds are widely known in this industrial field, and any of these compounds may be used in the invention without specific limitation. These have a chemical form such as, for example, a monomer, a prepolymer, i.e., a dimer, a trimer and an oligomer, or a mixture or a copolymer of two or more of these compounds. Examples of the monomer and the copolymer thereof include unsaturated carboxylic acids (e.g., acrylic acid, methacrylic acid, itaconic acid, crotonic acid, isocrotonic acid, and maleic acid), and esters and amides thereof. The polymerizable compound is preferably an ester of an unsaturated carboxylic acid and an aliphatic polyhydric alcohol compound, or an amide of an unsaturated carboxylic acid and an aliphatic polyvalent amine compound. In addition, an addition reaction product of an unsaturated carboxylate having a nucleophilic substituent such as a hydroxyl group, an amino group or a mercapto group, or an amide thereof, and a monofunctional or polyfunctional isocyanate, or an epoxy compound; and a dehydration condensation reaction product of such an unsaturated carboxylate or an amide, and a monofunctional or polyfunctional carboxylic acid may be preferably used. Furthermore, an addition reaction product of an unsaturated carboxylate having an electrophilic substituent such as an isocyanate group or an epoxy group, or an amide thereof, and a monofunctional or polyfunctional alcohol, amine or thiol; a substitution reaction product of an unsaturated carboxylate having a leaving substituent such as a halogen atom or a tosyloxy group, or an amide thereof, and a monofunctional or polyfunctional alcohol, amine or thiol are also preferably used. Alternatively, monomers and prepolymers, and mixtures and copolymers thereof which are the same as the above except that the aforementioned unsaturated carboxylic acid is replaced with an unsaturated phosphonic acid, styrene, or vinylether may be also used.

Specific examples of the ester monomer of an aliphatic polyhydric alcohol compound and an unsaturated carboxylic acid include acrylates, methacrylates, itaconates, crotonates, isocrotonates, and maleates. Examples of acrylates include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomer.

Examples of the methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconates include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonates include ethylene glycol dicrotonate, tetramethylene glycol dicrotonate, pentaerythritol dicrotonate, and sorbitol tetradicrotonate.

Examples of the isocrotonates include ethylene glycol diisocrotonate, pentaerythritol diisocrotonate, and sorbitol tetraisocrotonate.

Examples of the maleates include ethylene glycol dimaleate, triethylene glycol dimaleate, pentaerythritol dimaleate, and sorbitol tetramaleate.

Examples of other esters include esters made from raw materials including aliphatic alcohol and described in JP-B Nos.46-27926 and 51-47334, and JP-A No. 57-196231, those having an aromatic skeleton and described in JP-A Nos. 59-5240, 59-5241 and 2-226149, those including an amino group and described in JP-A No. 1-165613. Moreover, any of the ester monomers described above may be used as a mixture.

Specific examples of the amide monomer of an aliphatic polyamine compound and an unsaturated carboxylic acid include methylenebis-acrylamide, methylenebis-methacrylamide, 1,6-hexamethylenebis-acrylamide, 1,6-hexamethylenebis-methacrylamide, diethylene triamine trisacrylamide, xylylenebis-acrylamide, and xylylenebis-methacrylamide. Other examples of preferred amide-monomers include those having a cyclohexylene structure and described in JP-B No. 54-21726.

Further, the polymerizable compound in the invention is also preferably an addition-polymerizable urethane compound produced by addition reaction of an isocyanate and a hydroxyl group-containing compound. Typical examples thereof include vinyl urethane compounds described in JP-B No. 48-41708, containing two or more polymerizable vinyl groups in the molecule thereof, and produced by adding a hydroxyl group-containing vinyl monomer represented by the following Formula (5) to a polyisocyanate compound containing two or more isocyanate groups in the molecule thereof.

$$CH_2{=}C(R^4)COOCH_2CH(R^5)OH \qquad \text{Formula (5)}$$

In Formula (5), $R^4$ and $R^5$ each represent H or $CH_3$.

Further, urethane acrylates as described in JP-A No. 51-37193 and JP-B Nos. 2-32293 and 2-16765 and urethane compounds each having an ethylene oxide skeleton as described in JP-B Nos. 58-49860, 56-17654, 62-39417 and 62-39418 may also be suitably used as the polymerizable compound. Furthermore, when any of addition-polymerizable compounds each having an amino structure or a sulfide structure in the molecule thereof described in JP-A Nos. 63-277653, 63-260909 and 1-105238 is used as the polymerizable compound, a photopolymerizable composition that is considerably excellent in photosensitizing speed may be obtained.

Other examples of the polymerizable compound include multifunctional acrylates and methacrylates such as polyester acrylates as described in JP-A No. 48-64183, and JP-B Nos. 49-43191 and 52-30490, epoxy acrylates obtained by reacting an epoxy resin with (meth)acrylic acid. Furthermore, specific unsaturated compounds described in JP-B Nos. 46-43946, 1-40337 and 1-40336, and vinylphosphonic acid compounds described in JP-A No. 2-25493 may also be used as the polymerizable compound. Moreover, in some instances, any of compounds having a structure with a perfluoroalkyl group and described in JP-A No. 61-22048 may be appropriately used. In addition, any of photo-curable monomers and oligomers described in "Nippon Setchaku Kyokai Shi (Journal of Japanese Adhesive Society)", Vol. 20, No. 7, pages 300-308 (1984) may also be used.

Details of these addition-polymerizable compounds, for example, the structure thereof, and the using method thereof such as use of only one of the compounds, use of two or more of them, and the amount(s) of the compound(s), can be arbitrarily determined depending on desired performance of a final planographic printing plate precursor. For example, they are selected from the following viewpoints. From the viewpoint of photosensitizing speed, the addition-polymerizable compound preferably has many unsaturated groups in one molecule, and in many cases, they are preferably bifunctional or more. In order to increase the strength of image portions, i.e. a cured layer, the addition-polymerizable compounds are preferably trifunctional or more. It is also effective for regulating both photosensitivity and strength to combine compounds (e.g. acrylates, methacrylates, styrene compounds, and vinyl ether compounds) having different functionalities and different polymerizable groups. Although the high-molecular compounds or highly hydrophobic compounds have excellent photosensitizing speed and film strength, they may decelerate developing speed and tend to easily precipitate in the developing solution, and are not therefore preferably used in some cases. Selection and use of the addition-polymerizable compound is an important factor for compatibility between the compound and other components (e.g. a binder polymer, an initiator, and a coloring agent) and dispersibility thereof in the photosensitive layer. For example, the compatibility may be improved by using a compound having a low purity or a combination of two or more compounds.

A polymerizable compound having a specific structure may be selected for the purpose of improving adhesiveness between the photosensitive layer, and a support or a protective layer described later.

The content of the addition-polymerizable compound in the radically polymerizable layer (photosensitive layer) composition is preferably in a range of 5 to 80% by mass and more preferably in a range of 40 to 75% by mass with respect to the solid matters in the radically polymerizable layer composition, from the viewpoints of sensitivity, phase separation, adhesiveness of the radically polymerizable layer and a precipitating property of the addition-polymerizable compound with respect to a developing solution.

One of these compounds may be used or two or more of them can be used together. In addition, as for use of the addition-polymerizable compound, the structure, the composition, and the addition amount thereof can be selected, considering the extent of inhibition of polymerization caused by oxygen, resolution and the fogging property, change in refractive index, and surface adhesion. Further, a layer configuration containing an undercoat and/or an overcoat and a coating method of these coatings may also be applied to the planographic printing plate precursor of the invention.

Binder Polymer

The binder polymer is contained in the radically polymerizable layer in order to improve layer properties. Any polymer is used, as long as it has a function of improving layer properties. The binder polymer is preferably that having a repeating unit represented by the following Formula (6). Hereinafter, the binder polymer having a repeating unit represented by Formula (6) is sometimes referred to as a specific binder polymer and will be described in detail.

Formula (6)

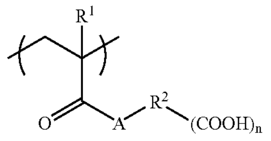

In Formula (6), $R^1$ represents a hydrogen atom or a methyl group; $R^2$ represents a connecting group which includes two or more atoms selected from the group consisting of a carbon atom, a hydrogen atom, an oxygen atom, a nitrogen atom and a sulfur atom and which has 2 to 82 atoms in total; A represents an oxygen atom or —$NR^3$—; $R^3$ represents a hydrogen atom or a monovalent hydrocarbon group having 1 to 10 carbon atoms; and n represents an integer of 1 to 5.

$R^1$ in Formula (6) represents a hydrogen atom or a methyl group, and is more preferably a methyl group.

The connecting group represented by $R^2$ in Formula (6) contains two or more atoms selected from the group consisting of a carbon atom, a hydrogen atom, an oxygen atom, a nitrogen atom, and a sulfur atom. The connecting group has 2 to 82 atoms in total, preferably has 2 to 50 atoms in total, and more preferably has 2 to 30 atoms in total. If the connecting group has at least one substituent, the total number of atoms includes the number of atoms of the substituent(s). More specifically, the number of atoms of the main skeleton of the connecting group represented by $R^2$ is preferably 1 to 30, more prefereably 3 to 25, still more preferably 4 to 20, and most preferably 5 to 10. The term "main skeleton of the connecting group" refers to an atom or an atomic group connecting "A" and the terminal COOH group in Formula (6). In particular, when the connecting group has a plurality of connecting routes, the main skeleton of the connecting group refers to an atom or an atomic group forming the shortest connection between "A" and the terminal COOH group. Accordingly, when the connecting group includes a cyclic structure therein, number of the atoms to be counted may vary depending on the connecting position (e.g., ortho, meta, or para).

Specific examples of the connecting group include substituted or unsubstituted alkylene, substituted or unsubstituted arylene, and groups in which these bivalent groups are connected via at least one amide or ester bond.

Examples of connecting groups having a chain structure include ethylene, and propylene. Connecting groups in which these alkylenes are connected to each other via at least one ester bond is also preferably used.

The connecting group represented by $R^2$ in Formula (6) is preferably a hydrocarbon group having an aliphatic cyclic structure with 3 to 30 carbon atoms and a valence of (N+1). Specific examples of such a compound include hydrocarbon groups having a valence of (N+1) and obtained by removing (n+1) hydrogen atoms each bonding to one of carbon atoms of an alicyclic hydrocarbon compound, such as cyclopropane, cyclopentane, cyclohexane, cycloheptane, cyclooctane, cyclodecane, dicyclohexyl, tercyclohexyl, and norbornane, which may have one or more substituents. In addition, $R^2$ preferably has 3 to 30 carbon atoms which includes carbon atoms of the substituent(s).

One or more carbon atoms of the compound having an aliphatic cyclic structure may optionally be substituted by at least one hetero atom selected from a nitrogen atom, an oxygen atom and a sulfur atom. In view of printing durability, $R^2$ is preferably a hydrocarbon group which has an aliphatic cyclic structure and a valence of (n+1), which may have a substituent, and which has 5 to 30 carbon atoms and includes two or more rings, such as a condensed polycyclic aliphatic hydrocarbon, a crosslinked alicyclic hydrocarbon, a spiro aliphatic hydrocarbon or compounds having aliphatic hydrocarbon rings connected with each other via a bond or a connecting group. Also in this instance, the number of carbon atoms involves the number of carbon atoms included in the substituent(s).

The connecting group represented by $R^2$ is particularly preferably a group containing a main skeleton with 5 to 10 carbon atoms. Such a compound preferably has a chain structure containing an least one ester bond in the structure thereof or the cyclic structure described above.

Examples of the substituent which may be introduced into the connecting group represented by $R^2$ include monovalent nonmetal atomic groups excluding hydrogen, such as halogen atoms (—F, —Br, —Cl and —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy group, a carbamoyloxy group, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, an ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, a carboxyl group and conjugated base groups thereof, alkoxycarbonyl groups, aryloxycarbonyl groups, a carbamoyl group, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—$SO_3H$) and conjugated base groups thereof, alkoxysulfonyl groups, aryloxysulfonyl groups, a sulfinamoyl group, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, a sulfamoyl group, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugated base groups thereof, N-alkylsulfonylsulfamoyl groups (—$SO_2NHSO_2$(alkyl)) and conjugated base groups thereof, N-arylsulfonylsulfamoyl groups (—$SO_2NHSO_2$(aryl)) and conjugated base groups thereof, N-alkylsulfonylcarbamoyl groups (—$CONHSO_2$ (alkyl)) and conjugated base groups thereof, N-arylsulfonylcarbamoyl groups (—$CONHSO_2$(aryl)) and conjugated base groups thereof, alkoxysilyl groups (—Si(Oalkyl)$_3$), aryloxysilyl groups (—Si(Oaryl)3), a hydroxysilyl group (—Si $(OH)_3$) and conjugated base groups thereof, a phosphono group (—$PO_3H_2$) and conjugated base groups thereof, dialkyiphosphono groups (—$PO_3$ (alkyl)$_2$), diarylphosphono groups (—PO3(aryl)$_2$), alkylarylphosphono groups (—$PO_3$ (alkyl)(aryl)), monoalkylphosphono groups (—$PO_3H$(alkyl)) and conjugated base groups thereof, monoarylphosphono groups (—$PO_3H$(aryl)) and conjugated base groups thereof, a phosphonooxy group (—$OO_3H_2$) and conjugated base groups thereof, dialkylphosphonoxy groups (—$OPO_3$ (alkyl) 2), diarylphosphonoxy groups (—$OPO_3$(aryl)$_2$), alkylarylphosphonoxy groups (—OPO3(alkyl)(aryl)), monoalkylphosphonoxy groups (—$OPO_3H$(alkyl)) and conjugated base groups thereof, monoarylphosphonoxy groups (—$OPO_3H$(aryl)) and conjugated base groups thereof, a cyano group, a nitro group, dialkylboryl groups (—B(alkyl) $_2$), diarylboryl groups (—B(aryl)$_2$), alkylarylboryl groups (—B(alkyl)(aryl)), a dihydroxyboryl group (—B$(OH)_2$) and conjugated base groups thereof, alkylhydroxyboryl groups (—B(alkyl)(OH)) and conjugated base groups thereof, arylhydroxyboryl groups (—B(aryl)(OH)) and conjugated base groups thereof, aryl groups, alkenyl groups, and alkynyl groups.

Substituents having at least one hydrogen atom capable of forming a hydrogen bond, particularly, substituents having a smaller acid dissociation constant (pKa) than carboxylic acid are not preferred, because they are likely to reduce printing durability. However, such substituents may be used depending on the design of the photosensitive layer. On the contrary, halogen atoms, hydrophobic substituents such as halogen atoms, hydrocarbon groups (e.g., alkyl groups, aryl groups, alkenyl groups and alkynyl groups), alkoxy groups and aryloxy groups are preferred because they are likely to improve printing durability. In particular, when the cyclic structure is a monocyclic aliphatic hydrocarbon with a ring skeleton having 6 or less atoms, such as cyclopentane or cyclohexane, it preferably has the aforementioned hydrophobic substituent (s). These substituents, or at least one of them and the hydrocarbon group to which the substituent binds form a ring, if possible. In addition, the substituent may have a substituent.

When A in Formula (6) is $NR^3$—, $R^3$ represents a hydrogen atom or a monovalent hydrocarbon group having 1 to 10 carbon atoms. The monovalent hydrocarbon groups having 1 to 10 carbon atoms and represented by $R^3$ include alkyl groups, aryl groups, alkenyl groups, and alkynyl groups.

Typical examples of the alkyl groups include linear, branched, and cyclic alkyl groups having 1 to 10 carbon atoms, such as a methyl group, an ethyl group, a propyl group, a butyl group, a pentyl group, a hexyl group, a heptyl group, an octyl group, a nonyl group, a decyl group, an iso-propyl group, an iso-butyl group, a sec-butyl group, a tert-butyl group, an iso-pentyl group, a neopentyl group, a 1-methylbutyl group, an iso-hexyl group, a 2-ethylhexyl group, a 2-methylhexyl group, a cyclopentyl group, a cyclohexyl group, a 1-adamantyl group, and a 2-norbornyl group.

Typical examples of the aryl groups include aryl groups having 1 to 10 carbon atoms such as a phenyl group, a naphthyl group, and an indenyl group; and hetero aryl groups having 1 to 10 carbon atoms and containing at least one hetero atom selected from the group consisting of a nitrogen atom, an oxygen atom and a sulfur atom, such as a furyl group, a thienyl group, a pyrrolyl group, a pyridyl group, and a quinolyl group.

Typical examples of the alkenyl groups include linear, branched, and cyclic alkenyl groups having 1 to 10 carbon atoms, such as a vinyl group, a 1-propenyl group, a 1-butenyl group, a 1-methyl-1-propenyl group, a 1-cyclopentenyl group, and a 1-cyclohexenyl group.

Typical examples of the alkynyl groups include alkynyl groups having 1 to 10 carbon atoms, such as an ethynyl group, a 1-propynyl group, a 1-butynyl group, and a 1-octynyl group. $R^3$ may have one or more substituent, and examples of the substituent are the same as those of the substituent which can be introduced into $R^2$. However, the total number of carbon atoms of $R^3$ including the number of carbon atoms of the substituent(s) is 1 to 10.

"A" in Formula (6) is preferably an oxygen atom or —NH—, since such a compound is easy to produce.

"n" in Formula (6) is an integer of 1 to 5, and preferably 1 from the viewpoint of printing durability.

Typical examples of the repeating unit represented by Formula (6) are shown below, but the invention is not limited by these examples.

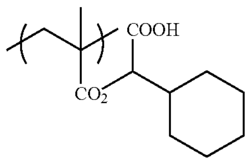

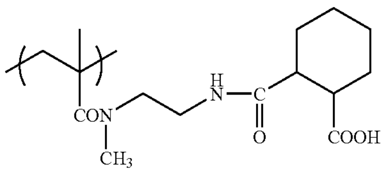

-continued
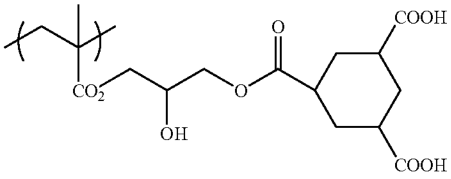
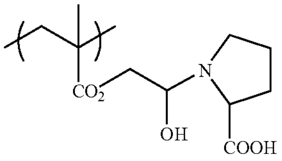
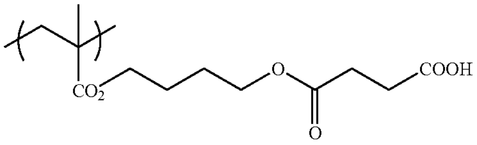
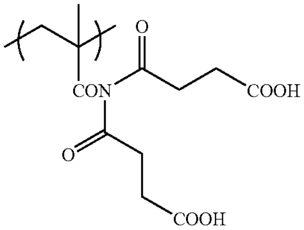
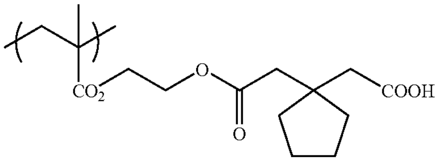
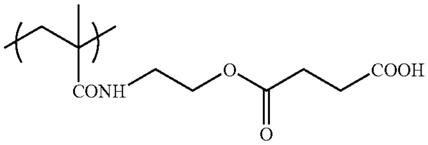
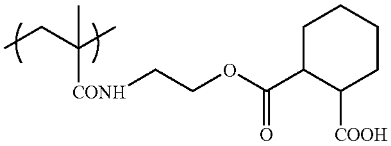
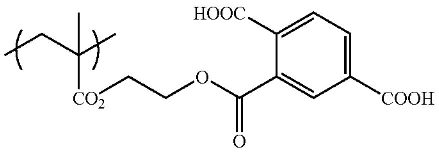
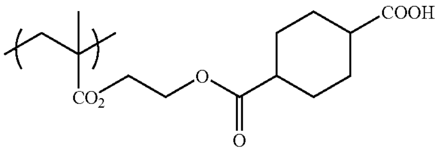
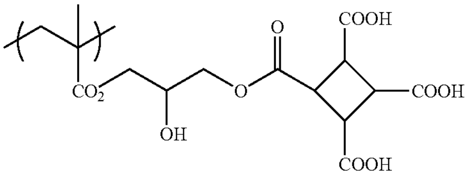
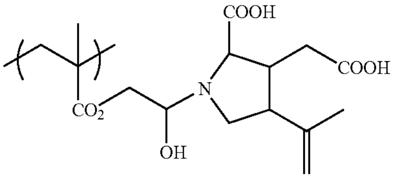
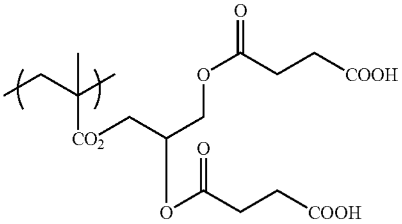
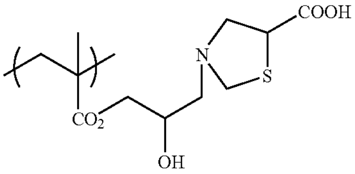
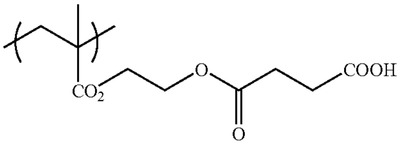
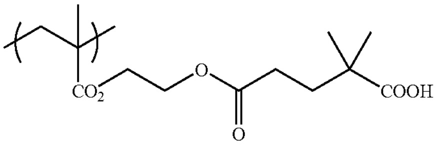
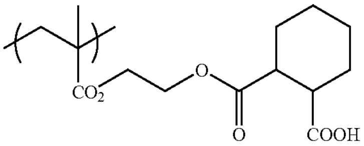
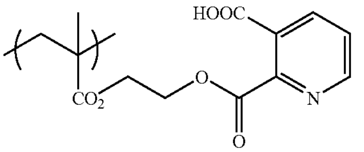
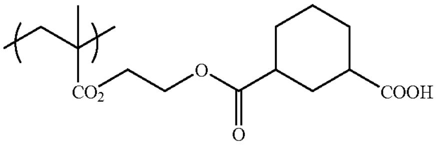

-continued
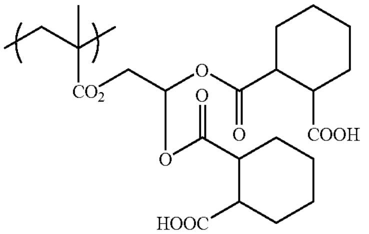
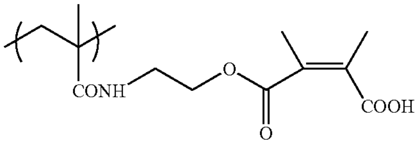
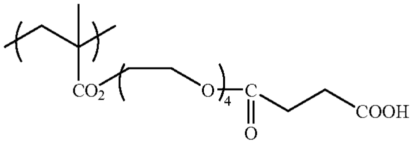
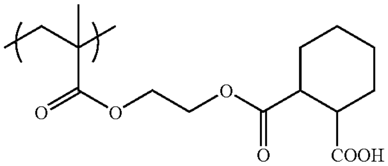
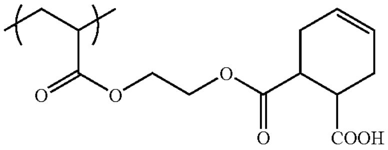
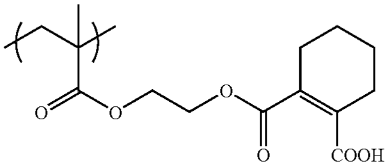
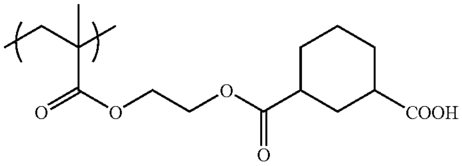
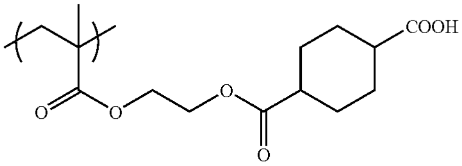
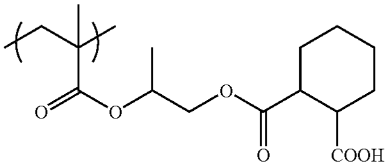
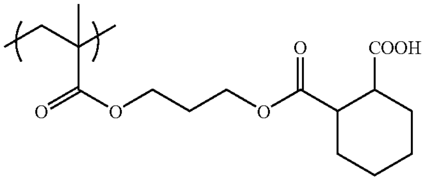
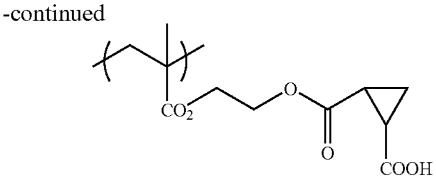
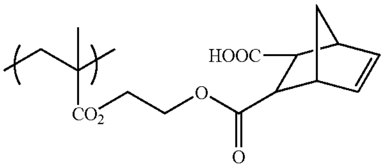
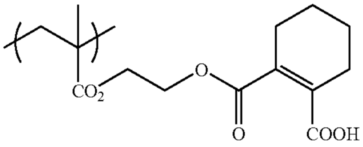
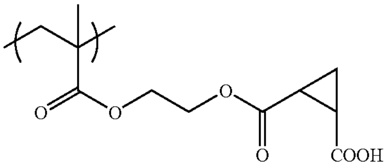
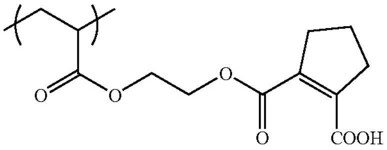
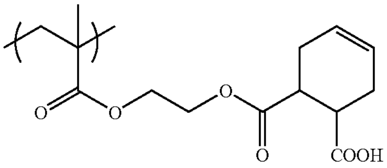
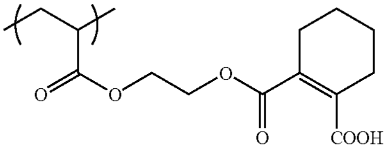
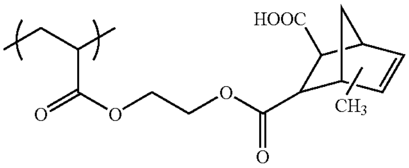
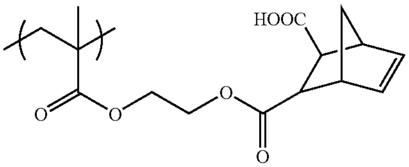
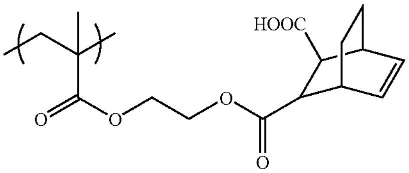

-continued
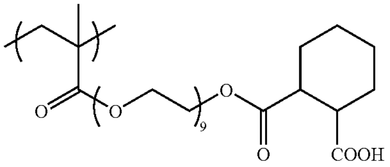
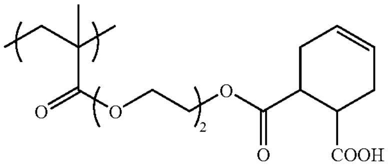
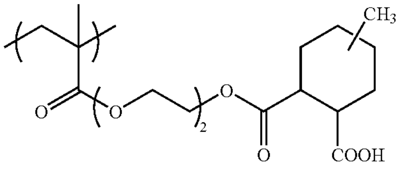
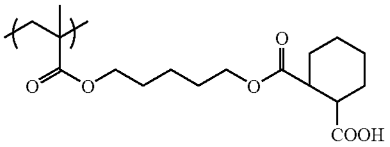
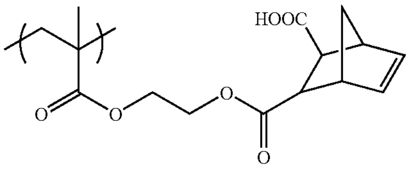
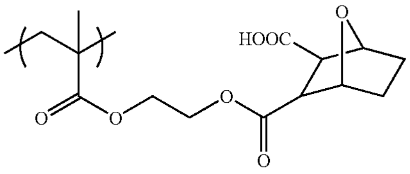
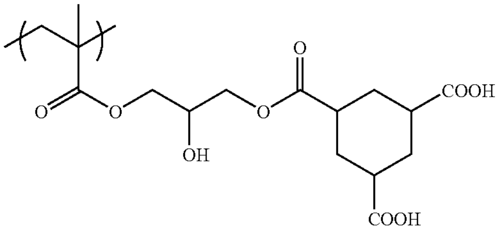
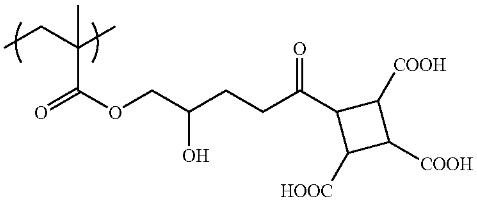
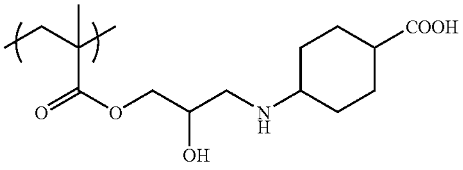
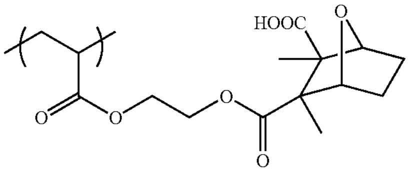
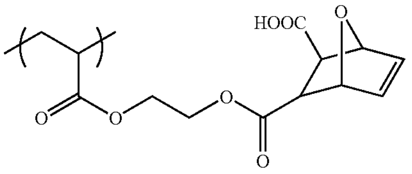
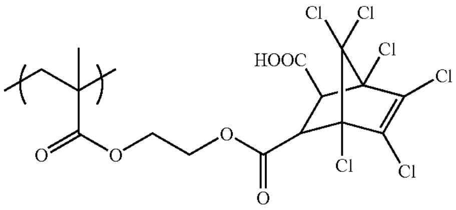
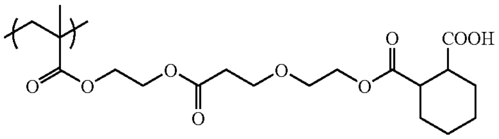
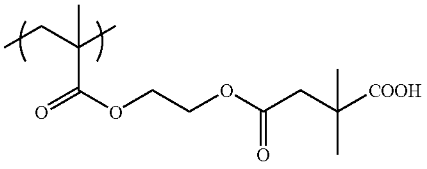
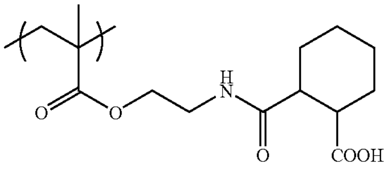
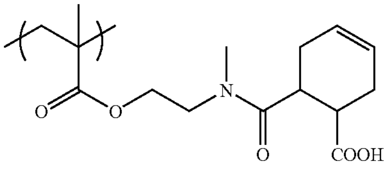
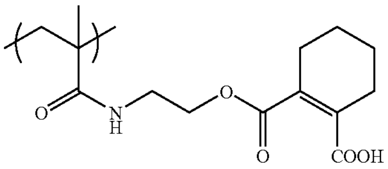
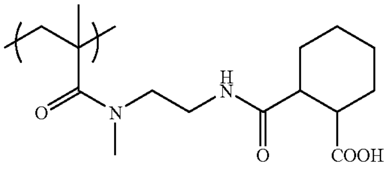

-continued
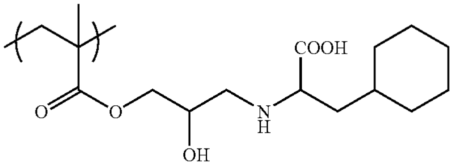
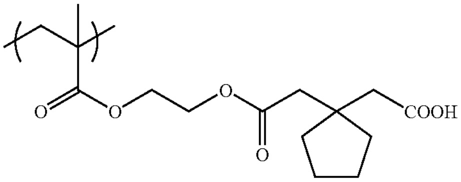
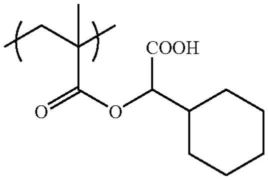
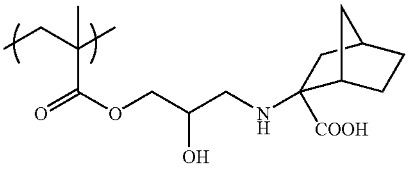
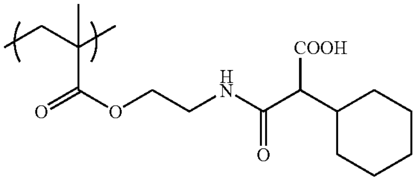
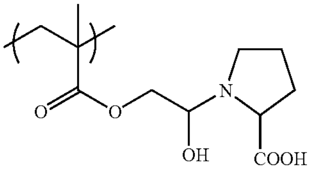
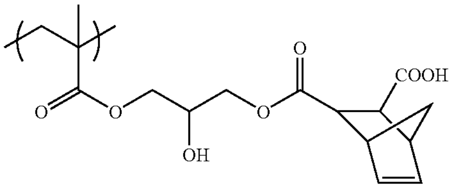
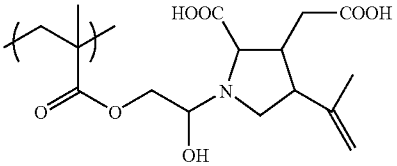
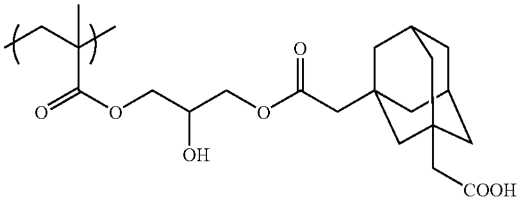
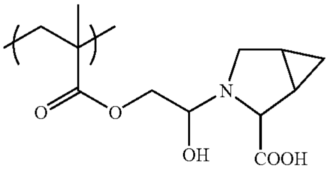
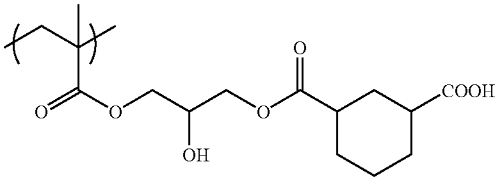
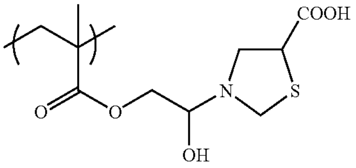
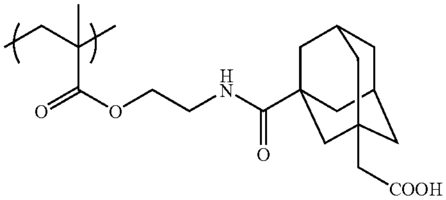
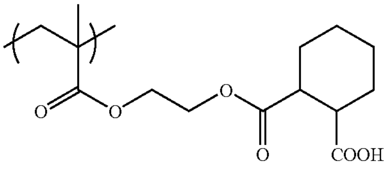
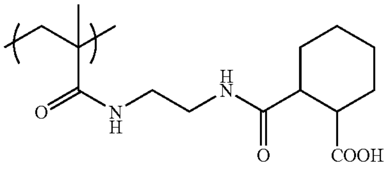
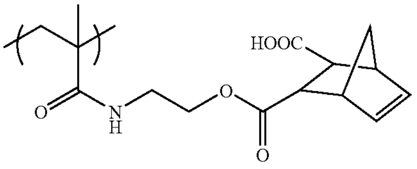
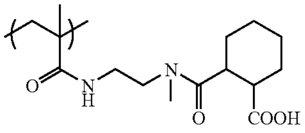
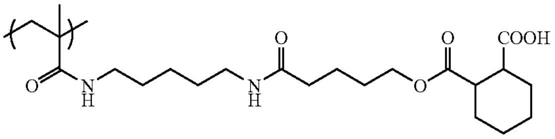

-continued
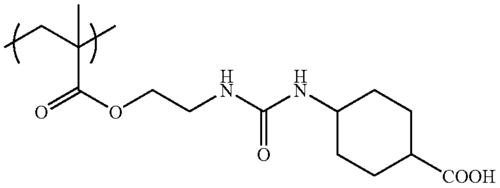
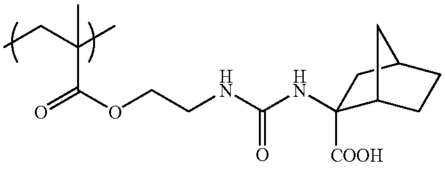
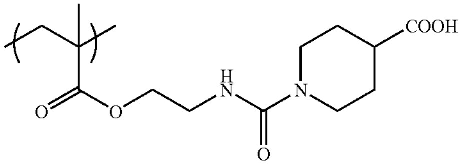
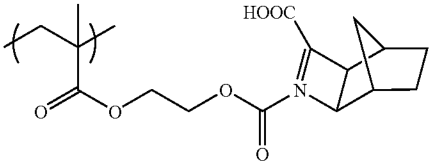
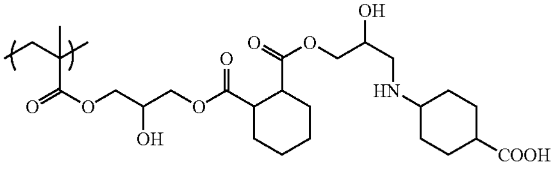
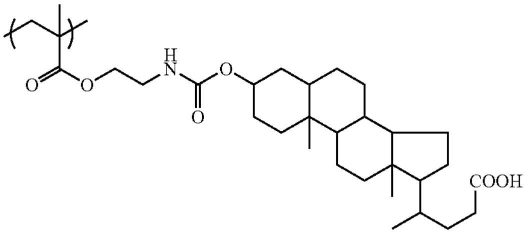
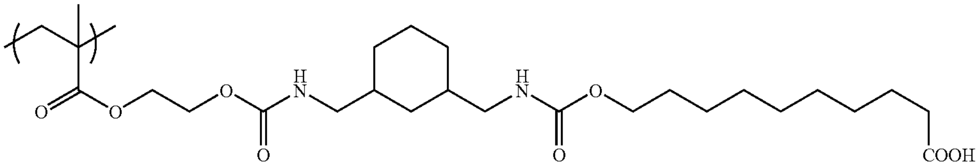
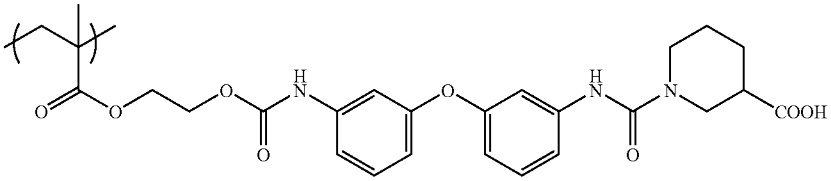
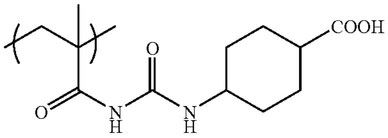
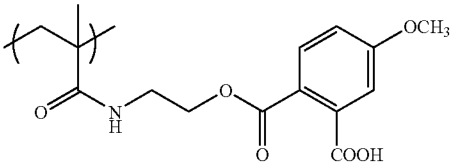
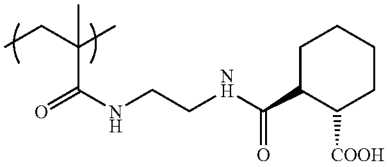
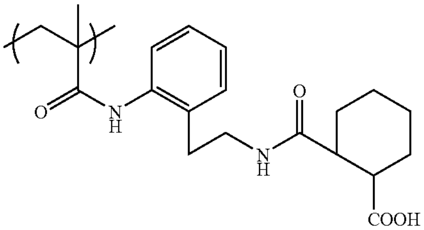
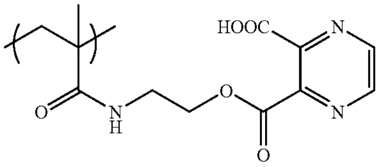
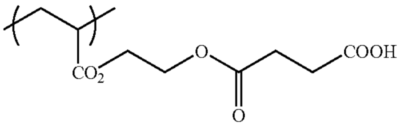
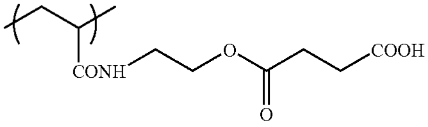
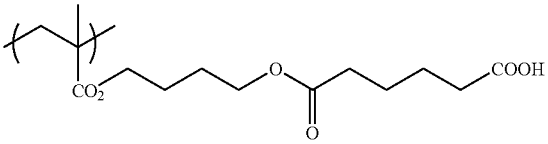

-continued

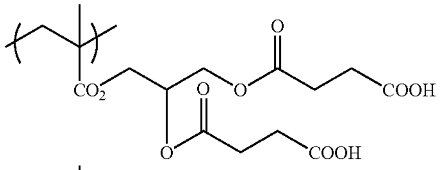

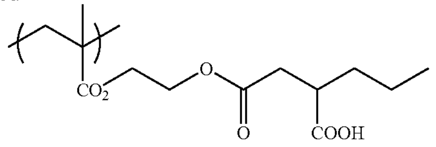

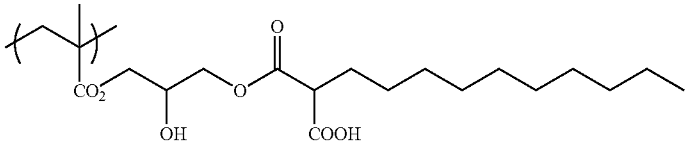

The binder polymer may have one or more repeating units represented by Formula (6). The specific binder polymer used in the invention may be a polymer consisting of the repeating unit represented by Formula (6), but is usually a copolymer having at least one repeating unit represented by Formula (6) and made from raw materials including any other copolymerizable component. A desired total content of the repeating unit represented by Formula (6) in the copolymer is suitably determined from a desired structure of the polymer, and a desired composition for a radically polymerizable layer, but the total content is preferably in a range of 1 to 99 mole %, more preferably 5 to 40 mole %, and still more preferably 15 to 20 mole % with respect to the total mole number of the polymer components.

When the binder polymer is a copolymer, the copolymerizable component to be used may be any conventionally known monomer, insofar as it is a radically polymerizable monomer. Specific examples include monomers described in "Kobunshi Data Handbook (Polymer Data Handbook), Kiso-hen (Fundamental Step) edited by Kobunshi Gakkai (Society of Polymer Science, Japan), published by BAIFUKAN CO., LTD in 1986)". One of the copolymerizable components may be used or two or more of them can be used together.

A desired molecular weight of the specific binder polymer used in the invention is determined suitably, considering the image-forming property and printing durability of the precursor. The molecular weight is preferably in a range of 2,000 to 1,000,000, more preferably in a range of 5,000 to 500,000, and still more preferably in a range of 10,000 to 200,000.

One of the specific binder polymers may be used or at least one specific binder polymer can be used together with any other binder polymer in the invention. Other binder polymer(s) is contained in an amount of 1 to 60% by mass, preferably from 1 to 40% by mass, and still more preferably from 1 to 20% by mass, based on a total mass of the binder polymer(s) used. The binder polymer other than the specific binder polymer can be a conventionally known binder polymer. Specifically, it is preferably a binder having an acrylic main chain, or an urethane binder, which is widely employed in the art.

A desired total content of the specific binder polymer and any other binder polymer in the radically polymerizable layer (photosensitive layer) composition may be appropriately determined, but the total content is usually in a range of 10 to 90% by mass, preferably 20 to 80% by mass, and still more preferably 30 to 70% by mass with respect to the total mass of the nonvolatile components in the radically polymerizable layer composition.

In addition, the acid value (meg/g) of the binder polymer is preferably in a range of 2.00 to 3.60. Other binder polymers used together with specific binder polymer The binder polymer other than the specific binder polymer and usable together with the specific binder polymer is preferably a binder polymer having a radically polymerizable group. The radically polymerizable group is not particularly limited, as long as it is polymerized due to radicals. Examples thereof include α-substituted-methylacryl groups (—OC(═O)—C(—$CH_2$Z)═$CH_2$ wherein Z is a hydrocarbon group with a hetero atom bonding to —$CH_2$ group, acrylic groups, methacrylic groups, allyl groups, and styryl groups. The radically polymerizable group is preferably an acrylic group or a methacrylic group.

The content of the radically polymerizable group(s) in the binder polymer, more specifically, the content of the radically polymerizable unsaturated double bonds determined by iodimetry, is preferably 0.1 to 10.0 mmol, more preferably 1.0 to 7.0 mmol, and most preferably 2.0 to 5.5 mmol per gram of the binder polymer, from the viewpoints of sensitivity and storage stability.

In addition, it is preferable that other binder polymer further has an alkali-soluble group. The content of the alkali-soluble group(s) in the binder polymer, in other words, the acid value of the binder polymer determined by neutralization titration, is preferably 0.1 to 3.0 mmol, more preferably 0.2 to 2.0 mmol, and most preferably 0.45 to 1.0 mmol per gram of the binder polymer, from the viewpoints of precipitation of development scums and printing durability.

The weight-average molecular weight of the binder polymer is preferably in a range of 2,000 to 1,000,000, more preferably in a range of 10,000 to 300,000, and most preferably in a range of 20,000 to 200,000, from the viewpoints of the film-forming property (printing durability) of the binder polymer and the solubility of the binder polymer in a coating solvent.

Further, the glass transition temperature (Tg) of the binder polymer is preferably in a range of 70 to 300° C., more preferably in a range of 80 to 250° C., and most preferably in a range of 90 to 200° C., from the viewpoints of storage stability, printing durability, and sensitivity.

The binder polymer preferably has an amide or imide group in the molecule thereof, and more preferably has a methacrylamide or a methacrylamide derivative, in order to raise the glass transition temperature of the binder polymer.

The photosensitive layer of the planographic printing plate precursor of the invention may contain not only the aforementioned essential components but also any other component which is suitable for the intended use, and the production method, if necessary. Preferred additives will be described below.

Polymerization Inhibitor

It is preferable that the photosensitive layer of the planographic printing plate precursor of the invention contains a small amount of a thermal polymerization inhibitor in order to inhibit undesired thermal polymerization of the compound having a polymerizable ethylenically unsaturated double bond, namely the polymerizable compound. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a primary cerium salt of N-nitrosophenylhydroxylamine.

The amount of the thermal polymerization inhibitor added is preferably about 0.01 to about 5% by mass with respect to the total mass of the nonvolatile components contained in the radically polymerizable layer (photosensitive layer) composition. In order to prevent oxygen from inhibiting the polymerization, the radically polymerizable layer composition may also include a higher fatty acid derivative such as behenic acid or behenic acid amide, which is made to exist mainly at the surface of the layer during drying of the applied coating. The amount of the higher fatty acid derivative added is preferably about 0.5 to about 10% by mass with respect to the mass of the nonvolatile components contained in the radically polymerizable layer composition.

Other Additive

In addition, the radically polymerizable layer may contain any other known additive such as an inorganic filler for improving the physical properties of a cured film, a plasticizer, and a sensitizing agent for improving a property of the radically polymerizable layer surface by which property an ink easily adheres to the layer surface. Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerin. The content of such a plasticizer is generally in a range of 10% by mass or less, relative to the total mass of the binder polymer and the addition-polymerizable compound.

Further, the radically polymerizable layer may contain a UV initiator, and/or a thermal crosslinking agent in order to enhance the effects of heating and exposure of the developed layer and in turn improve the film strength (printing durability) described later.

<Layer Cross-linkable in the Presence of an Acid Catalyst>

The layer cross-linkable in the presence of an acid catalyst contains, as essential components thereof, a compound that, when exposed to light or heated, generates acid (hereinafter, referred to as acid generating agent), and a compound that crosslinks in the presence of the acid serving as a catalyst (hereinafter, referred to as cross-linking agent), and further contains a binder polymer that reacts with the cross-linking agent in the presence of the acid to form a layer containing these compounds.

In this layer cross-linkable in the presence of an acid catalyst, when the layer is irradiated with light or heated, the acid generating agent decomposes to generate acid, which promotes the function of the cross-linking agent. Thereby, firmly crosslinked structures forms between the cross-linking agent molecules or between the cross-linking agent and the binder polymer, making the exposed or heated portions less soluble in an alkaline solution and forming image portions insoluble in a developer.

The layer cross-linkable in the presence of an acid catalyst is a known layer having the same characteristics as those of the above layer. One example of such a layer is a layer made from a radiation-sensitive composition containing a resol resin, a novolak resin, a latent Broenstead acid and an infrared absorbent and described in JP-A No. 7-20629. Herein, the term "latent broenstead acid" means a precursor that generates an acid due to decomposition thereof and has both natures of an acid generating agent defined in the invention and those of an acid cross-linking agent defined in the invention. Broenstead acid is thought to catalyze a matrix forming reaction between the resol resin and the novolak resin. Examples of the Broenstead acids suitable for this purpose include trifluoromethanesulfonic acid and hexafluorophosphonic acid.

Alternatively, an ionic latent Broenstead acid is also preferably used. The ionic latent Broenstead acid can be an onium salt. Examples of the onium salts include iodonium salts, sulfonium salts, phosphonium salts, selenonium salts, diazonium salts, and arsonium salts. Moreover, a nonionic latent Broenstead acid can also be preferably used. Examples thereof include $RCH_2X$, $RCHX_2$, $RCX_3$, $R(CH_2X)_2$ and $R(CH_2X)_3$. X represents Cl, Br, F, $CF_3$ or $SO_3$ and R represents an aromatic group, an aliphatic group or a group obtained by bonding an aromatic group to an aliphatic group.

Furthermore, the layer cross-linkable in the presence of an acid catalyst can also be a recording layer containing a compound cross-linkable in the presence of acid and a high-molecular weight binding agent and described in JP-A 11-95415. The recording layer contains: a compound which can generate an acid when irradiated with an active beam, for example, diazonium salts, phosphonium salts, sulfonium salts, and iodonium salts, organic halogen compounds, ortho-quinone-diazidesulfonyl chloride, and organic metal/organic halogen compounds; and a compound having at least one bond which can crosslink in the presence of the acid generated, for example, an amino compound having at least two of alkoxymethyl groups, a methylol group, and an acetoxymethyl groups as functional groups, aromatic compounds having at least two substituents including an alkoxymethyl group, a methylol group, an acetoxymethyl group as a functional group, a resol resin and a furan resin, and an acrylic resin made from at least one specific monomer.

The layer cross-linkable in the presence of an acid catalyst used in the invention contains an acid generating agent, a cross-linking agent, a binder polymer, and others. Each of these compounds will be separately described below.

Acid Generating Agent

In the layer cross-linkable in the presence of an acid catalyst, the compound that, when irradiated with light or heated, generates an acid (acid generating agent) is a compound that, when irradiated with infrared rays or heated at a temperature of 100° C. or more, decomposes to generate an acid. The acid generated is preferably a strong acid having a pKa of 2 or less such as sulfonic acid, or hydrochloric acid.

Typical examples of the acid generating agent include onium salts such as iodonium salts, sulfonium salts, phosphonium salts and diazonium salts. Specific examples thereof include compounds described in U.S. Pat. No. 4,708,925, and JP-A No. 7-20629. In particular, the acid generating agent is preferably an iodonium salt, a sulfonium salt, or a diazonium salt having a sulfonate ion as a counter ion. Such a diazonium salt is preferably a diazonium compound described in U.S. Pat. No. 3,867,147; a diazonium compound described in U.S. Pat. No. 2,632,703; or a diazo resin described in JP-A Nos. 1-102456 and 1-102457. The acid generating agent is also preferably a benzyl sulfonate described in U.S. Pat Nos. 5,135,838 or 5,200,544. In addition, the acid generating agent is also preferably an active sulfonic ester or a disulfonyl compound described in JP-A Nos. 2-100054, 2-100055, or 9-197671. Further, the acid generating agent is also preferably a haloalkyl-substituted S-triazine described in JP-A No. 7-271029.

One of these compounds may be used or two or more of them can be used together.

In addition, these acid generating agents are contained in the layer cross-linkable in the presence of acid catalyst in an amount of 0.01 to 50% by mass, preferably in an amount of 0.1 to 40% by mass, and more preferably in an amount of 0.5 to 30% mass with respect to the total amount of solid matters in the layer cross-linkable in the presence of acid catalyst in order to improve an image-forming property and to prevent stains on the non-image portion.

Acid Cross-linking Agent

The cross-linking agent for use in the layer cross-linkable in the presence of acid catalyst is not particularly limited, as long as it crosslinks in the presence of acid. However, the cross-linking agent is preferably a phenol derivative represented by the following Formula (7) (hereinafter, referred to as low-molecular weight phenol derivative), a multinuclear phenolic cross-linking agent represented by the following Formula (8) and having in the molecule thereof three or more phenol rings each containing 2 or 3 hydroxymethyl groups in the ring, or a mixture of the low-molecular weight phenol derivative and the multinuclear phenolic cross-linking agent and/or a resol resin.

Formula (7)

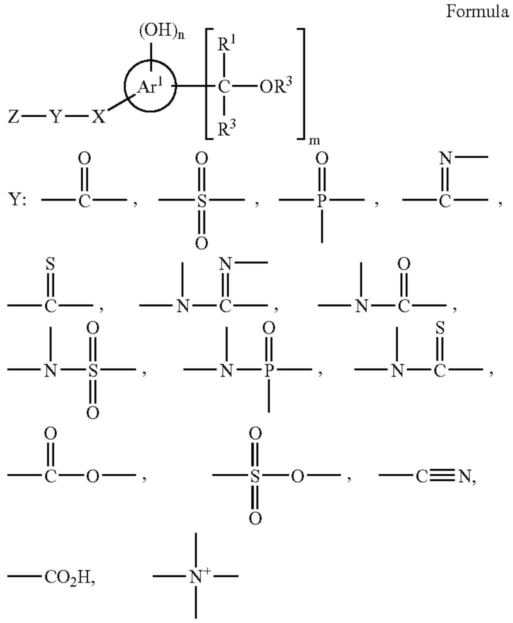

In Formula (7), $Ar^1$ represents an aromatic hydrocarbon ring which may have one or more substituents. $R^1$ and $R^2$ may be the same or different, and each independently represent a hydrogen atom or a hydrocarbon group having 12 or less carbon atoms. $R^3$ represents a hydrogen atom or a hydrocarbon group having 12 or less carbon atoms. m is an integer of 2 to 4. n is an integer of 1 to 3. X represents a bivalent connecting group, Y represents a monovalent to quadrivalent connecting group having a partial structure shown above or a functional group having a hydrogen atom at least one terminal thereof, and Z represents a monovalent to quadrivalent connecting group or a functional group which is present according to the valence of Y. When Y is monovalent, Z does not exist.

Formula (8)

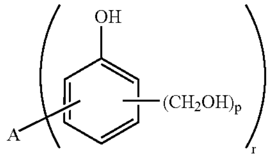

In Formula (8), A represents an r-valent hydrocarbon connecting group having 1 to 20 carbon atoms, r represents an integer of 3 to 20 and p represents an integer of 2 or 3.

The phenol derivative represented by Formula (7) is explained in detail in paragraphs [0098] to [0155] of JP-A No. 11-352210 previously filed by the applicant of this application, and the polynuclear phenolic cross-linking agent represented by Formula (8) and having in the molecular thereof 3 or more phenol rings each containing 2 or 3 hydroxymethyl groups in the ring is explained in detail in paragraphs [0156] to [0165] of JP-A No. 11-1352210.

One of these cross-linking agents may be used or two or more of them can be used together.

In the invention, the cross-linking agent is preferably contained in an amount of 5 to 70% by mass and preferably 10 to 65% by mass with respect to the mass of solid matters in the layer cross-linkable in the presence of an acid catalyst, from the viewpoints of layer strength and storage stability.

Binder Polymer

A binder polymer that can be used in the layer cross-linkable in the presence of an acid catalyst can be a polymer having, in a side chain or the main chain thereof, an aromatic hydrocarbon ring to which a hydroxyl group or an alkoxy group directly bond. The alkoxy group preferably has 20 or less carbon atoms from the viewpoint of sensitivity. The aromatic hydrocarbon ring is preferably a benzene ring, a naphthalene ring or an anthracene ring from the viewpoint of availability of raw material. The aromatic hydrocarbon ring may have a substituent other than a hydroxyl group and an alkoxy group, such as a halogen atom, or a cyano group. However, it is preferable that the aromatic hydrocarbon ring does not have a substituent other than a hydroxyl group and an alkoxy group in terms of sensitivity.

In addition, the binder polymer is preferably a polymer having a structural unit represented by Formula (9), or a phenol resin such as a novolak resin.

Formula (9)

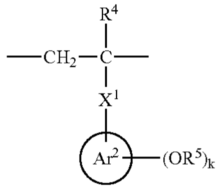

In Formula (9), $Ar^2$ represents a benzene ring, a naphthalene ring or an anthracene ring, $R^4$ represents a hydrogen atom or a methyl group, $R^5$ represents a hydrogen atom or an alkoxy group having 20 or less carbon atoms, $X^1$ represents a single bond or a divalent connecting group containing one or more atoms selected from the group consisting of C, H, N, O and S, and having 0 to 20 carbon atoms, and k represents an integer of 1 to 4.

In the invention, the binder polymer may be a homopolymer containing only the structural unit represented by Formula (9), or a copolymer having this specific structural unit and a structural unit derived from any other known monomer.

The content of the structural unit represented by Formula (9) in the copolymer is preferably 50 to 100% by mass and more preferably 60 to 100% by mass.

In addition, the weight-average molecular weight of the polymer used in the invention is preferably 5,000 or more and more preferably in a range of 10,000 to 300,000, whereas the number-average molecular weight thereof is preferably 1,000 or more and more preferably in a range of 2,000 to 250,000. The degree of polydispersion (weight-average molecular weight/number-average molecular weight) is preferably 1 or more and more preferably in a range of 1.1 to 10.

The polymer may be a random, block, or graft polymer, but is preferably a random polymer.

Next, the novolaks will be described. Examples of the novolak resin suitably used in the invention include phenol novolaks, o-, m- and p-cresol novolaks and copolymers thereof, and novolaks made from raw materials including a phenol derivative having as a substituent a halogen atom, and/or an alkyl group.

The weight-average molecular weight of the novolak resin is preferably 1,000 or more, and more preferably from 2,000 to 20,000, and the number-average molecular weight thereof is preferably 1,000 or more, and more preferably from 2,000 to 15,000. The degree of polydispersion is preferably 1 or more, and more preferably from 1.1 to 10.

The binder polymer is also preferably a polymer having a heterocyclic ring that has an unsaturated bond in the ring.

The heterocyclic ring means a ring containing, as the atoms of the ring, one or more heteroatoms other than carbon. The heteroatom is preferably a nitrogen atom, an oxygen atom, a sulfur atom or a silicon atom. It is thought that use of a polymer having such a heterocyclic group, which polymer includes a lone pair existing in the heterocyclic ring, tends to easily react due to the chemical structure thereof to thereby form a film having excellent printing durability.

One of these binder polymers described above may be used or two or more of them can be used together.

In addition, the binder polymer is preferably contained in an amount of 20 to 95% by mass, and preferably in an amount of 40 to 90% by mass with respect to the total amount of solid matters in the layer cross-linkable in the presence of acid catalyst, from the viewpoints of the strength of an image portion and an image-forming property.

Various additives including a surfactant may be contained in the layer cross-linkable in the presence of an acid catalyst in order to improve a coating property and film quality.

Hereinafter, the interaction-releasing (heat-sensitive positive) layer and a layer decomposable in the presence of an acid catalyst, which are preferable as the positive-type photosensitive layer, will be described separately.

<Interaction-releasing (Heat-sensitive Positive) Layer>

The interaction-releasing layer contains a known water-insoluble and alkali-soluble resin and the infrared ray absorbent described above.

Water-insoluble and Alkali-soluble Resin

Examples of the water-insoluble and alkali-soluble resin used in the interaction-releasing layer (hereinafter, referred to as alkali-soluble resin) include homopolymers and copolymers containing an acidic group in the main and/or side chains of the polymer, and mixtures thereof.

The alkali-soluble resin is preferably a resin having, in the main and/or side chains of the polymer, an acidic group represented by the following Formulae (1) to (6), from the viewpoints of solubility thereof in an alkaline developing solution and exhibition of dissolution-suppressing ability.

(1) Phenolic hydroxyl groups (—Ar—OH)

(2) Sulfonamide groups (—$SO_2$NH—R)

(3) Substituted sulfonamide acidic groups (hereinafter referred to as "active imide group") (—$SO_2$NHCOR, —$SO_2$NH$SO_2$R and —CONH$SO_2$R)

(4) Carboxylate group (—$CO_2$H)

(5) Sulfonate group (—$SO_3$H)

(6) Phosphate group (—$OPO_3H_2$)

In the above groups (1) to (6), Ar represents a divalent aryl connecting group which may have a substituent and R represents a hydrogen atom or a hydrocarbon group which may have a substituent.

The alkali-soluble polymer is more preferably an alkali-soluble resin having a phenolic hydroxyl group (1), a sulfonamide group (2) or an active imide group (3). The alkali-soluble polymer is most preferably an alkali-soluble resin having a phenolic hydroxyl group (1) or a sulfonamide group (2) in order to secure sufficient solubility thereof in an alkaline developing solution, sufficient development latitude and sufficient layer strength.

Examples of the alkali-soluble resins having an acidic group selected from the groups represented by Formulae (1) to (6) include the following.

Examples of the alkali-soluble resins having a phenolic hydroxyl group (1) include novolak resins such as condensation polymers of phenol and formaldehyde, condensation polymers of m-cresol and formaldehyde, condensation polymers of p-cresol and formaldehyde, condensation polymers of m-cresol, p-cresol and formaldehyde, and condensation polymers of phenol, or m-cresol, p-cresol, or a mixture thereof, and formaldehyde; and condensation polymers of pyrogallol and acetone. The alkali-soluble resin having a phenolic hydroxyl group can also be a copolymer made from raw materials including a compound having a phenolic hydroxyl group in the side chain thereof or in the main chain.

Examples of the compound having a phenolic hydroxyl group include acrylamide, methacrylamide, acrylate, and methacrylate having a phenolic hydroxyl group, and hydroxystyrene.

Examples of the alkali-soluble resin having a sulfonamide group (2) include polymers having, as the main structural component thereof, a minimal structural unit derived from a compound having a sulfonamide group. The compound described above can be a compound having one or more sulfonamide groups in which at least one hydrogen atom bonds to the nitrogen atom thereof, and having one or more polymerizable unsaturated groups in the molecule thereof. The alkali-soluble resin having a sulfonamide group is preferably a low-molecular-weight compound having an acryloyl, allyl, or vinyloxy group, and a substituted or monosubstituted aminosulfonyl or substituted sulfonylimino group in the molecule thereof, and typical examples thereof include compounds represented by the following Formulae (i) to (v).

(i)

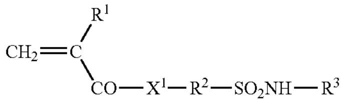

(ii)

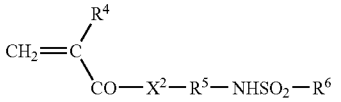

(iii)

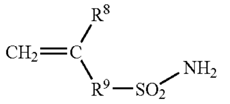

(iv)

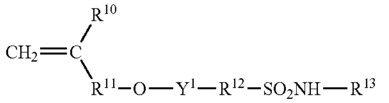

(v)

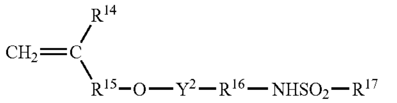

In Formulae (i) to (v), $X^1$ and $X^2$ each independently represent —O— or —$NR^7$. $R^1$ and $R^4$ each independently represent a hydrogen atom or —$CH_3$. $R^2$, $R^5$, $R^9$, $R^{12}$, and $R^{16}$ each independently represent an alkylene group, a cycloalkylene group, an arylene group, or an aralkylene group which has 1 to 12 carbon atoms and which may have one or more substituents. $R^3$, $R^7$, and $R^{13}$ each independently represent a hydrogen atom or an alkyl group, a cycloalkyl group, an aryl group, or an aralkyl group which has 1 to 12 carbon atoms and which may have one or more substituents. In addition, $R^6$ and $R^{17}$ each independently represent an alkyl group, a cycloalkyl group, an aryl group, or an aralkyl which has 1 to 12 carbon atoms and which may have one or more substituents. $R^8$, $R^{10}$, and $R^{14}$ each independently represent a hydrogen atom or —$CH_3$. $R^{11}$ and $R^{15}$ each independently represent a single bond or an alkylene group, a cycloalkylene group, an arylene group, or an aralkylene group which has 1 to 12 carbon atoms and which may have one or more substituents. $Y^1$ and $Y^2$ each independently represent a single bond or —CO—.

The alkali-soluble resin having a sulfonamide group used in the interaction-releasing layer is more preferably m-aminosulfonylphenyl methacrylate, N-(p-aminosulfonylphenyl) methacrylamide, or N-(p-aminosulfonylphenyl)acrylamide.

Examples of the alkali-soluble resin having an active imide group (3) include polymers having, as the main structural component thereof, a minimum structural unit derived from a compound having an active imide group. Examples of such a compound include compounds having one or more active imide groups represented by the following structural formula and one or more polymerizable unsaturated group in the molecule thereof.

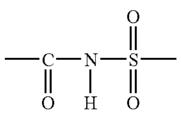

Specifically, N-(p-toluenesulfonyl)methacrylamide, or N-(p-toluenesulfonyl)acrylamide is preferably used.

Examples of the alkali-soluble resin having a carboxylic acid group (4) include polymers having, as the main structural component thereof, a minimum structural unit derived from a compound having one or more carboxylate groups and one or more polymerizable unsaturated groups in the molecule thereof.

Examples of the alkali-soluble resin having a sulfonate group (5) include polymers having, as the main structural component thereof, a minimum structural unit derived from a compound having one or more sulfonate groups and one or more polymerizable unsaturated groups in the molecule thereof.

Examples of the alkali-soluble resin having a phosphate group (6) include polymers having, as the main structural component thereof, a minimum structural unit derived from a compound having one or more phosphate groups and one or more polymerizable unsaturated groups in the molecule thereof.

The alkali-soluble resin used in the interaction-releasing layer may have one kind of minimum structural unit having an acidic group selected from the above-described groups (1) to (6), or the alkali-soluble resin may be a copolymer obtained by polymerizing two or more minimum structural units having the same acidic group or two or more minimum structural units having different acidic groups.

The above copolymer is preferably made from raw materials having a compound with an acidic group selected from the above groups (1) to (6) in an amount of 10% by mole or more and is more preferably made from raw materials having a compound with an acidic group selected from the above groups (1) to (6) in an amount of 20% by mole or more. If the amount of the compound is less than 10% by mole, developing latitude tends to be insufficiently improved.

In the invention, when the alkali-soluble resin is a copolymer, at least one compound other than the above acidic groups (1) to (6) may be used as a compound to be copolymerized. Examples of such a compound include, but are not limited to, compounds given in the following (m1) to (m12).

(m1) Acrylates and methacrylates having an aliphatic hydroxyl group such as 2-hydroxyethyl acrylate or 2-hydroxyethyl methacrylate (m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate or glycidyl acrylate (m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate or glycidyl methacrylate (m4) Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide (m5) Vinyl ethers such as ethyl vinyl ether, 2-chloroethyl vinyl ether, hydroxyethyl vinyl ether, propyl vinyl ether, butyl vinyl ether, octyl vinyl ether or phenyl vinyl ether (m6) Vinyl esters such as vinyl acetate, vinyl chloroacetate, vinyl butyrate or vinyl benzoate (m7) Styrenes such as styrene, a-methylstyrene, methylstyrene or chloromethylstyrene (m8) Vinyl ketones such as methyl vinyl ketone, ethyl vinyl ketone, propyl vinyl ketone or phenyl vinyl ketone (m9) Olefins such as ethylene, propylene, isobutylene, butadiene or isoprene (m10) N-vinylpyrrolidone, acrylonitrile or methacrylonitrile (m11) Unsaturated imides such as maleimide, N-acryloylacrylamide, N-acetylmethacrylamide, N-propionylmethacrylamide or N-(p-chlorobenzoyl)methacrylamide (m12) Unsaturated carboxylic acids such as acrylic acid, methacrylic acid, maleic acid anhydride or itaconic acid The alkali-soluble resin preferably has a phenolic hydroxyl group in view of excellent image forming ability due to exposure to, for example, infrared laser light. Typical examples of such an alkali-soluble resin include novolak resins such as phenol-formaldehyde resins, m-cresol-formaldehyde resins, p-cresol-formaldehyde resins, m-cresol-p-cresol-formaldehyde resins and phenol-cresol (which may be any of m-, p- or m-/p-mixed type)-formaldehyde resins; and pyrogallol-acetone resins.

Other examples of the alkali-soluble resin having a phenolic hydroxyl group include condensation polymers of phenol having as a substituent an alkyl group having 3 to 8 carbon atoms and a formaldehyde such as t-butylphenol-formaldehyde resins and octylphenol-formaldehyde resins as described in U.S. Pat. No. 4,123,279.

The weight-average molecular weight of the alkali-soluble resin is preferably 500 or more, and more preferably 1,000 to 700,000, from the viewpoint of an image-forming property. In addition, the number-average molecular weight thereof is preferably 500 or more and more preferably 750 to 650,000. The degree of polydispersion (weight-average molecular weight/number-average molecular weight) is preferably 1.1 to 10.

One of these alkali-soluble resins may be used or two or more of them can be used together. When two or more alkali-soluble resins are used together, a condensation polymer of phenol having as a substituent an alkyl group having 3 to 8 carbon atoms and formaldehyde such as a condensation polymer of t-butylphenol and formaldehyde and a condensation polymer of octylphenol and formaldehyde as described in U.S. Pat. No. 4,123,279, and an alkali-soluble resin having a phenol structure containing an electron-attractive group on an aromatic ring as described in JP-A No. 2000-241972 which was previously proposed by the inventor of the invention may be combined.

The total content of the alkali-soluble resin(s) in the interaction-releasing layer is preferably 30 to 98% by mass and more preferably 40 to 95% by mass with respect to the total content of solid matters in the interaction-releasing layer, from the viewpoints of durability, sensitivity, and an image-forming property.

<Layer Decomposable in the Presence of Acid Catalyst>

The layer decomposable in the presence of acid catalyst (chemical amplification layer) is preferably formed on a surface of the precursor which surface is exposed, and contains as the essential components thereof a compound that, when exposed to light or heated, generates acid (acid generating agent), and a compound that cleaves its chemical bond in the presence the acid serving as a catalyst to increase its solubility in an alkaline developing solution (compound decomposable in the presence of acid).

The layer decomposable in the presence of acid catalyst may contain additionally a polymer compound serving as a binder component for forming a layer, and the compound decomposable in the presence of acid described below may be a polymer compound or a precursor thereof that functions as the binder component. Compound decomposable in the presence of acid In the layer decomposable in the presence of acid, the compound that cleaves its chemical bond in the presence of acid serving as a catalyst to increase its solubility in an alkaline developing solution may be a compound having in the molecule thereof a binding group decomposable in the presence of acid. Such a compound can be a "compound (b) containing at least one bond decomposable in the presence of acid" described in JP-A No. 9-171254. The bond decomposable in the presence of acid is preferably $-(CH_2CH_2O)_n-$ group. N is an integer of 2 to 5.

A compound represented by the following Formula (vi) is preferably used as such a compound from the viewpoints of sensitivity and a developing property.

Formula (vi)

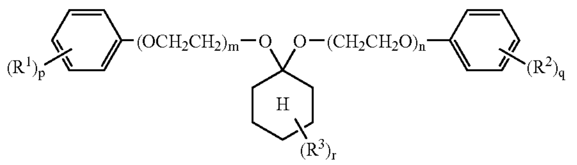

In Formula (vi), $R^1$, $R^2$ and $R^3$ each represent a hydrogen atom, an alkyl group having 1 to 5 carbon atoms, an alkoxy group having 1 to 5 carbon atoms, a sulfo group, a carboxyl group or a hydroxyl group; p, q and r each represent an integer of 1 to 3; and m and n each represent an integer of 1 to 5.

In Formula (vi), the alkyl group represented by $R^1$, $R^2$ or $R^3$ may be linear or branched, and examples thereof include a methyl group, an ethyl group, a propyl group, an iso-propyl group, a butyl group, a tert-butyl group, and a pentyl group. Examples of the alkoxy group include a methoxy group, an ethoxy group, a propoxy group, an iso-propoxy group, a butoxy group, a tert-butoxy group, and a pentoxy group. Examples of the sulfo group and carboxyl group include the salts thereof. In the compound represented by Formula (vi), it is preferable that m and n be 1 or 2. In addition, the compound represented by Formula (vi) can be produced by any known method.

Other examples of the compound decomposable in the presence of acid usable in the invention include compounds having a C—O—C bond and described in JP-A Nos. 48-89603, 51-120714, 53-133429, 55-12995, 55-126236, and 56-17345; compounds having a Si—O—C bond and described in JP-A Nos. 60-37549 and 60-121446; compounds decomposable in the presence of acid described in JP-A Nos. 60-3625 and 60-10247; compounds having a Si—N bond and described in JP-A No. 62-222246; carbonic acid esters described in JP-A No. 62-251743; orthocarbonic acid esters described in JP-A No. 62-209451; orthotitanic acid esters described in JP-A No. 62-280841; orthosilicic acid esters described in JP-A No. 62-280842; acetals, ketals, and orthocarboxylic acid esters described in JP-A Nos. 63-010153, 9-171254, 10-55067, 10-111564, 10-87733, 10-153853, 10-228102, 10-268507, 10-282648, and 10-282670, and EP-0884547A1; and compounds having a C—S bond and described in JP-A No. 62-244038.

Among the compounds decomposable in the presence of acid described above, any of compounds each having a C—O—C bond, compounds each having a Si—O—C bond, orthocarbonic acid esters, acetals, ketals and silyl ethers described in JP-A Nos. 53-133429, 56-17345, 60-121446, 60-37549, 62-209451, 63-010153, 9-171254, 10-55067, 10-111564, 10-87733, 10-153853, 10-228102, 10-268507, 10-282648, 10-282670 and EP No. 0884647A1 is preferably used.

Among these compounds decomposable in the presence of acid, a polymer compound which has acetal or ketal portions in a repeated manner in the main chain thereof and solubility of which in an alkali developing solution is increased by the acid generated.

One of these compounds decomposable in the presence of acid may be used or two or more of them can be used together.

The amount thereof is preferably from 5 to 70% by mass, preferably from 10 to 50% by mass and more preferably from 15 to 35% by mass relative to the total amount of solid matters in the layer decomposable in the presence of an acid catalyst from the viewpoints of prevention of stains in a non-image portion and film strength. Other additives used in interaction-releasing layer and layer decomposable in the presence of acid The interaction-releasing and the layer decomposable in the presence of acid described above may contain a material that can be thermally decomposable and that substantially decreases the solubility of the alkali-soluble resin in a non-decomposed state, such as an onium salt, an o-quinone diazide compound, an aromatic sulfone compound, or an aromatic sulfonate compound. Addition of the compound is preferable for improvement in a property of prohibiting image portions from being dissolved in a developing solution. Examples of the onium salt include diazonium salts, ammonium salts, phosphonium salts, iodonium salts, sulfonium salts, selenonium salts, and arsonium salts. The onium salt is preferably contained in an amount of 1 to 50% by mass, more preferably 5 to 30% by mass, and still more preferably 10 to 30% by mass with respect to the total solid matters in the layer.

In addition, a cyclic acid anhydride, phenol or a derivative thereof, or an organic acid may also be contained in these layers in order to improve sensitivity.

The content of the cyclic acid anhydride, phenol and the derivative thereof, and the organic acid in each layer is 0.05 to 20% by mass, more preferably 0.1 to 15% by mass, and more preferably 0.1 to 10% by mass.

In addition, the above layers can also contain an epoxy compound, a vinyl ether, a phenol compound having a hydroxymethyl group and a phenol compound having an alkoxymethyl group which are described in JP-A No. 8-276558, and/or a crosslinking compound having an alkali-dissolution suppressing function and described in JP-A No. 11-160860.

In addition, in order to stabilize treatment regardless of development conditions, both the negative-type and positive type photosensitive layers may contain a non-ionic surfactant as described in JP-A Nos. 62-251740 and 3-208514, and/or an amphoteric surfactant as described in JP-A Nos. 59-121044 and 4-13149.

In addition, both the negative-type and positive-type photosensitive layers may contain a printing-out agent used to obtain a visible image immediately after heating due to exposure and/or a dye or pigment as an image-coloring agent.

Further, these layers contain a plasticizer for providing a coated layer with flexibility, if necessary. Examples thereof include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

Support

Any known support used for planographic printing plate precursors may be used as the support in the invention.

The support is preferably a plate-shaped substrate having dimensional stability, and examples thereof include paper; paper on which a plastic resin (e.g., polyethylene, polypropylene, or polystyrene.) is laminated; metal plates (e.g., an aluminum, zinc, or copper plate); plastic films (e.g., a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinylacetal film); paper and plastic films on which any of the metals described above is laminated or vapor-deposited. The surface of the support may be physically or chemically processed by a known method in order to improve hydrophilicity and strength, if necessary.

The substrate is preferably paper, a polyester film, or an aluminium plate, and more preferably an aluminium plate, which is superior in dimensional stability and relatively cheap, and whose surface can be provided with superior hydrophilicity and strength due to a surface treatment, which is carried out according to needs. In addition, the support is also preferably a composite sheet in which an aluminum sheet is laminated on a polyethylene terephthalate film, such as those disclosed in JP-B No. 48-18327.

The aluminum plate is a metal plate containing aluminum, which has dimensional stability, as the primary component thereof, and examples thereof include a pure aluminum plate, an alloy plate containing aluminum as the primary component and a trace amount of element(s) other than aluminum, and plastic films and paper on which aluminum or an aluminum alloy is laminated or vapor-deposited. In the description below, both a support made of aluminum or an aluminum alloy described above is called an aluminum support. Examples of elements other than aluminum which may be contained in the aluminum alloy include silicon, iron, manganese, copper, magnesium, chromium, zinc, bismuth, nickel, and titanium. The content of such an element or elements in the alloy is 10% by mass or less. The support in the invention is most preferably a pure aluminium support. However, it is difficult to prepare completely pure aluminium because of problems regarding a purifying process. Therefore, the aluminum plate may contain a trace amount of elements other than aluminum. As described above, the composition of the aluminium plate to be used in the invention is not particularly limited, and any of aluminium plates which are known and used in the art, for example, those satisfying requirements stipulated in JIS A1050, A1100, A3103, or A3005, may be appropriately used.

The thickness of the aluminum support for use in the invention is about 0.1 mm to about 0.6 mm. The thickness may be suitably changed according to the size of printing machine, the dimension of printing plate, and needs by users. The surface of the aluminum support used in the invention may be subjected to treatment described later, if necessary.

Surface Roughening Treatment

The surface of the aluminum support may be roughened. Examples of a method for roughening a surface include mechanical surface roughening, chemical etching, and electrolytic graining disclosed in JP-A No. 56-28893; an electrochemical surface roughening method of electrochemically roughening a surface in a hydrochloric acid or nitric acid electrolyte; and a mechanical surface roughening method such as a wire brush graining method of scratching an aluminum surface with a metal wire, a ball graining method of roughening an aluminum surface with a polishing ball and an abrasive, a brush graining method of roughening a surface with a nylon brush and an abrasive. One of these roughening methods or a combination of two or more of them can be conducted. The surface roughening method is preferably an electrochemical method of chemically roughening a surface in a hydrochloric or nitric acid electrolyte. The suitable amount of electric current is in a range of 50 to 400 $C/dm^2$, when the support serves as an anode. More specifically, alternate and/or direct current electrolysis is preferably carried out in an electrolyte having a hydrochloric or nitric acid content of 0.1 to 50% at a temperature in a range of 20 to 80° C. at an electric current density of 100 to 400 $C/dm^2$ for one second to 30 minutes.

The aluminum support whose surface has been roughened may be chemically etched in an acid or alkaline solution. Typical examples of an etching agent include sodium hydroxide, sodium carbonate, sodium aluminate, sodium metasilicate, sodium phosphate, potassium hydroxide, and lithium hydroxide. The concentration and the temperature of the etching agent are 1 to 50%, and 20 to 100 ° C., respectively. In order to remove stains remaining on the etched surface (smuts), the support is washed with acid. Typical examples of the acid include nitric acid, sulfuric acid, phosphoric acid, chromic acid, hydrofluoric acid, and borofluoric acid. A method for removing smuts on a surface electrochemically roughened is preferably a method described in JP-A No. 53-12739 in which a surface is brought into contact with 15 to 65% by mass of sulfuric acid at a temperature in a range of 50 to 90° C., and a method described in JP-B 48-28123 in which a surface is etched with alkali. The method and conditions are not particularly limited, as long as the surface roughness of the roughened surface Ra is about 0.2 to 0.5 μm.

Anodizing Treatment

The aluminum support which has been treated above and has an oxide layer thereon is then anodized.

In the anodizing treatment, one or more of aqueous solutions of sulfuric acid, phosphoric acid, oxalic acid, and boric acid/sodium borate are used as the main component of an electrolytic solution. The electrolyte solution may contain other components commonly found in aluminum alloy plates, electrodes, tap water, and underground water. The electrolyte solution may also contain a second component and may further contain a third component. Examples of the second and third components include cations including metal ions such as Na, K, Mg, Li, Ca, Ti, Al, V, Cr, Mn, Fe, Co, Ni, Cu, and Zn, and an ammonium ion; and anions such as nitrate, carbonate, chloride, phosphate, fluoride, sulfite, titanate, silicate, and borate ions. The concentration of the second and third elements is preferably about 0 to 10,000 ppm. Although the conditions for the anodizing treatment are not particularly limited, the treatment is preferably performed by direct or alternating current electrolysis at a content of an acid commonly used as the main component of the electrolyte solution of 30 to 500 g/liter, at an electrolyte solution temperature of 10 to 70° C. and at an electric current density in a range of 0.1 to 40 $A/m^2$. The thickness of the resultant anodic oxidation film is in a range of 0.5 to 1.5 μm, and preferably in a range of 0.5 to 1.0 μm. The conditions for the treatment are preferably selected such that the anodic oxidation film formed on the treated support has micropores having a size of 5 to 10 nm and a pore density of $8\times10^{15}$ to $2\times10^{16}$ pores/$m^2$.

A treatment for imparting hydrophilicity to the surface of the support can be any of well known methods. A treatment for imparting hydrophilicity with silicate or polyvinylphosphonic acid is particularly preferably conducted. The film is formed such that the amount of a silicon or phosphorus element be 2 to 40 mg/$M^2$, and preferably 4 to 30 mg/$m^2$. The coated amount may be measured by a fluorescent X-ray analysis method.

The treatment for imparting hydrophilicity is performed, for example, by immersing the aluminum support having thereon an anodic oxidation film in an aqueous solution containing 1 to 30% by mass, and preferably 2 to 15% by mass of alkaline metal silicate or polyvinylphosphonic acid, having, at 25° C., a pH of 10 to 13 and kept at a temperature in a range of 15 to 80° C. for 0.5 to 120 seconds.

The alkali metal silicate salt used for the hydrophilizing treatment can be sodium silicate, potassium silicate, and/or lithium silicate. Oxide is used to raise the pH of the solution of the alkali metal silicate salt, and examples thereof include sodium hydroxide, potassium hydroxide, and lithium hydroxide. An alkaline earth metal salt or a salt including a metal of Group IVB may be added to the treatment solution. Examples of the alkaline earth metal salt include water-soluble salts including nitrates such as calcium nitrate, strontium nitrate, magnesium nitrate, and barium nitrate, sulfates, hydrochlorides, phosphates, acetates, oxalates, and borates. Examples of the salt including a metal of Group IVB include titanium tetrachloride, titanium trichloride, titanium potassium fluoride, titanium potassium oxalate, titanium sulfate, titanium tetraidodide, zirconium oxychloride, zirconium dioxide, zirconium oxychloride, and zirconium tetrachloride.

One of the alkaline earth metal salts and the salts each including a metal of Group IVB may be used or two or more of them can be used together. The content of the metal salt is preferably 0.01 to 10% by mass, and more preferably 0.05 to 5.0% by mass. Moreover, silicate electrodeposition as described in U.S. Pat. No. 3,658,662 is also effective. Surface treatment in which a support electrolytically grained as disclosed in JP-B No. 46-27481, JP-A Nos. 52-58602 or 52-30503, the aforementioned anodizing treatment and a treatment for imparting hydrophilicity are combined with each other is also useful.

<Preparation of Planographic Printing Plate Precursor>

The planographic printing plate precursor of the invention has a photosensitive layer on a support and may have an undercoat layer and/or a protective layer, if necessary. The planographic printing plate precursor is prepared by dissolving the above-described components in a suitable solvent and applying the resulting coating liquid to a support.

The photosensitive layer is formed by dissolving the above-described components of a photosensitive layer in an organic solvent and applying the resultant photosensitive layer coating liquid to a support or an undercoat layer.

Examples of the solvent include acetone, methyl ethyl ketone, cyclohexane, ethyl acetate, ethylene dichloride, tetrahydrofuran, toluene, ethylene glycol monomethylether, ethylene glycol monoethylether, ethylene glycol dimethylether, propylene glycol monomethylether, propylene glycol monoethylether, acetylacetone, cyclohexanone, diacetone alcohol, ethylene glycol monomethylether acetate, ethylene glycol ethylether acetate, ethylene glycol monoisopropylether acetate, ethylene glycol monobutylether acetate, 3-methoxypropanol, methoxymethoxyethanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxypropyl acetate, N,N-dimethylformamide, dimethylsulfoxide, γ-butylolactone, methyl lactate, and ethyl lactate. One of these solvents may be used or two or more of them can be used together. The concentration of solid matters in the photosensitive layer coating liquid is preferably 2 to 50% by mass.

It is preferable to select the coating amount of the photosensitive layer, which can mainly influence the sensitivity and the developing property of the photosensitive layer, and the strength and the printing durability of an exposed layer, according to applications of the precursors. When the coating amount is too small, printing durability becomes insufficient. On the contrary, when it is too large, sensitivity decreases, and consequently exposure of such a precursor requires much time, and development of the exposed plate needs longer time. When the planographic printing plate precursor of the invention is one to be exposed to light by scanning it with an infrared ray, which one is a main application, the dry amount of the photosensitive layer is preferably in a range of about 0.1 to about 10 $g/m^2$, and more preferably in a range of 0.5 to 5 $g/m^2$.

Physical Properties of Photosensitive Layer

As for the physical properties of the photosensitive layer of the planographic printing plate precursor of the invention which photosensitive layer is a radically polymerizable layer or a layer cross-linkable in the presence of an acid catalyst, the developing speed of unexposed portions in an alkaline developing solution having a pH of 10 to 13.5 is preferably 80 nm/second or more, and the permeation speed of the alkaline developing solution in exposed portions is preferably 50 nF/second or less.

Here, the developing speed of unexposed portions in an alkaline developing solution having a pH of 10 to 13.5 is a value obtained by dividing the thickness (nm) of a photosensitive layer by a time which it took to develop the photosensitive layer (second). The permeation speed of the alkaline developing solution in exposed portions is a value showing a speed of change in electrostatic capacitance (F) when a photosensitive layer is formed on a conductive support and the support is immersed in a developing solution.

Hereinafter, methods for determining the “developing speed of unexposed portions in an alkaline developing solution” and the “permeation speed of the alkaline developing solution in exposed portions” will be described in detail. Determination of developing speed of exposed portions in alkaline developing solution As described above, the developing speed of unexposed portions in an alkaline developing solution is a value obtained by dividing the thickness (nm) of a photosensitive layer by a time which it took to develop the photosensitive layer (second).

Figure 2:
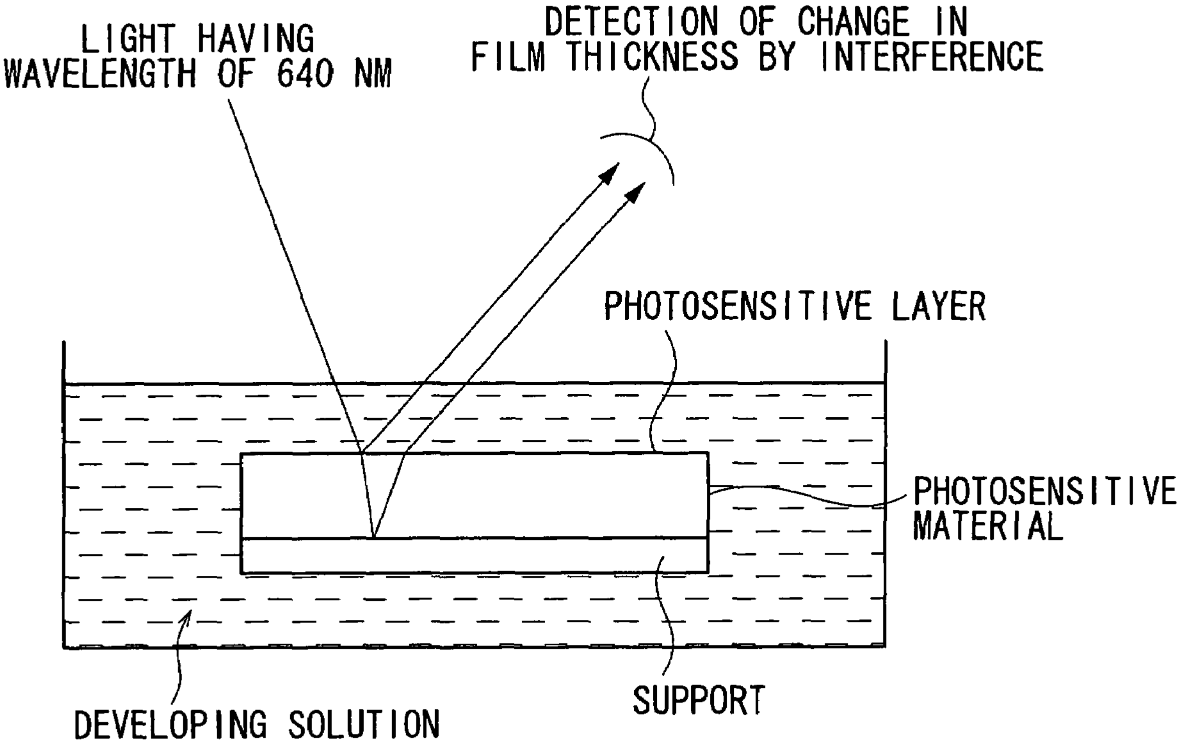
FIG. 2 is a schematic view of a part of an example of a DRM interference wave-measuring instrument used to determine the behavior of photosensitive layer which is being dissolved in a developing solution.

In determining the developing speed, an unexposed negative photosensitive layer formed on an aluminum support is immersed in an alkaline developing solution having a constant pH in a range of 10 to 13.5 and kept at 30° C., and the dissolving behavior of the negative photosensitive layer is observed with a DRM interference wave-measuring instrument as shown in FIG. 2. FIG. 2 is a schematic view of the DRM interference wave-measuring instrument used to study the dissolving behavior of the photosensitive layer. In the invention, a change in film thickness is detected by utilizing interference caused by light having a wavelength of 640 nm. When development does not cause swelling of the negative photosensitive layer and dissolution of the negative photosensitive layer starts with dissolution of the surface thereof, the layer gradually thins with the passage of developing time, and an interference wave corresponding to a film thickness is obtained. Alternatively, when development causes swelling of the negative photosensitive layer and the swollen layer separates from a support in the form of masses, penetration of the developing solution in the layer causes the layer to thicken due to swelling thereof and thin due to separation thereof from the support, and thus a distinct interference wave cannot be obtained.

Measurement is continued under these conditions until the photosensitive layer is completely removed. The developing speed is obtained according to the following equation on the basis of a time necessary to completely remove the photosensitive layer and to thereby decrease the layer thickness to 0 (development completion time) (second) and the initial thickness of the photosensitive layer (μm). A high developing speed means that a layer is readily removed with a developing solution and that the development property of the layer is good.

Developing speed (at unexposed portions)=Initial thickness of photosensitive layer (μm)/Development completion time (second)

Measurement of permeation speed of alkaline developing solution

Figure 3:
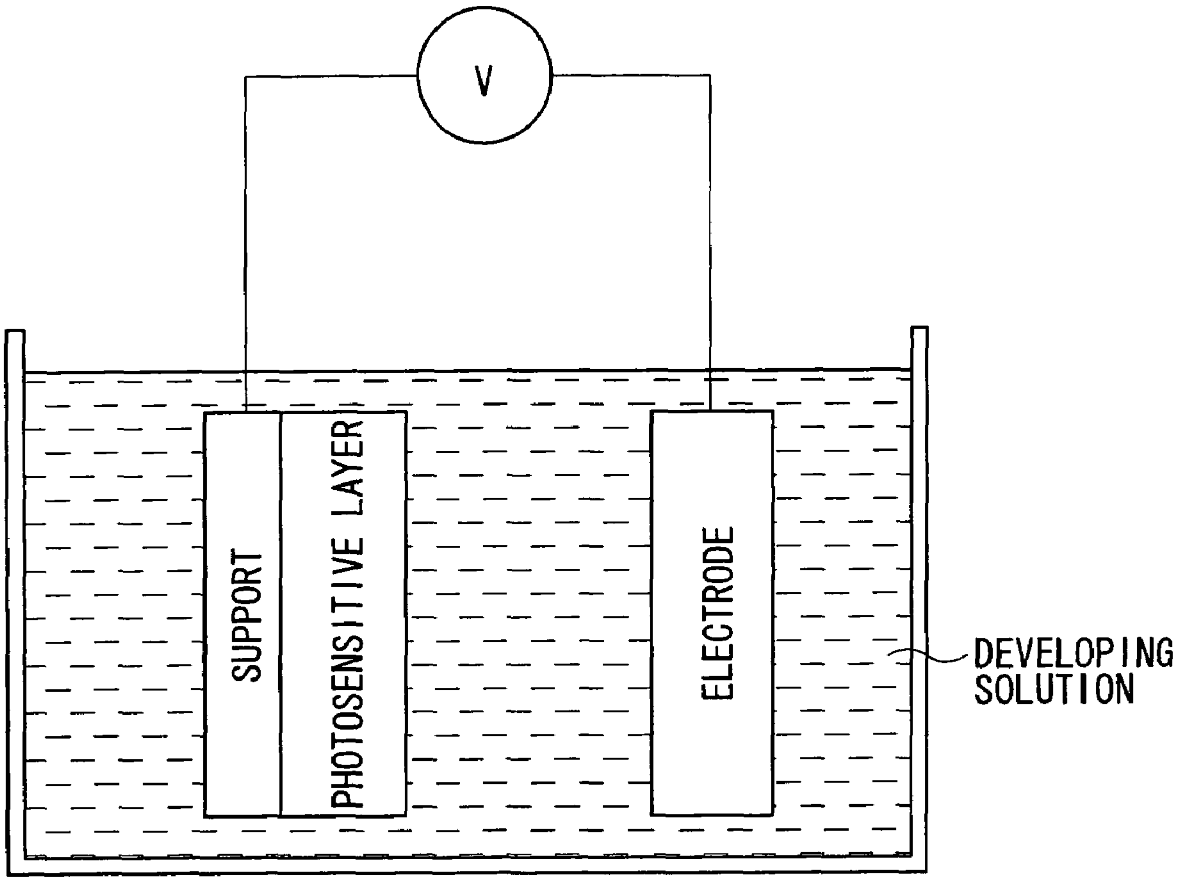
FIG. 3 is a schematic diagram illustrating an example of a method of determining electrostatic capacitance for evaluation of the permeability of a developing solution into a photosensitive layer.

As described above, the permeation speed of an alkaline developing solution refers to a speed of change in electrostatic capacitance (F) when a photosensitive layer is formed on a conductive support and the support is immersed in a developing In order to measure electrostatic capacity, the following method can be conducted. As shown in FIG. 3, an aluminum support having thereon a photosensitive layer is exposed to light at a predetermined light amount, and the support, which has the resultant cured photosensitive layer and serves as an electrode, is then immersed in an alkaline developing solution having a pH in a range of 10 to 13.5 and kept at 28° C. A conventional electrode serving as a counter electrode is also immersed in the alkaline developing solution and a wire or cable is connected to the electrode and the aluminum support. Then, an electrical voltage is applied to the resultant circuit and electrostatic capacitance is measured. After the application and measurement are started, the developing solution permeates in the photosensitive layer with the passage of time, and then reaches the interface between the support and the photosensitive layer. During this process, electrostatic capacity changes.

The permeation speed can be obtained according to the following equation on the basis of a time from a time when the measurement has started to a time when electrostatic capacity no longer changes (second) and the saturated electrostatic capacity of the photosensitive layer (nF). The lower the permeation speed, the more insufficient the permeability of the developing solution.

Permeation speed of developing solution (at exposed portions)=Saturated electrostatic capacity of photosensitive layer (nF)/time described above (sec)

As for the physical properties of the photosensitive layer of the planographic printing plate precursor of the invention, the developing speed of unexposed portions in an alkaline developing solution having a pH of 10 to 13.5 which developing speed is determined in the above manner is more preferably 80 to 400 nm/second and still more preferably 90 to 200 nm/second. On the other hand, the permeation speed of the alkaline developing solution at exposed portions is more preferably 0 to 50 nF/second and still more preferably 0 to 10 nF/second.

Any of methods commonly practiced in the art may be conducted to control the developing speed of unexposed portions of the photosensitive layer and the permeation speed of the alkaline developing solution into the cured photosensitive layer, or exposed portions. For example, in order to accelerate the developing speed of unexposed portions, it is effective that the photosensitive layer contains a hydrophilic compound. Moreover, in order to suppress penetration of the developing solution into exposed portions, it is effective that the photosensitive layer contains a hydrophobic compound.

In the invention, each of the developing speed of the photosensitive layer and the permeation speed of the developing solution can be easily adjusted at the above-described, preferable range by using the specific binder polymer previously described as one of the components of a radically polymerizable layer, which is a photosensitive layer.

Intermediate Layer (Undercoat Layer)

The planographic printing plate precursor of the invention may have an intermediate layer (also referred to as an undercoat layer) for the purpose of improving adhesiveness between the photosensitive layer and the support and the staining property of the precursor. Specific examples of such an intermediate layer include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682 and 11-84674, and Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091 and 2000-14697.

Protective Layer

When the photosensitive layer of the planographic printing plate precursor of the invention is a radically polymerizable layer, a protective layer (also referred to as an overcoat layer) is preferably disposed on the photosensitive layer to enable exposure of the precursor in an atmosphere. The protective layer prevents low molecular weight compounds which inhibit image forming reaction caused by exposure of the photosensitive layer, such as oxygen and basic substances existing in an atmosphere, from entering the photosensitive layer, which makes it possible to conduct exposure in an atmosphere. Accordingly, a property which the protective layer is required to have is that the permeating property of the low molecular weight compounds such as oxygen in the protective layer is low. Moreover, it is preferable that the protective layer does not substantially inhibit light used to expose the planographic printing plate precursor from passing through the protective layer, has strong adhesion between the protective layer and the photosensitive layer, and can be easy to remove in the development step of an exposed printing plate. Devices relating to a protective layer satisfying the above demands have been conventionally implemented, as detailed in U.S. Pat. No. 3,458,311 and JP-B No. 55-49729. The material of the protective layer is preferably a relatively good crystalline, water-soluble and high molecular weight compound. Specifically, water-soluble polymers such as polyvinyl alcohol, polyvinyl pyrrolidone, acidic celluloses, gelatin, gum arabic and polyacrylic acid are known as such. However, use of polyvinyl alcohol as the main component of the protective layer is effective to obtain best basic characteristics such as an oxygen-blocking property and removability during development.

Polyvinyl alcohol used in the protective layer may be partly substituted with ester, ether and/or acetal, insofar as it contains an unsubstituted vinyl alcohol unit for achieving an oxygen-blocking property and water-solubility, which are essential to the protective layer. In addition, a part thereof may have other copolymerizing component. The polyvinyl alcohol can be one which have been hydrolyzed in a proportion of 71 to 100% and which have a molecular weight in a range of 300 to 2,400. Specific examples of such polyvinyl alcohol include PVA-105, PVA-1110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 manufactured by Kuraray Co., Ltd.

The components of the protective layer (kind of PVA, and use of other additives) and the amounts thereof are determined according to a desired oxygen-blocking property, removability during development, fogging property, adhesiveness, and scratch resistance of the protective layer. Generally, the higher the hydrolysis rate of the PVA (the higher the content of unsubstituted vinyl alcohol units in the protective layer), the better the oxygen-blocking property of the protective layer and the sensitivity of the printing plate precursor. Moreover, the thicker the protective layer, the better the oxygen-blocking property of the protective layer and the sensitivity of the printing plate precursor. However, extreme rising of the oxygen-blocking property may lead to undesirable polymerization reaction during production and storage, and fogging, which is undesired, and thickening of image lines during image exposure. Adhesion between the protective layer and the image portions and scratch resistance of the protective layer are also very important in handling printing plates. When a printing plate has a hydrophilic layer made of a water-soluble polymer and laminated on a photosensitive layer, which is oleophilic, these layers insufficiently adhere to each other, which causes the hydrophilic layer to often and undesirably separate from the printing plate. Portions of the printing plate having no protective layer are exposed to air, and oxygen included in the air inhibits polymerization in the photosensitive layer, generating defects such as insufficient hardening of the photosensitive layer. In order to solve this problem, various methods for improving the adhesion between the two layers have been proposed. For example, U.S. Pat. Nos. 292,501 and 44,563 disclose that a hydrophilic layer having strong adhesion between a photosensitive layer and the hydrophilic layer can be obtained by adding an acrylic emulsion or a water-insoluble vinylpyrrolidone-vinyl acetate copolymer to a hydrophilic polymer mainly containing polyvinyl alcohol in an amount of 20 to 60% by mass and applying the resulting composition onto a photosensitive layer.

These conventionally known techniques may be applied to the protective layer used in the invention. Methods of forming such a protective layer are detailed in, for example, U.S. Pat. No. 3,458,311 and JP-B No. 55-49729.

In the invention, it is preferable to use both polyvinyl alcohol and polyvinylpyrrolidone from the viewpoints of adhesive strength, sensitivity and prevention of fogging. The mass ratio of polyvinyl alcohol to polyvinylpyrrolidone is preferably one third or less. The coating amount of these polymers is preferably 1.0 to 3.0 g/m$^2$.

Base Substrate

The surface of the base substrate for use in the invention is required to have an absorption maximum in a region of 350 to 700 nm so that a wavelength at which the absorption maximum appears is different from that at which the absorption maximum of the planographic printing plate precursor appears and that at which the absorption maximum of the dummy plate precursor for planographic printing appears. Also, the surface of the base substrate is required to have an absorbance at the absorption maximum of 0.2 or more. It is sufficient that a surface of the base substrate, which surface is identified by a color sensor, or on which surface planographic printing plate precursors and/or dummy plate precursors for planographic printing are piled up, satisfies the above conditions. However, the entire base substrate may satisfy the above conditions.

In addition, the base substrate used in the invention can be made of a material which is strong enough to enable a predetermined number of planographic printing plate precursors and/or a predetermined number of dummy plate precursors for planographic printing to be piled up thereon. Typical examples thereof include cardboard (corrugated paper) called "stack board" and an article in which such cardboard is laminated on a SUS block.

As described above, the base substrate used in the invention has color tone that can be distinguished from those of a planographic printing plate precursor and a dummy plate precursor for planographic printing. The inherent color of the material of the base substrate may satisfy the above requirement. Alternatively, the surface of the base substrate or the entire base substrate may be colored to satisfy the requirement. When the base substrate is colored, it is preferably colored so that the base substrate has an absorption maximum in a region of 400 to 550 nm. In order to attain this, it is preferable to use a dye or pigment having an absorption maximum in the region of 400 to 550 nm. Examples of the dye and pigment include orange pigments described in "Latest Pigment Handbook" edited by Japan Society of Pigment Technologies and published in 1977.

EXAMPLES

Hereinafter, the invention will be described with reference to Examples. However, it should be understood that the invention is not restricted by these Examples.

Examples 1 to 8 and Comparative Examples 1 to 3

1. Preparation of Dummy Plate Precursor

The following dummy plate precursor was prepared as a sample.

Support

The surface of an aluminum rolled plate stipulated in JIS A1050, having a thickness of 0.30 mm and containing 99.5 wt% of aluminum, 0.01 wt % of copper, 0.03 wt % of titanium, 0.3 wt % of iron, and 0.1 wt % of silicon was roughened with an aqueous suspension containing 20 wt % of 400-mesh Pamistone (manufactured by KCM Corp.) and a rotary nylon brush (6,10-nylon) and thoroughly washed with water.

The plate was then immersed in and etched with an aqueous solution including 15 wt % of sodium hydroxide and further containing 4.5 wt % of aluminum, until the amount of dissolved aluminum became 5 $g/m^2$. The plate was then washed with running water. The plate was neutralized with one wt % of nitric acid, and then subjected to electrolytic surface roughening treatment. The treatment was conducted in an aqueous solution containing 0.7 wt % of nitric acid and further containing 0.5 wt % of aluminum. In the treatment, an alternate-rectangular waveform voltage having an electric current rate r of 0.90 and an electric current waveform described in the Example of JP-B No. 58-5796 was used. Moreover, the quantity of electricity when the plate served as an anode was 160 coulomb/$dm^2$, and the voltage when the plate served as the anode was 10.5 volt, and the voltage when the plate served as a cathode was 9.3 volt. Thereafter, the plate was washed with water. The plate was then immersed in and etched with an aqueous solution including 10 wt % of sodium hydroxide at 35° C., until the amount of dissolved aluminum became 1 $g/m^2$. The plate was washed with water, immersed in and desmutted with an aqueous solution including 30 wt % of sulfuric acid at 50° C., and washed with water.

Thereafter, a porous anodic oxide film was formed on the plate in an aqueous solution including 20 wt % of sulfuric acid and 0.8 wt % of aluminum at 35° C. by using direct current. Namely, the plate was electrolyzed at an electric current density of 13 A/$dm^2$, and an anodic oxide film having a coating amount of 2.7 $g/m^2$ was prepared by controlling the electrolysis time. The plate was washed with water, immersed in an aqueous solution including 3 wt % of sodium silicate at 70° C. for 30 seconds, washed with water and dried.

Thus, an aluminum support was obtained. The support had a reflection density of 0.30 as determined by Macbeth RD920 reflection densitometer and a centerline average roughness of 0.58 μm.

Undercoat Layer

Subsequently, an undercoat layer was formed on the support according to the following method. Meanwhile, a non-photosensitive layer described later was directly disposed on the support without an undercoat layer in Example 1 and Comparative Example 3. Presence or absence of the undercoat layer in each of Examples and Comparative Examples is shown in Table 2.

The following undercoat layer coating liquid was applied to the aluminum support with a wire bar and the resultant coating was dried at 90° C. for 30 seconds. The coating amount was 128 mg/$m^2$.

Polymer compound A having the following structure (32 mass % solution including isopropyl alcohol and water at a ratio of [1/1] 0.4 g Methanol 5.6 g Polymer compound A

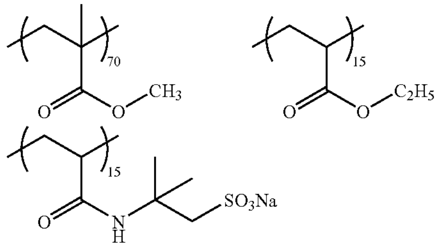

Non-photosensitive Layer

Subsequently, the following non-photosensitive layer coating liquid [Q-1] was prepared and applied to the aluminum support or the undercoat layer with a wire bar. The aluminum support was dried with a hot air dryer at 90° C. for 27 seconds. Thus, a dummy plate precursor for planographic printing plate was obtained. The dry coating amount of the non-photosensitive layer was 0.53 $g/m^2$. After formation of the non-photosensitive layer, the absorption maximum and the absorbance at the absorption maximum of the resultant were measured with a U-3010 spectrophotometric reflection spectrum-measuring device manufactured by Shimadzu Corporation. The absorbance is a value obtained by calibrating the measured value on the basis of the absorbance of the support before formation of the non-photosensitive layer. The results are summarized in Table 2.

<Non-photosensitive Layer Coating Liquid [Q-1]>

Alkali-soluble urethane binder (16 mass % solution including MFG and MEK at a ratio of 1/1)

(the binder polymer had a weight-average molecular weight of 85,000, an acid content of 1.64 meq/g, and was a reaction product of the following four monomers) 2.465 g

| | |
|---|---|
| 4,4-Diphenylmethane diisocyanate | 37.5 mole % |
| Hexamethylene diisocyanate | 12.5 mole % |
| 2,2-Bis(hydroxymethyl)propionic acid | 32.5 mole % |
| Tetraethylene glycol | 17.5 mole % |

Phosphoric acid (85 mass % aqueous solution) (amount shown in Table 2)

Sulfophthalic acid (50 mass % aqueous solution) 0.034 g

Tricarbarylic acid 0.017 g

Dye (s-1) (amount shown in Table 2)

Victoria Pure Blue (C-1) 0.0014 g

Fluorinated surfactant 0.009 g (MEGAFAC F-780-F manufactured by Dainippon Ink and Chemicals, Inc., 30 mass % MEK solution)

Methyl ethyl ketone (MEK) 7.93 g

Methanol 6.28 g

1-Methoxy-2-propanol (MFG) 2.01 g

The structure of Victoria Pure Blue (C-1) used in the non-photosensitive layer coating liquid is shown below.

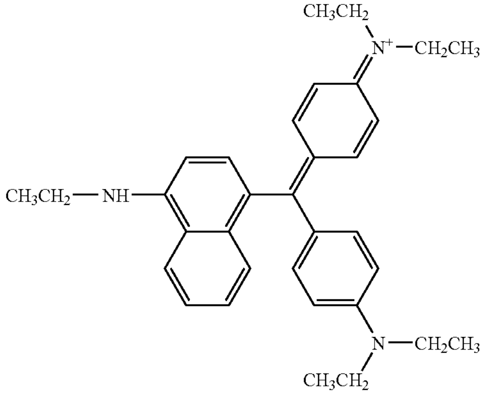

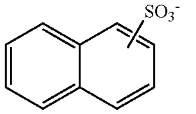

Preparation of Photosensitive Planographic Printing Plate Precursor Support

An aluminium plate stipulated in JIS A1050 and having a thickness of 0.30 mm and a width of 1030 mm was subjected to the following surface treatment.

Surface Treatment

The surface treatment was carried out by sequentially conducting the following steps (a) to (f). After each step and water washing, liquid remaining on the aluminum plate was removed with a nip roller.

(a) The aluminium plate was etched in a solution containing 26 mass % of sodium hydroxide and 6.5 mass % of aluminium ions at 70° C., until the amount of dissolved aluminum became 5 g/$m^2$. The etched plate was then washed with water.

(b) The aluminum plate was desmutted by spraying an aqueous solution including 1 wt % of nitric acid and 0.5 mass % of aluminium ions and kept at 30° C. to the plate. The aluminum plate was then washed with water.

(c) The surface of the aluminum plate was continuously electrochemically roughened by applying an alternate current voltage having a frequency of 60 Hz to the plate immersed in an electrolyte which was an aqueous solution including 1 mass % of nitric acid, 0.5 mass % of aluminium ions and 0.007 mass % of ammonium ions and kept at 30° C. The alternate current voltage had a trapezoidal waveform, a time which it took to increase an electric current value from zero to peak. (TP) was 2 mseconds, and a duty ratio was 1:1. In the treatment, a carbon electrode was used as a counter electrode. A ferrite electrode was used as an auxiliary anode. The electric current density was 25 A/$dm^2$ at the peak of electric current. The total amount of electricity used in this treatment and used when the aluminium plate served as an anode was 250 C/$cm^2$. A part (5%) of the current supplied from a power source was applied to the auxiliary anode. The aluminum plate was then washed with water.

(d) The aluminium plate was etched by spraying a solution containing 26 mass % of sodium hydroxide and 6.5 mass % of aluminium ions to the plate at 35° C., until the amount of dissolved aluminum became 0.2 g/$m^2$. Thereby, smuts mainly including aluminum hydroxide which had occurred during the electrochemical surface roughening by using the alternate current were removed, and the edge portions of pits generated were dissolved and smoothened. The aluminum plate was then washed with water.

(e) The aluminum plate was desmutted by spraying an aqueous solution including 25 mass % of sulfuric acid and 0.5 mass % of aluminium ions and kept at 60° C. to the plate. Water was sprayed on the plate to wash the plate.

(f) The aluminum plate was anodized in an electrolyte containing sulfuric acid at a concentration 170 g/L and additionally containing aluminium ions at a concentration 0.5 mass % and kept at 33° C. at an electric current density of 5 A/$dm^2$ for 50 seconds. The aluminum plate was then washed with water. After the treatment, the amount of anodic oxide film was 2.7 g/$m^2$. An aluminum support was thus obtained. The surface roughness Ra of the aluminum support was measured with an apparatus, SURFCOM manufactured by Tokyo Seimitsu Co. Ltd., having a stylus with a distal diameter of 2 μm, and found to be 0.27.

Undercoat Layer

Subsequently, the following undercoat layer coating liquid was applied to the aluminum support with a wire bar and the resultant coating was dried at 90° C. for 30 seconds. The coating amount was 10 mg/$m^2$.

Polymer compound B having the following structure 0.05 g

Methanol 27 g

Deionized water 3 g

Polymer compound B

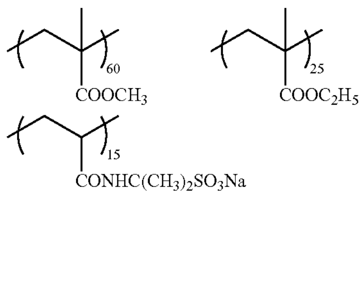

Photosensitive Layer

Subsequently, the following photosensitive layer coating liquid [P-1] was prepared and applied to the undercoat layer with a wire bar.

The aluminum support was dried with a hot air dryer at 115° C. for 34 seconds. Thus, a planographic printing plate precursor was obtained. The dry coating amount of the photosensitive layer was 1.3 g/m$^2$.

The polymerization initiator (OS-12) is an example of the onium salt compound represented by Formula (2) described previously.

The structures of the infrared ray absorbent (IR-1), additive (PM-1), polymerizable compound (AM-1), binder polymer (BT-1), and ethyl violet (C-1) used in the photosensitive layer coating liquid are shown below.

[IR-1]

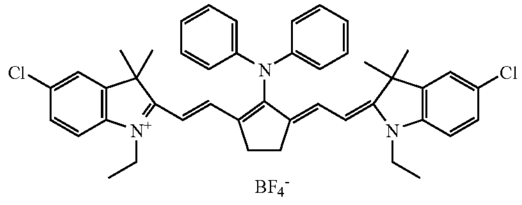

[PM-1]

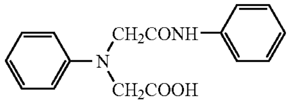

[AM-1]

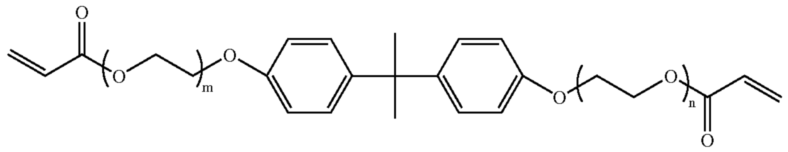

[BT-1]

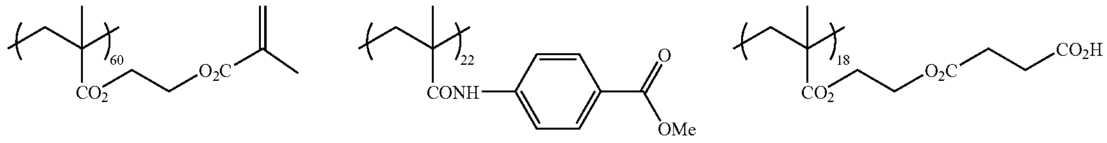

[C-1]

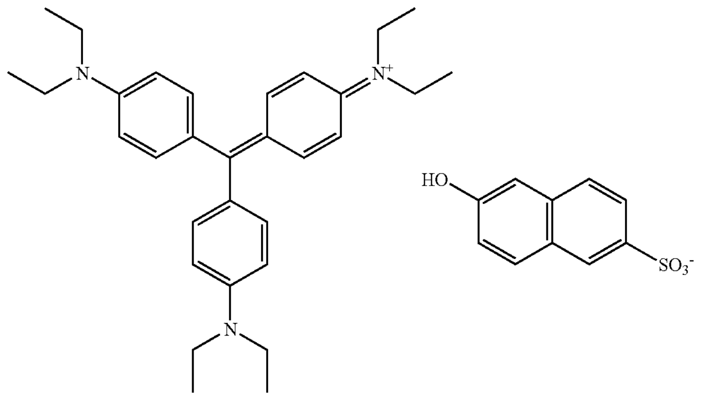

<Photosensitive Layer Coating Liquid [P-1]>

Infrared ray absorbent (IR-1) 0.074 g
Polymerization initiator (OS-12) 0.280 g
Additive (PM-1) 0.151 g
Polymerizable compound (AM-1) 1.00 g
Binder polymer (BT-1) 1.00 g
Ethyl violet (C-1) 0.04 g
Fluorinated surfactant 0.015 g
(MEGAFAC F-780-F manufactured by Dainippon Ink and Chemicals, Inc., 30 wt % solution including methyl ethyl ketone)
Methyl ethyl ketone 10.4 g
Methanol 4.83 g
1-Methoxy-2-propanol 10.4 g Protective Layer (Overcoat Layer)

An aqueous solution containing polyvinyl alcohol having a degree of saponification of 98 mole% and a degree of polymerization of 500 and polyvinylpyrrolidone (LUVISKOL K-30 manufactured by BASF) was applied to the photosensitive layer surface with a wire bar and the resultant coating was dried with a hot air dryer at 125° C. for 75 seconds. The mass ratio of polyvinyl alcohol/polyvinylpyrrolidone was 4/1, and the coating amount (after drying) was 2.30 g/m$^2$.

Stack Board

TENCOLOR (orange) manufactured by Shinfuji Paper Co., Ltd. was used as a stack board.

Interleaving Paper

F INTERLEAVING PAPER manufactured by Daiichi Container Co., Ltd., was used as interleaving paper. The physical properties of the interleaving paper are summarized in Table 1.

TABLE 1

| Physical properties | | | Interleaving paper F |
|---|---|---|---|
| Weight | | $g/m^2$ | 41.4 |
| Thickness | | μm | 51 |
| Density | | $g/m^3$ | 0.81 |
| Smoothness | Face A | second | 39 |
| | Face B | second | 53 |
| Air permeability | | second | 190 |
| Tensile strength | Vertical | kN/m | 3.8 |
| | Lateral | kN/m | 1.8 |
| Elongation | Vertical | % | 2.1 |
| | Lateral | % | 5.3 |

Developing Solution

The following components was dissolved in water, and KOH was added to the resultant to adjust the pH of the resultant at 11.95 at 25° C. Thus, a developing solution was obtained.

Surfactant (K-1) 4 mass %

Antifoaming agent (OLFINE AK-02) 0.08 mass %

Tetrasodium ethylenediamine tetraacetate 0.16 mass %

Potassium carbonate 0.16 mass %

Evaluation (1) Material Differentiability

A check was made to determine whether a color sensor could distinguish the dummy plate precursors from the photosensitive planographic printing plate precursor, the stack board, and the interleaving paper. The color sensor was one manufactured by KEYENCE Corporation and having a sensing unit of CZ-41 and an amplifying unit of CZ-V1. The dummy plate precursors which could be distinguished by the color sensor are designated as A, and those which could not be distinguished are designated as B.

(2) Printing Properties

After the dummy plate precursors and the interleaving paper were conditioned in an environment of 25° C. and 60% RH for 2 hours, the interleaving paper was disposed on the non-photosensitive layer of the dummy plate precursor, and the resultant sample was sealed with A1 Kraft paper and left at 50° C. for 3 days.

The sample after the storage was developed with an automatic developing machine LP-1310HII manufactured by Fuji Photo Film Co., Ltd at a traveling speed (line speed) of 2 m/minute at a developing temperature of 30° C. The developing solution used in the machine was one described previously, and the finisher was a solution obtained by diluting GN-2K manufactured by Fuji Photo Film Co., Ltd with water at a ratio of 1:1.

Printing was conducted with the developed dummy plate and a printing machine LITHRONE manufactured by Komori Corp., and stains in the non-image portion was evaluated. The stains in the non-image portion were sensorily classified into five levels from level 1 (worst) to level 5 (best). Level 3 is the lower limit of practically acceptable levels and levels 1 and 2 cannot be practically accepted. Results are summarized in Table 2.

TABLE 2

| | Coloring agent | | Amount of phosphoric | Undercoat | Absorption maximum | | Color sensor | Printing |
|---|---|---|---|---|---|---|---|---|
| | Kind | $g/m^2$ | acid | layer | (mn) | Absorbance | compatibility | stains |
| Example 1 | S-1 | 0.025 | — | N/A | 425 | 0.53 | A | 3 |
| Example 2 | S-1 | 0.025 | — | Presence | 425 | 0.53 | A | 4 |
| Example 3 | S-1 | 0.025 | 0.02 | Presence | 425 | 0.53 | A | 4 |
| Example 4 | S-1 | 0.025 | 0.08 | Presence | 425 | 0.52 | A | 5 |
| Example 5 | S-1 | 0.03 | 0.02 | Presence | 450 | 0.43 | A | 4 |
| Example 6 | S-1 | 0.02 | 0.08 | Presence | 425 | 0.4 | A | 5 |
| Example 7 | S-1 | 0.015 | 0.08 | Presence | 425 | 0.3 | A | 5 |
| Example 8 | S-1 | 0.012 | 0.08 | Presence | 425 | 0.24 | A | 5 |
| Comparative Example 1 | S-1 | 0.007 | 0.08 | Presence | 425 | 0.15 | B | 5 |
| Comparative Example 2 | — | — | 0.08 | Presence | — | — | B | 5 |
| Comparative Example 3 | — | — | — | — | — | — | B | 3 |

As is apparent from Table 2, the dummy plate precursors of Examples 1 to 8, which have an absorption maximum and an absorbance of the non-photosensitive layer within the range recited in the invention, do not generate printing stains even after a long-term storage and can be differentiated from other materials used in a CTP device, such as a photosensitive planographic printing plate precursor, a stack board, and an interleaving paper, by a color sensor. The results also shows that formation of an undercoat layer and/or addition of a low-molecular weight acid compound can further reduce printing stains. In contrast, the dummy plate precursors of Comparative Examples 1 to 3 could not be differentiated by the color sensor, and could not be put into practical use.

Example 9

The dummy plate precursor of Example 1 was disposed on the stack board, the interleaving paper was disposed on the dummy plate precursor, the photosensitive planographic printing plate precursor was disposed on the interleaving paper, and another interleaving paper was disposed on the photosensitive planographic printing plate precursor. The resultant was set in a printing machine AMZISETTER manufactured by NEC Corporation. Thereafter, a check was made to determine whether the dummy plate precursor and the photosensitive planographic printing plate precursor could be conveyed and whether only the photosensitive planographic printing plate precursor was exposed to light. As a result, a dummy plate obtained by developing the dummy plate precursor which had not been exposed to light was discharged from the machine, and a photosensitive planographic printing plate obtained by exposing the photosensitive planographic printing plate precursor to light and developing the exposed printing plate was discharged from the machine, showing that the dummy plate precursor can be used without any problem.

Example 10

The dummy plate precursor of Example 1 was evaluated in the same manner as in Example 9, except that the CTP device was replaced with a machine GX-9900 manufactured by Matsushita Graphic Communication Systems, Inc. As in Example 9, it was confirmed that the dummy plate precursor can be used without any problem.

Examples 11 to 16 and Comparative Examples 4 to 7

Preparation of Planographic Printing Plate Precursor

Preparation of Support

An aluminium plate stipulated in JIS A1050 and having a thickness of 0.30 mm and a width of 1030 mm was subjected to the following surface treatment.

Surface Treatment

The surface treatment was carried out by sequentially conducting the following steps (a) to (f). After each step and water washing, liquid remaining on the aluminum plate was removed with a nip roller.

(a) The aluminium plate was etched in a solution containing 26 mass % of sodium hydroxide and 6.5 mass % of aluminium ions at 70° C., until the amount of dissolved aluminum became 5 g/m$^2$. The etched plate was then washed with water.

(b) The aluminum plate was desmutted by spraying an aqueous solution including 1 wt % of nitric acid and 0.5 mass % of aluminium ions and kept at 30° C. to the plate. The aluminum plate was then washed with water.

(c) The surface of the aluminum plate was continuously electrochemically roughened by applying an alternate current voltage having a frequency of 60 Hz to the plate immersed in an electrolyte which was an aqueous solution including 1 mass % of nitric acid, 0.5 mass % of aluminium ions and 0.007 mass % of ammonium ions and kept at 30° C. The alternate current voltage had a trapezoidal waveform, a time which it took to increase an electric current value from zero to peak (TP) was 2 mseconds, and a duty ratio was 1:1. In the treatment, a carbon electrode was used as a counter electrode. A ferrite electrode was used as an auxiliary anode. The electric current density was 25 A/dm$^2$ at the peak of electric current. The total amount of electricity used in this treatment and used when the aluminium plate served as an anode was 250 C/cm$^2$. A part (5%) of the current supplied from a power source was applied to the auxiliary anode. The aluminum plate was then washed with water.

(d) The aluminium plate was etched by spraying a solution containing 26 mass % of sodium hydroxide and 6.5 mass % of aluminium ions to the plate at 35° C., until the amount of dissolved aluminum became 0.2 g/m$^2$. Thereby, smuts mainly including aluminum hydroxide which had occurred during the electrochemical surface roughening by using the alternate current were removed, and the edge portions of pits generated were dissolved and smoothened. The aluminum plate was then washed with water.

(e) The aluminum plate was desmutted by spraying an aqueous solution including 25 mass % of sulfuric acid and 0.5 mass % of aluminium ions and kept at 60° C. to the plate. Water was sprayed on the plate to wash the plate.

(f) The aluminum plate was anodized in an electrolyte containing sulfuric acid at a concentration 170 g/L and additionally containing aluminium ions at a concentration 0.5 mass % and kept at 33° C. at an electric current density of 5 A/dm$^2$ for 50 seconds. The aluminum plate was then washed with water. After the treatment, the amount of anodic oxide film was 2.7 g/m$^2$.

An aluminum support was thus obtained. The surface roughness Ra of the aluminum support was measured with an apparatus, SURFCOM manufactured by Tokyo Seimitsu Co. Ltd., having a stylus with a distal diameter of 2 μm, and found to be 0.27.

Formation of Undercoat Layer

Subsequently, the following undercoat layer coating liquid A was applied to the aluminum support with a wire bar and the resultant coating was dried at 90° C. for 30 seconds. The coating amount was 10 mg/m$^2$.

<Undercoat Layer Coating Liquid A>

Polymer compound B having the previously-shown structure 0.05 g
Methanol 27 g
Deionized water 3 g Photosensitive Layer Subsequently, the following photosensitive layer coating liquid [P-1] was prepared and applied to the undercoat layer with a wire bar. The aluminum support was dried with a hot air dryer at 115° C. for 34 seconds. Thus, a planographic printing plate precursor was obtained. The dry coating amount of the photosensitive layer was 1.3 g/m$^2$.

<Photosensitive Layer Coating Liquid [P-1]>

Infrared ray absorbent (IR-1) 0.074 g
Polymerization initiator (OS-12) 0.280 g
Additive (PM-1) 0.151 g
Polymerizable compound (AM-1) 1.00 g
Binder polymer (BT-1) 1.00 g
Coloring agent shown in Table 3 (amount also shown in Table 3)
Fluorinated surfactant 0.015 g
(MEGAFAC F-780-F manufactured by Dainippon Ink and Chemicals, Inc., 30 wt % solution including methyl isobutyl ketone)
Methyl ethyl ketone 10.4 g
Methanol 4.83 g
1-Methoxy-2-propanol 10.4 g The polymerization initiator (OS-12) is an example of the onium salt compound represented by Formula (2) described previously.

The structures of the infrared ray absorbent (IR-1), additive (PM-1), polymerizable compound (AM-1), and binder polymer (BT-1) used in the photosensitive layer coating liquid are shown previously.

The kind and the amount of the coloring agents contained in the photosensitive layer coating liquid for the planographic printing plate precursor and the non-photosensitive layer of a dummy plate precursor for planographic printing plate described later are shown in Table 3. In addition, the structures of ethyl violet (C-1) and Victoria Pure Blue (C-2) described as the coloring agents in Table 3 are shown below. The dye (S-1) is one of the typical examples of the dye serving as the coloring agent contained in the non-photosensitive layer.

TABLE 3

| | | Ethyl violet (C-1) | Victoria Pure Blue (C-2) | Dye (S-1) |
|---|---|---|---|---|
| Example 11 | Printing plate precursor | 0.04 g | — | — |
| | Dummy plate precursor | — | 0.0014 g | 0.025 g |
| Example 12 | Printing plate precursor | 0.02 g | — | — |
| | Dummy plate precursor | — | 0.0014 g | 0.07 g |
| Example 13 | Printing plate precursor | 0.04 g | — | — |
| | Dummy plate precursor | — | 0.0014 g | 0.05 g |
| Example 14 | Printing plate precursor | 0.03 g | — | — |
| | Dummy plate precursor | — | 0.0014 g | 0.025 g |
| Example 15 | Printing plate precursor | 0.02 g | — | — |
| | Dummy plate precursor | — | 0.0014 g | 0.025 g |
| Example 16 | Printing plate precursor | — | — | 0.055 g |
| | Dummy plate precursor | 0.01 g | 0.0014 g | — |
| Comparative Example 4 | Printing plate precursor | 0.04 g | — | — |
| | Dummy plate precursor | — | 0.0014 g | 0.025 g |
| Comparative Example 5 | Printing plate precursor | 0.04 g | — | — |
| | Dummy plate precursor | — | 0.0014 g | 0.005 g |
| Comparative Example 6 | Printing plate precursor | 0.04 g | — | — |
| | Dummy plate precursor | — | 0.0014 g | 0.025 g |
| Comparative Example 7 | Printing plate precursor | 0.04 g | — | — |
| | Dummy plate precursor | 0.03 g of monosodium salt of 1-para-Sulfophenylazo-2-naphthol | | |

(C-1)

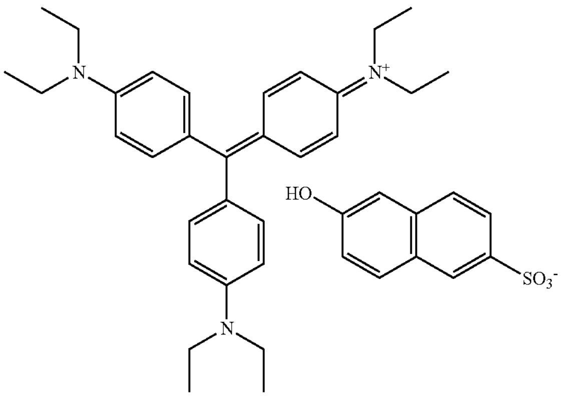

TABLE 3-continued

| Ethyl violet (C-1) | Victoria Pure Blue (C-2) | Dye (S-1) |
|---|---|---|

(C-2)

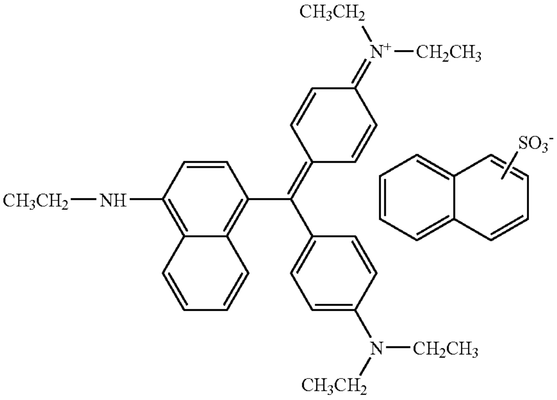

Protective Layer (Overcoat Layer)

An aqueous solution containing polyvinyl alcohol having a degree of saponification of 98 mole % and a degree of polymerization of 500 and polyvinylpyrrolidone (LUVISKOL K-30 manufactured by BASF) was applied to the photosensitive layer surface with a wire bar and the resultant coating was dried with a hot air dryer at 125° C. for 75 seconds. The mass ratio of polyvinyl alcohol/polyvinylpyrrolidone was 4/1, and the coating amount (after drying) was 2.30 g/$m^2$.

Preparation of Dummy Plate Precursor for Planographic Printing

Preparation of Support

The surface of an aluminum rolled plate stipulated in JIS A1050, having a thickness of 0.30 mm and containing 99.5 wt % of aluminum, 0.01 wt % of copper, 0.03 wt % of titanium, 0.3 wt % of iron, and 0.1 wt % of silicon was roughened with an aqueous suspension containing 20 wt % of 400-mesh Pamistone (manufactured by KCM Corp.) and a rotary nylon brush (6,10-nylon) and thoroughly washed with water.

The plate was then immersed in and etched with an aqueous solution including 15 wt % of sodium hydroxide and further containing 4.5 wt % of aluminum, until the amount of dissolved aluminum became 5 g/$m^2$. The plate was then washed with running water. The plate was neutralized with one wt % of nitric acid, and then subjected to electrolytic surface roughening treatment. The treatment was conducted in an aqueous solution containing 0.7 wt % of nitric acid and further containing 0.5 wt % of aluminum. In the treatment, an alternate-rectangular waveform voltage having an electric current rate r of 0.90 and an electric current waveform described in the Example of JP-B No. 58-5796. Moreover, the quantity of electricity when the plate served as an anode was 160 coulomb/$dm^2$, and the voltage when the plate served as the anode was 10.5 volt, and the voltage when the plate served as a cathode was 9.3 volt. Thereafter, the plate was washed with water. The plate was then immersed in and etched with an aqueous solution including 10 wt % of sodium hydroxide at 35° C., until the amount of dissolved aluminum became 1 g/$m^2$. The plate was washed with water, immersed in and desmutted with an aqueous solution including 30 wt % of sulfuric acid at 50° C., and washed with water.

Thereafter, a porous anodic oxide film was formed on the plate in an aqueous solution including 20 wt % of sulfuric acid and 0.8 wt % of aluminum and kept at 35° C. by using direct current. Namely, the plate was electrolyzed at an electric current density of 13 $A/dm^2$, and an anodic oxide film having a coating amount of 2.7 $g/m^2$ was prepared by controlling the electrolysis time. The plate was washed with water, immersed in an aqueous solution including 3 wt % of sodium silicate at 70° C. for 30 seconds, washed with water and dried.

Thus, an aluminum support was obtained. The support had a reflection density of 0.30 as determined by Macbeth RD920 reflection densitometer and a centerline average roughness of 0.58 μm.

Undercoat Layer

The following undercoat layer coating liquid B was applied to the aluminum support with a wire bar and the resultant coating was dried at 90° C. for 30 seconds. The coating amount was 128 $mg/m^2$.

<Undercoat Layer Coating Liquid B>

Solution including polymer compound A shown previously (32 mass % solution including isopropyl alcohol and water at a ratio of 1/1] 0.4 g Methanol 5.6 g Non-photosensitive Layer Subsequently, the following non-photosensitive layer coating liquid [Q-1] was prepared and applied to the undercoat layer with a wire bar. The aluminum support was dried with a hot air dryer at 90° C. for 27 seconds. Thus, a dummy plate precursor for planographic printing plate was obtained. The dry coating amount of the non-photosensitive layer was 0.53 $g/m^2$. After formation of the non-photosensitive layer, the absorption maximum and the absorbance at the absorption maximum of the resultant were measured with a U-3010 spectrophotometric reflection spectrum-measuring device manufactured by Shimadzu Corporation. The absorbance is a value obtained by calibrating the measured value on the basis of the absorbance of the support before formation of the non-photosensitive layer. The results are summarized in Table 4.

<Non-photosensitive Layer Coating Liquid [Q-1]>

Solution including Alkali-soluble urethane binder (16 mass % solution including MFG and MEK at a ratio of 1/1)

(the binder polymer had a weight-average molecular weight of 85,000, an acid content of 1.64 meq/g, and was a reaction product of the following four monomers) 2.465 g

| | |
|---|---|
| 4,4-Diphenylmethane diisocyanate | 37.5 mole % |
| Hexamethylene diisocyanate | 12.5 mole % |
| 2,2-Bis(hydroxymethyl)propionic acid | 32.5 mole % |
| Tetraethylene glycol | 17.5 mole % |

Phosphoric acid (85 mass % aqueous solution) (amount shown in Table 3)

Sulfophthalic acid (50 mass % aqueous solution) 0.034 g

Tricarbarylic acid 0.017 g

Coloring agent (Compound and amount thereof shown in Table 3)

Fluorinated surfactant 0.009 g (MEGAFAC F-780-F manufactured by Dainippon Ink and Chemicals, Inc., 30 mass % MEK solution)

Methyl ethyl ketone (MEK) 7.93 g

Methanol 6.28 g

1-Methoxy-2-propanol (MFG) 2.01 g

Preparation of Pile

Two Laminates in which a colored stack board was bonded to a SUS block (TENCOLOR (orange) manufactured by Shinfuji Paper Co., Ltd.) were used as base substrates. Five hundred sheets of the planographic printing plate precursors were piled up on one of the base substrates, with sheets of interleaving paper inserted between the precursors. Thus, a pile A was obtained.

Similarly, five hundred sheets of the dummy plate precursors for planographic printing were piled up on the other of the base substrates, with sheets of interleaving paper inserted between the precursors. Thus, a pile B was obtained.

The interleaving paper was F interleaving paper manufactured by Daiichi Container Co., Ltd. The physical properties of the interleaving paper are previously shown.

In Comparative Example 4, a stack board which had not been colored and thus was not orange was used. Determination of absorption maximum of each of planographic printing plate precursor, dummy plate precursor for planographic printing, base substrate, and interleaving paper The absorption maximum and the absorbance at the absorption maximum of each of the planographic printing plate precursor, the dummy plate precursor for planographic printing, the base substrate, and the interleaving paper were measured with a U-3010 spectrophotometric reflection spectrum measuring device manufactured by Shimadzu Corporation. Results are shown in Table 4. Evaluation of printed plate-making property in CTP plate-making system A plate setter having the following configuration and an automatic developing machine LP-1310HII manufactured by Fuji Photo Film Co., Ltd. which were connected to each other were used as a CTP plate-making system.

The plate setter had units on each of which a pile is disposed, an outer drum serving as an exposure unit and having a semiconductor laser which had an emission wavelength of 830 nm and which served as a light source for exposure, and a plate conveying mechanism. A color sensor manufactured by KEYENCE Corporation and having a sensing unit of CZ-41, and amplifying unit of CZ-V1 was disposed near the units on each of which a pile is disposed. The color sensor and other units of the system were electrically connected to a control unit. Thereby, the control unit could determine processings on the basis of identification information from the color sensor and instruct the system to conduct the processings determined.

A developing solution used in the system has a composition shown later, and a finisher was a solution obtained by diluting GN-2K manufactured by Fuji Photo Film Co., Ltd with water at a ratio of 1:1.

Piles A and B were placed on the units, on each of which a pile is disposed, of the CTP printed plate-making system, and plate making was conducted as follows. First, the color sensor determined the kind of a sheet disposed on the top of one of the piles. When the color sensor determined that the sheet was a planographic printing plate precursor, the control unit selected subsequent processing suitable for the printing plate precursor on the basis of the identification result from the color sensor. Thereby, the plate precursor was exposed to light through an original with an image having a ratio of image portions to non-image portions of 80% and a pattern of crossover lines, at a resolution 1200 dpi at a plate surface energy of 120 $mJ/cm^2$, and then developed at a traveling speed (line speed) of 2 m/minute at a developing temperature of 30° C. Meanwhile, when the color sensor determined that the sheet was the dummy plate precursor, the precursor was not exposed to light but was developed at a traveling speed (line speed) of 2 m/minute and a developing temperature of 30° C. When the color sensor determined that the sheet was the interleaving paper, the interleaving paper was removed. When the color sensor determined that the sheet was the stack board, a message showing that "there is no plate left" was displayed.

Five hundred sheets in each of the piles A and B were subjected to such plate-making treatment. During the treatment, a check was made to confirm whether a malfunction occurred in the CTP plate-making system. Moreover, another check was made to confirm whether the message was displayed, when all the precursors had been treated. Examples and Comparative Examples which allowed plate making without any malfunction are expressed by A, while those which caused malfunction are expressed by B (plate making compatibility). The evaluation results including the concrete descriptions of malfunctions are shown in Table 4.

Developing Solution

The following components were dissolved in water and KOH was added to the resultant solution to adjust the pH of the solution at 11.95 at 25° C. Thus, a developing solution was obtained.

Surfactant (K-1) 4.00 mass %

Antifoaming agent (OLFINE AK-02) 0.08 mass %

Tetrasodium ethylenediamine tetraacetate 0.16 mass %

Potassium carbonate 0.16 mass %

Evaluation of Printing Properties

The 100th planographic printing plate and the 100th dummy plate obtained in the plate making were set in a printing machine LITHRONE manufactured by Komori Corp., and an image was printed. Stains in non-image portions and the printing durability of the planographic printing plate and stains in the non-image portion of the dummy plate were evaluated. Stains in the image portions of the last planographic printing plate which provided a practically acceptable image and whose ordinal number corresponded to the number shown in the column "printing durability" of Table 4 (the number of planographic printing plates printed up to and including the last planographic printing plate being shown in the "printing durability" column of Table 4) were sensorily evaluated with naked eyes and classified into five levels from level 1 (worst) to level 5 (best). Level 3 is the lower limit of practically acceptable levels and levels 1 and 2 cannot be practically acceptable. Results are summarized in Table 4.

As is apparent from Table 4, the plate-making method (printed plate-making method of the invention) of Examples 11 to 16 enables four components, namely a planographic printing plate precursor, a dummy plate precursor for planographic printing, a stack board, and an interleaving paper, to be distinguished from each other, and the planographic printing plate precursor and the dummy plate precursor for planographic printing are processed without any problem in the CTP plate-making system. In addition, it is also possible to remove the interleaving paper. Furthermore, it is also possible to provide a message showing that "there is no plate left", since the stack board can be identified.

TABLE 4

| | Absorption maximum wavelength (nm) and absorbance | | | | | | Printed plate making compatibility | | | Printing stains | | |
|---|---|---|---|---|---|---|---|---|---|---|---|---|
| | Printing plate precursor | | Dummy plate precursor | | Base substrate surface | | Printing plate precursor | Dummy plate precursor | Note | Printing plate precursor | Dummy plate precursor | Printing durability (sheets) |
| Example 11 | 600 | 1.1 | 425 | 0.53 | 495 | 0.5 | A | A | — | 5 | 5 | 150,000 |
| Example 12 | 600 | 0.6 | 425 | 1.53 | 495 | 0.5 | A | A | — | 5 | 5 | 150,000 |
| Example 13 | 600 | 1.1 | 425 | 1.1 | 495 | 0.5 | A | A | — | 5 | 5 | 150,000 |
| Example 14 | 605 | 0.9 | 425 | 0.53 | 495 | 0.5 | A | A | — | 5 | 5 | 150,000 |
| Example 15 | 650 | 0.6 | 425 | 0.53 | 495 | 0.5 | A | A | — | 5 | 5 | 150,000 |
| Example 16 | 425 | 0.6 | 600 | 0.6 | 495 | 0.5 | A | A | — | 5 | 5 | 150,000 |

| | Absorption maximum wavelength (nm) and absorbance | | | | | | Plate making compatibility | | | Printing stains | | |
|---|---|---|---|---|---|---|---|---|---|---|---|---|
| | Printing plate precursor | | Dummy plate precursor | | Base substrate surface | | Printing plate precursor | Dummy plate precursor | Note | Printing plate precursor | Dummy plate precursor | Printing durability (sheets) |
| Comparative Example 4 | 600 | 1.1 | 425 | 0.53 | — | 495 nm 0.03 | B | B | Massage showing that "there is no plate left" was not displayed after completion of plate making. | — | — | — |
| Comparative Example 5 | 600 | 1.1 | 425 | 0.1 | 495 | 0.5 | A | B | Dummy plate precursor could not be differentiated from interleaving paper | — | — | — |
| Comparative Example 6 | 600 | 0.1 | 425 | 0.53 | 495 | 0.5 | B | B | Printing plate precursor could not be differentiated from interleaving paper | — | — | — |
| Comparative Example 7 | 600 | 1.1 | 495 | 0.6 | 495 | 0.5 | B | B | Dummy plate precursor could not be differentiated from printing plate precursor | — | — | — |

In contrast, as described in Note, in the methods of Comparative Examples 4 to 7, it is difficult to completely identify all the four components. Moreover, and malfunctions occurred in the plate making when processing at least one of the planographic printing plate precursor and the dummy plate precursor for planographic printing. This indicates that these methods are practically problematic in the CTP plate-making system.

What is claimed is:

1. A method for producing a planographic printing plate and a dummy plate for planographic printing in a CTP plate-making system, the method comprising:

taking one product out of a pile of multiple planographic printing plate precursors piled up on a base substrate and a pile of multiple dummy plate precursors for planographic printing piled up on another base substrate, distinguishing the kind of the one product with a color sensor, when the one product is a planographic printing plate precursor, exposing the one product to an infrared ray, and subsequently developing the exposed one product, and when the one product is a dummy plate precursor, developing the one product, wherein a colored surface of the base substrate on which the pile of multiple planographic printing plate precursors is piled up, a colored surface of the base substrate on which the pile of multiple dummy plate precursors for planographic printing is piled up, the planographic printing plate precursor, and the dummy plate precursor for planographic printing each have a different absorption maximum in a range of 350 to 700 nm and an absorbance at the absorption maximum of 0.2 or more so that the presence or absence of the photographic printing plate precursor or the dummy plate precursor can be recognized, and wherein an interleaving paper that is different from the base substrate is placed between plates of the pile(s) of the planographic printing plate precursors and/or the dummy plate precursors.

2. The method according to claim 1, wherein the absorption maximum of the planographic printing plate precursor is in a range of 500 to 600 nm, the absorption maximum of the dummy plate precursor for planographic printing is in a range of 350 to 450 nm, and the absorption maximum of the surface of the base substrate on which the pile of multiple planographic printing plate precursors is piled up and the absorption maximum of the surface of the base substrate on which the pile of multiple dummy plate precursors for planographic printing is piled up are in a range of 400 to 550 nm.

3. The method according to claim 1, wherein the base substrate on which the pile of multiple planographic printing plate precursors is piled up and the base substrate on which the pile of multiple dummy plate precursors for planographic printing is piled up comprise a colored cardboard.

4. The method according to claim 2, wherein the base substrate on which the pile of multiple planographic printing plate precursors is piled up and the base substrate on which the pile of multiple dummy plate precursors for planographic printing is piled up comprise a colored cardboard.

5. The method according to claim 1, wherein the dummy plate precursor has an absorption maximum in a range of 350 to 450 nm.

6. The method according to claim 5, wherein each dummy plate has a non-photosensitive layer that includes a dye having an absorption maximum at 350 to 450 nm.

7. The method according to claim 6, wherein the dye is selected from the following S-1 to S-6:

S-1

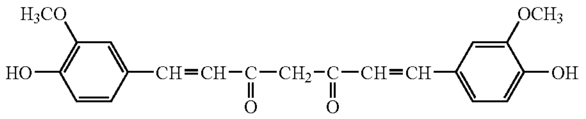

S-2

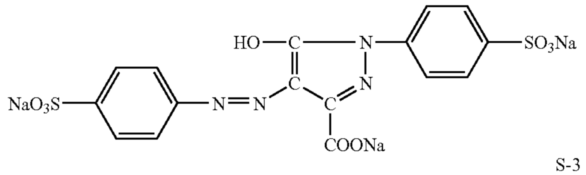

S-3

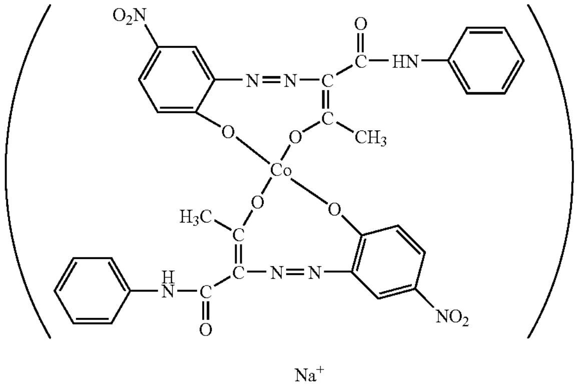

S-4

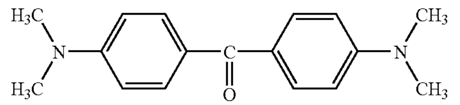

S-5

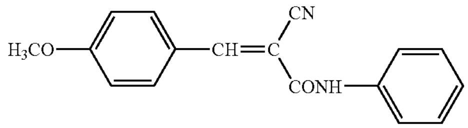

S-6

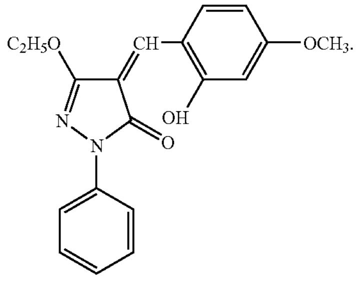

8. A method for producing a planographic printing plate and a dummy plate for planographic printing in a CTP plate-making system, the method comprising:

taking one product out of a pile of multiple planographic printing plate precursors piled up on a base substrate and a pile of multiple dummy plate precursors for planographic printing piled up on another base substrate, distinguishing the kind of the one product with a color sensor, when the one product is a planographic printing plate precursor, exposing the one product to an infrared ray, and subsequently developing the exposed one product, and when the one product is a dummy plate precursor, developing the one product, wherein the entire base substrate on which the pile of multiple planographic printing plate precursors is piled up the entire base substrate on which the pile of multiple dummy plate precursors for planographic printing is piled up, the planographic printing plate precursor, and the dummy plate precursor for planographic printing each have a different absorption maximum in a range of 350 to 700 nm and an absorbance at the absorption maximum of 0.2 or more so that the presence or absence of the photographic printing plate precursor or the dummy plate precursor can be recognized, and wherein an interleaving paper that is different from the base substrate is placed between plates of the pile(s) of the planographic printing plate precursors and/or the dummy plate precursors.

* * * * *